(12) United States Patent  
Sakakura et al.

(10) Patent No.: US 9,054,230 B2  
(45) Date of Patent: Jun. 9, 2015

(54) DISPLAY DEVICE AND MANUFACTURING METHOD OF THE SAME

(71) Applicant: Semiconductor Energy Laboratory Co., Ltd., Atsugi-shi, Kanagawa-ken (JP)

(72) Inventors: Masayuki Sakakura, Ebina (JP); Shunpei Yamazaki, Setagaya (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 13/721,783

(22) Filed: Dec. 20, 2012

(65) Prior Publication Data

US 2013/0126877 A1 May 23, 2013

Related U.S. Application Data

(60) Continuation of application No. 13/280,617, filed on Oct. 25, 2011, now Pat. No. 8,357,021, which is a division of application No. 11/227,147, filed on Sep. 16, 2005, now Pat. No. 8,148,895.

(30) Foreign Application Priority Data

Oct. 1, 2004 (JP) ................................. 2004-290313

(51) Int. Cl.
*H01L 51/54* (2006.01)
*H01L 33/00* (2010.01)
(Continued)

(52) U.S. Cl.
CPC .......... *H01L 33/0041* (2013.01); *G09G 3/3225* (2013.01); *G09G 3/3233* (2013.01);
(Continued)

(58) Field of Classification Search
USPC .................................................. 313/498–512
See application file for complete search history.

(56) References Cited

U.S. PATENT DOCUMENTS 5,882,761 A 3/1999 Kawami et al.
6,452,341 B1 9/2002 Yamauchi et al.
(Continued)

FOREIGN PATENT DOCUMENTS

EP 1063704 A 12/2000
EP 2385557 A 11/2011
(Continued)

*Primary Examiner* — Anh Mai
*Assistant Examiner* — Fatima Farokhrooz
(74) *Attorney, Agent, or Firm* — Eric J. Robinson; Robinson Intellectual Property Law Office, P.C.

(57) ABSTRACT

It is an object of the present invention to provide a method for manufacturing a display device in which unevenness generated under a light-emitting element does not impart an adverse effect on the light-emitting element. It is another object of the invention to provide a method for manufacturing a display device in which penetration of water into the inside of the display device through a film having high moisture permeability can be suppressed without increasing processing steps considerably. A display device of the present invention comprises a thin film transistor and a light-emitting element, the light-emitting element including a light-emitting laminated body interposed between a first electrode and a second electrode; wherein the first electrode is formed over an insulating film formed over the thin film transistor; and wherein a planarizing film is formed in response to the first electrode between the first electrode and the insulating film.

21 Claims, 26 Drawing Sheets

(51) Int. Cl.
  *H01L 27/32* (2006.01)
  *G09G 3/32* (2006.01)
  *H01L 51/52* (2006.01)
  *H01L 51/56* (2006.01)

(52) U.S. Cl.
  CPC ............... *G09G2300/0842* (2013.01); *G09G 2300/0861* (2013.01); *G09G 2310/0251* (2013.01); *G09G 2310/0262* (2013.01); *H01L 27/3244* (2013.01); *H01L 27/3246* (2013.01); *H01L 27/3248* (2013.01); *H01L 27/3258* (2013.01); *H01L 51/5246* (2013.01); *H01L 51/56* (2013.01)

(56) References Cited

U.S. PATENT DOCUMENTS

| | | | |
|---|---|---|---|
| 6,562,669 | B2 | 5/2003 | Suzawa et al. |
| 6,590,337 | B1 | 7/2003 | Nishikawa et al. |
| 6,674,106 | B2 | 1/2004 | Tanaka et al. |
| 6,686,605 | B2 | 2/2004 | Sakakura et al. |
| 6,689,492 | B1 | 2/2004 | Yamazaki et al. |
| 6,828,727 | B2 | 12/2004 | Yamazaki |
| 6,844,683 | B2 | 1/2005 | Yamauchi et al. |
| 6,861,710 | B2 | 3/2005 | Murakami et al. |
| 6,903,377 | B2 | 6/2005 | Yamazaki et al. |
| 6,924,508 | B2 * | 8/2005 | Yoneda et al. ............... 257/72 |
| 6,929,986 | B2 | 8/2005 | Sakakura et al. |
| 7,042,024 | B2 | 5/2006 | Yamazaki et al. |
| 7,045,822 | B2 | 5/2006 | Tsuchiya |
| 7,049,744 | B2 | 5/2006 | Nishikawa et al. |
| 7,147,530 | B2 | 12/2006 | Yamazaki et al. |
| 7,190,115 | B2 | 3/2007 | Tsuchiya et al. |
| 7,294,517 | B2 | 11/2007 | Takayama et al. |
| 7,312,572 | B2 | 12/2007 | Yamauchi et al. |
| 7,446,336 | B2 | 11/2008 | Yamazaki et al. |
| 7,466,293 | B2 | 12/2008 | Yamauchi et al. |
| 7,486,368 | B2 | 2/2009 | Sakakura et al. |
| 7,488,985 | B2 | 2/2009 | Tsuchiya |
| 7,579,203 | B2 | 8/2009 | Yamazaki et al. |
| 7,633,223 | B2 | 12/2009 | Yamazaki |
| 7,816,863 | B2 | 10/2010 | Yamazaki et al. |
| 7,821,200 | B2 | 10/2010 | Yamauchi et al. |
| 7,928,654 | B2 | 4/2011 | Tsuchiya et al. |
| 7,932,667 | B2 | 4/2011 | Tsuchiya |
| 8,405,594 | B2 | 3/2013 | Yamauchi et al. |
| 8,450,924 | B2 | 5/2013 | Tsuchiya |
| 8,558,773 | B2 | 10/2013 | Yamauchi et al. |
| 8,740,664 | B2 | 6/2014 | Tsuchiya |
| 8,830,146 | B2 | 9/2014 | Yamauchi et al. |
| 8,941,565 | B2 | 1/2015 | Yamauchi et al. |
| 2001/0041268 | A1 | 11/2001 | Arai et al. |
| 2003/0094895 | A1 * | 5/2003 | Okuyama et al. ............ 313/506 |
| 2003/0127651 | A1 | 7/2003 | Murakami et al. |
| 2003/0214231 | A1 * | 11/2003 | Hishida ......................... 313/506 |
| 2003/0222575 | A1 * | 12/2003 | Yamazaki et al. ............ 313/504 |
| 2004/0141140 | A1 * | 7/2004 | Zhang et al. .................. 349/152 |
| 2004/0178724 | A1 | 9/2004 | Karasawa et al. |
| 2004/0185301 | A1 | 9/2004 | Tsuchiya et al. |
| 2004/0201021 | A1 | 10/2004 | Hirata |
| 2004/0246432 | A1 | 12/2004 | Tsuchiya et al. |
| 2004/0256985 | A1 | 12/2004 | Kim |
| 2005/0064239 | A1 | 3/2005 | Takei |
| 2005/0067954 | A1 * | 3/2005 | Nishikawa et al. ........... 313/506 |
| 2005/0073230 | A1 * | 4/2005 | Nishikawa et al. ........... 313/111 |
| 2008/0116795 | A1 | 5/2008 | Tsuchiya et al. |

FOREIGN PATENT DOCUMENTS

| | | |
|---|---|---|
| JP | 07-169567 | 7/1995 |
| JP | 09-148066 | 6/1997 |
| JP | 2001-067018 A | 3/2001 |
| JP | 2001-242803 A | 9/2001 |
| JP | 2003-157027 | 5/2003 |
| JP | 2003-347044 A | 12/2003 |
| JP | 2004-119219 A | 4/2004 |
| JP | 2004-192890 A | 7/2004 |
| JP | 2004-207084 A | 7/2004 |
| WO | WO 2004/021447 | 3/2004 |
| WO | WO 2004/057920 | 7/2004 |

* cited by examiner

FIG. 2
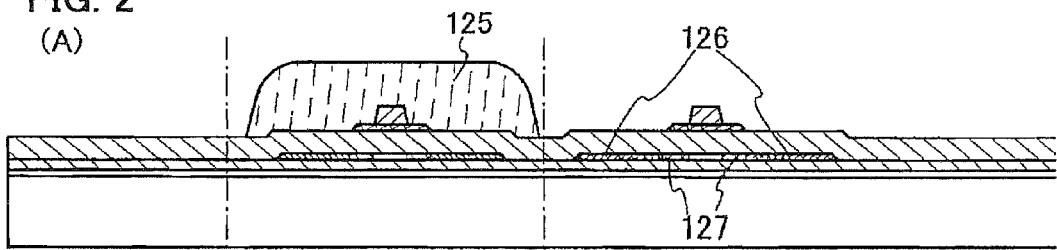
(A)
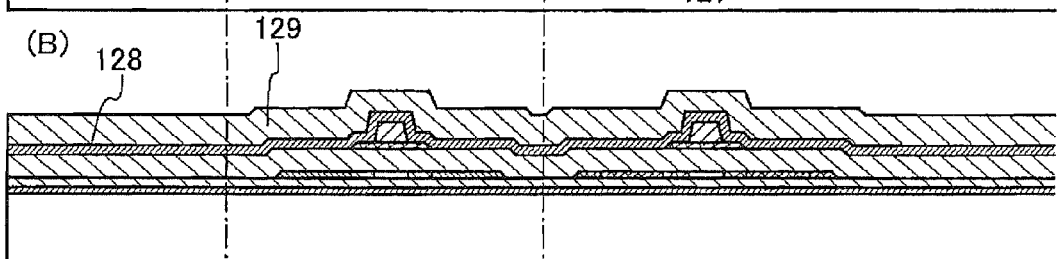
(B)
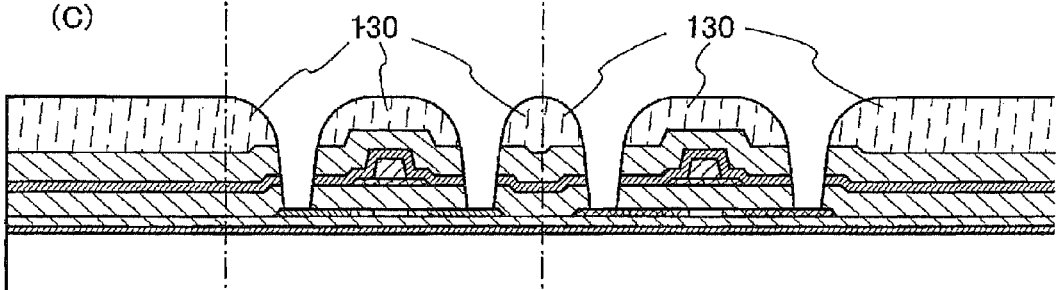
(C)
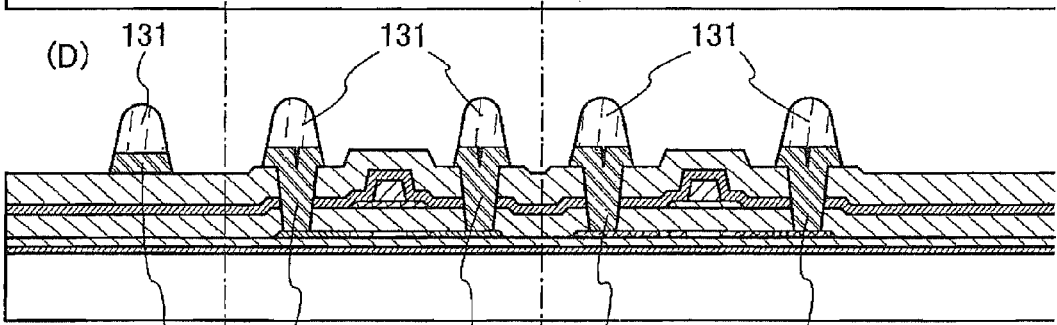
(D)
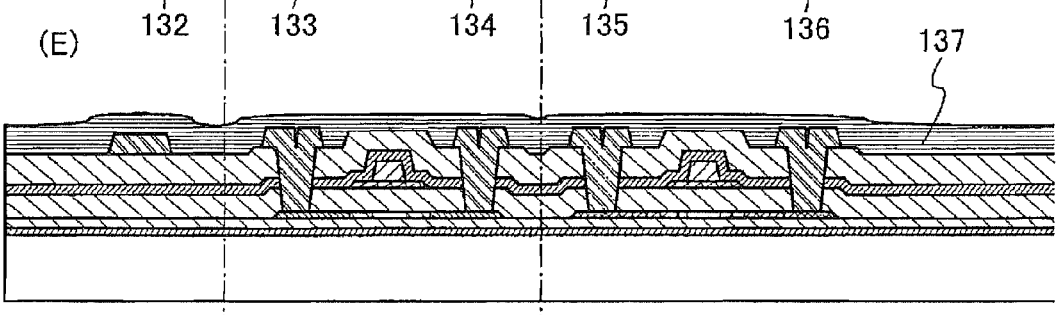
(E)
peripheral portion | driver circuit portion | pixel portion peripheral portion | driver cirucit portion | pixel portion peripheral portion | driver circuit portion | pixel portion FIG. 7
(A)
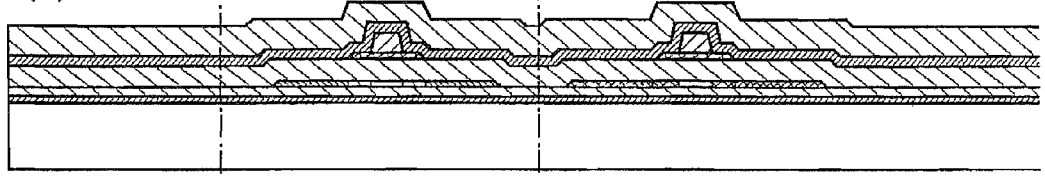
(B)
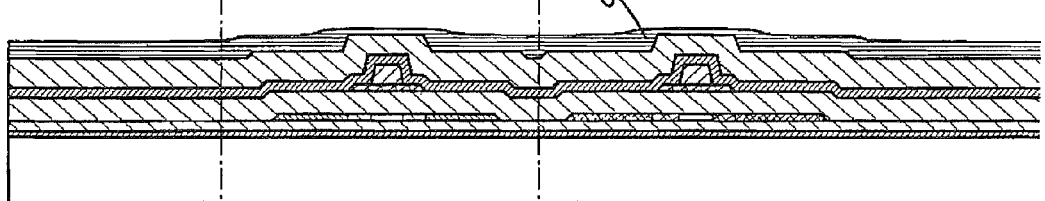
(C)
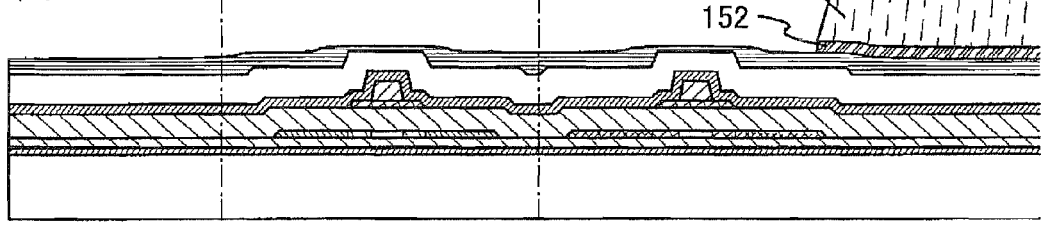
(D)
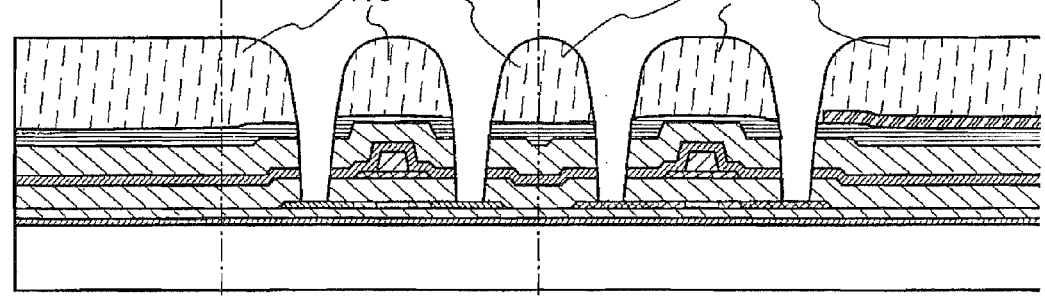
(E)
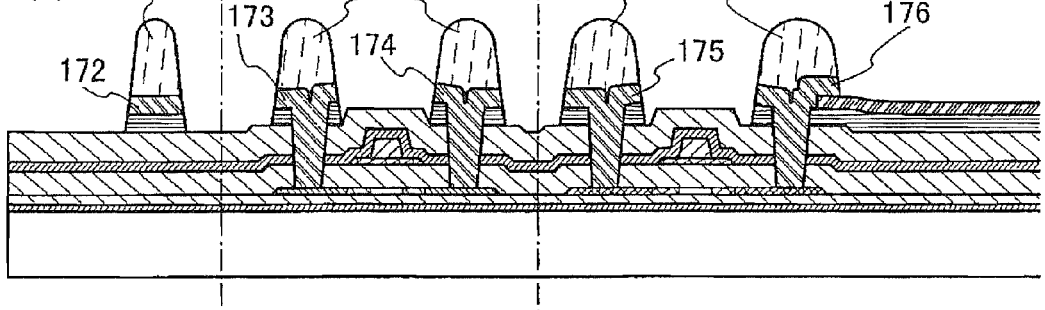
peripheral portion | driver circuit portion | pixel portion FIG. 8
(A)
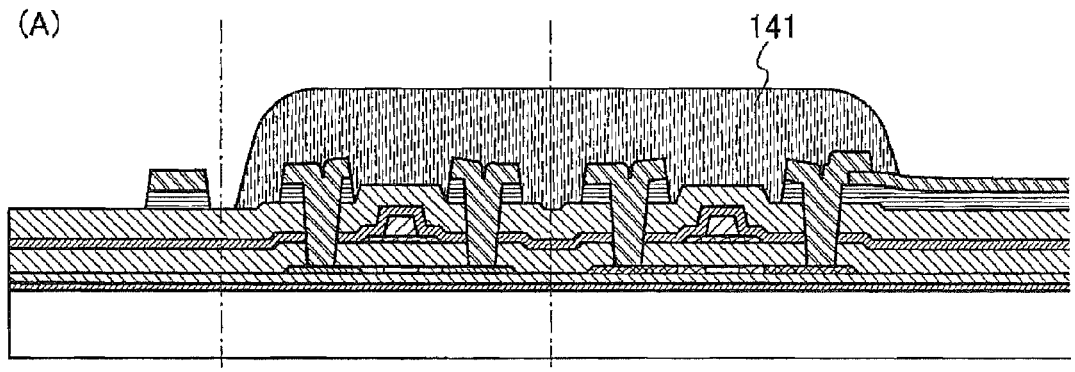
(B)
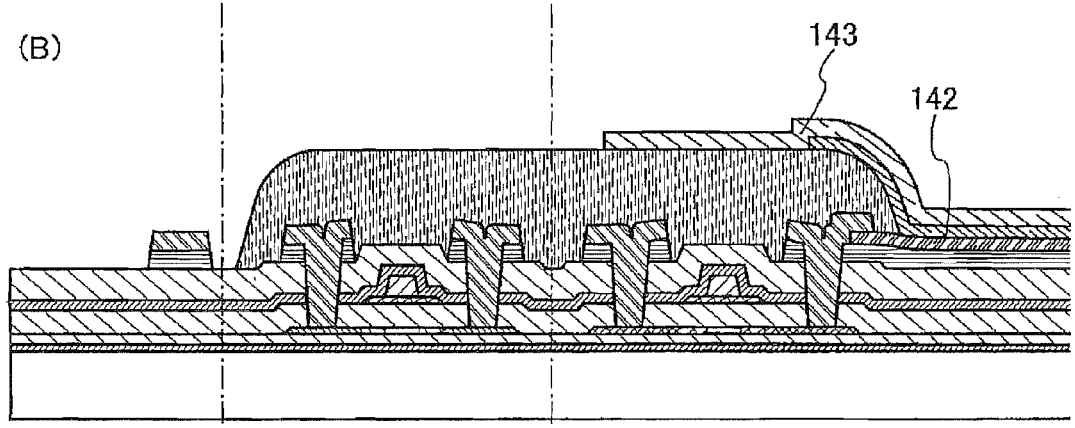
(C)
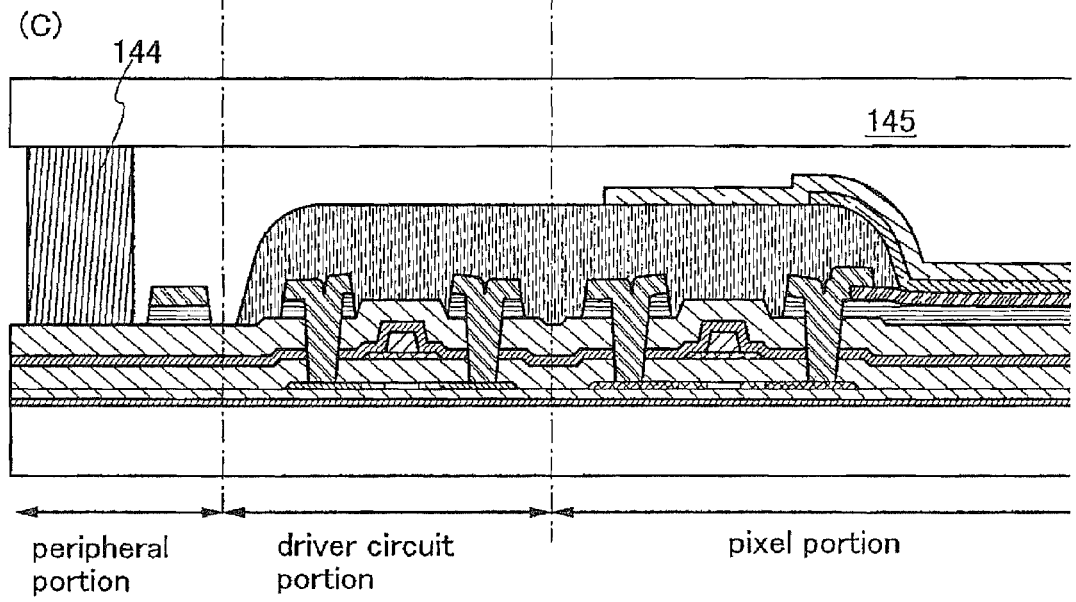
peripheral portion | driver circuit portion | pixel portion FIG. 9
(A)
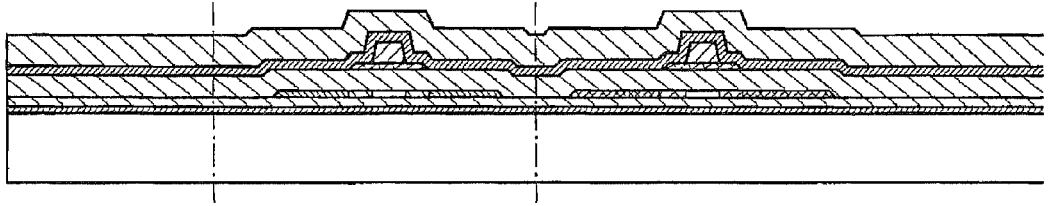
(B)
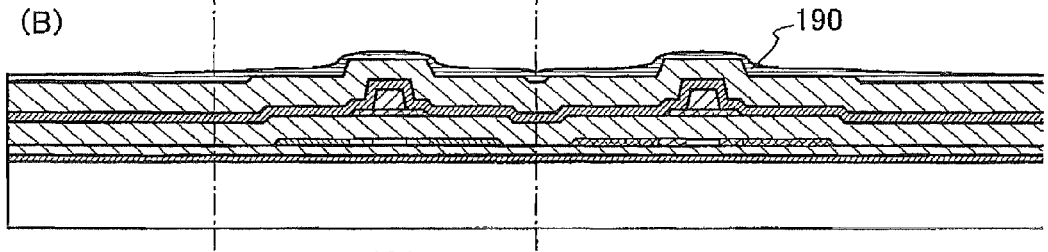
(C)
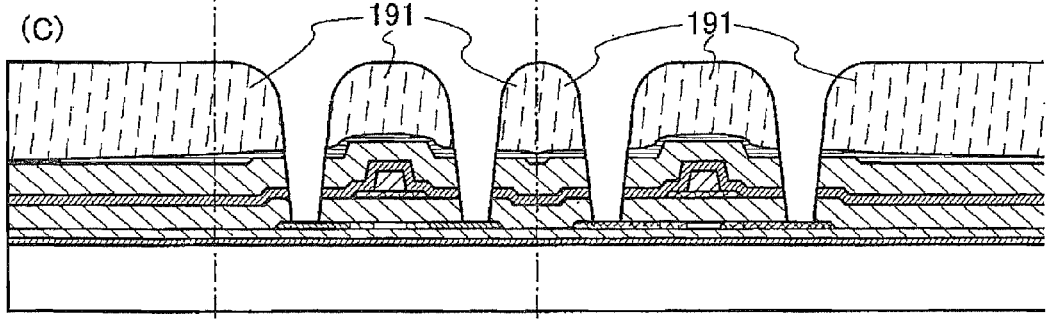
(D)
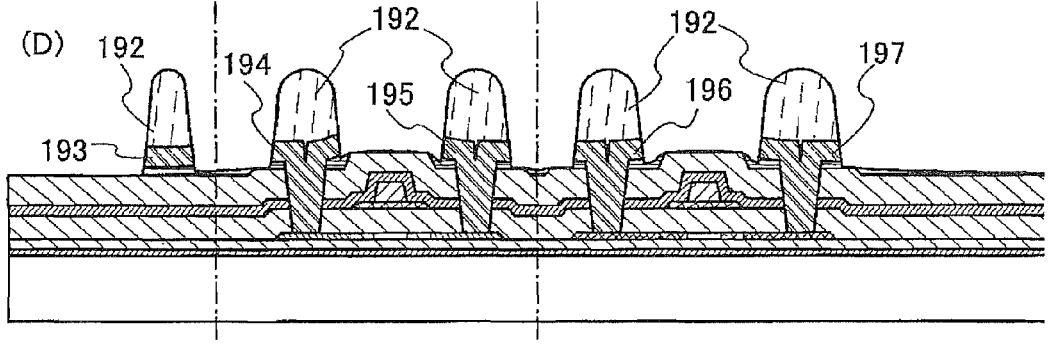
(E)
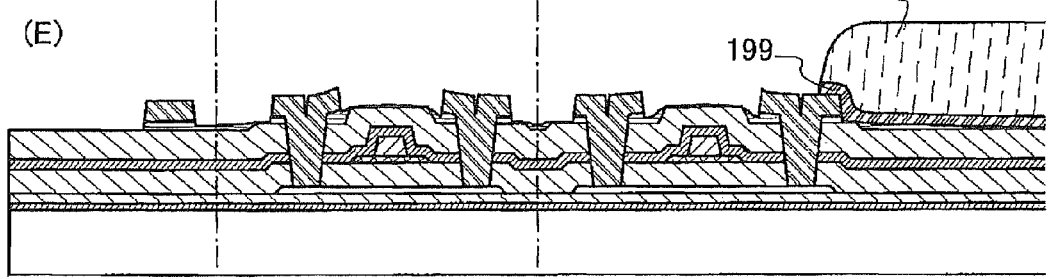
peripheral portion | driver circuit portion | pixel portion FIG. 11
(A)
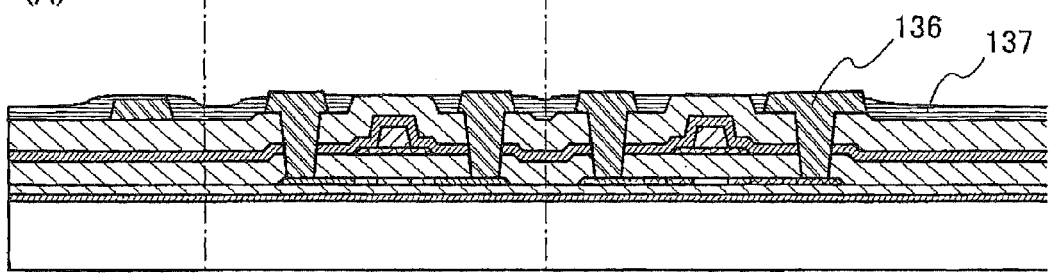
(B)
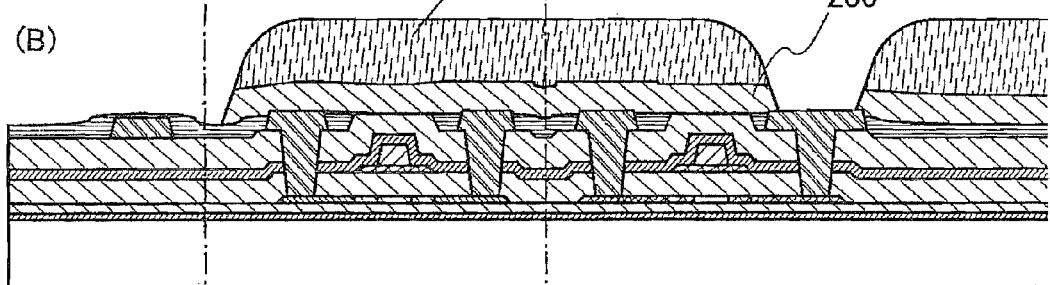
(C)
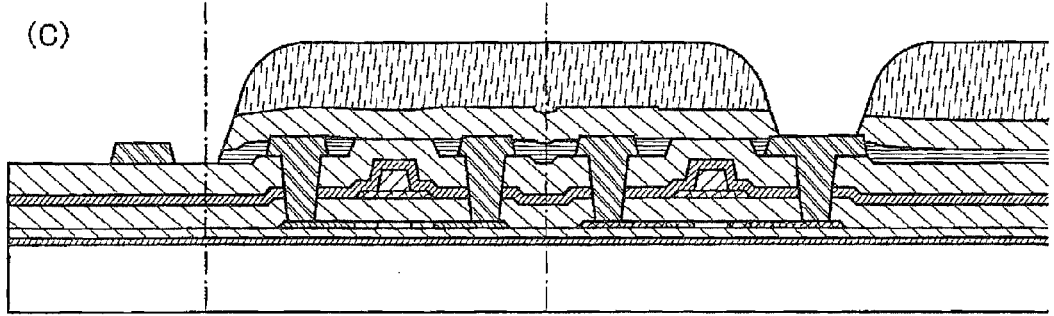
(D)
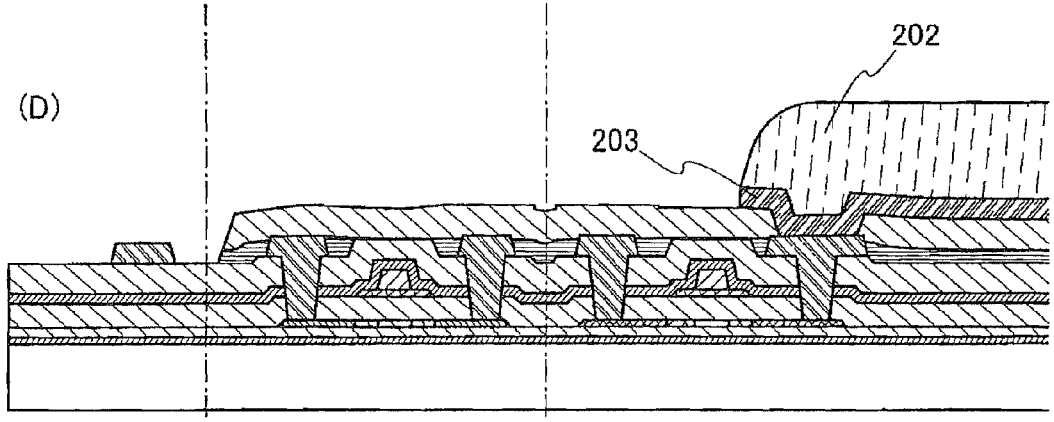
peripheral portion | driver circuit portion | pixel portion FIG. 12
(A)
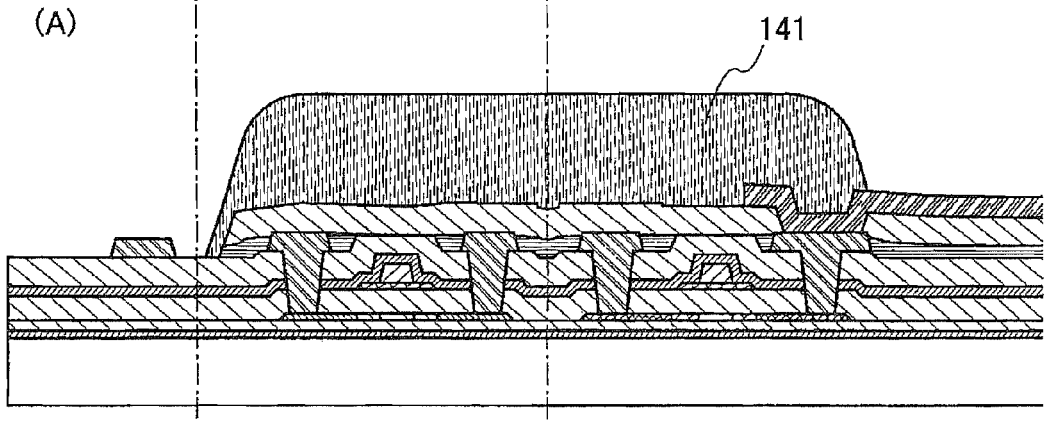
141
(B)
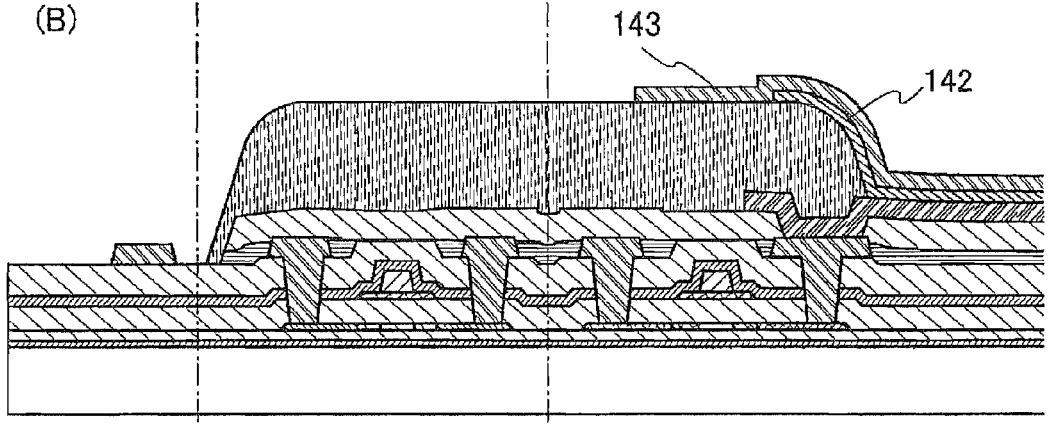
143
142
(C)
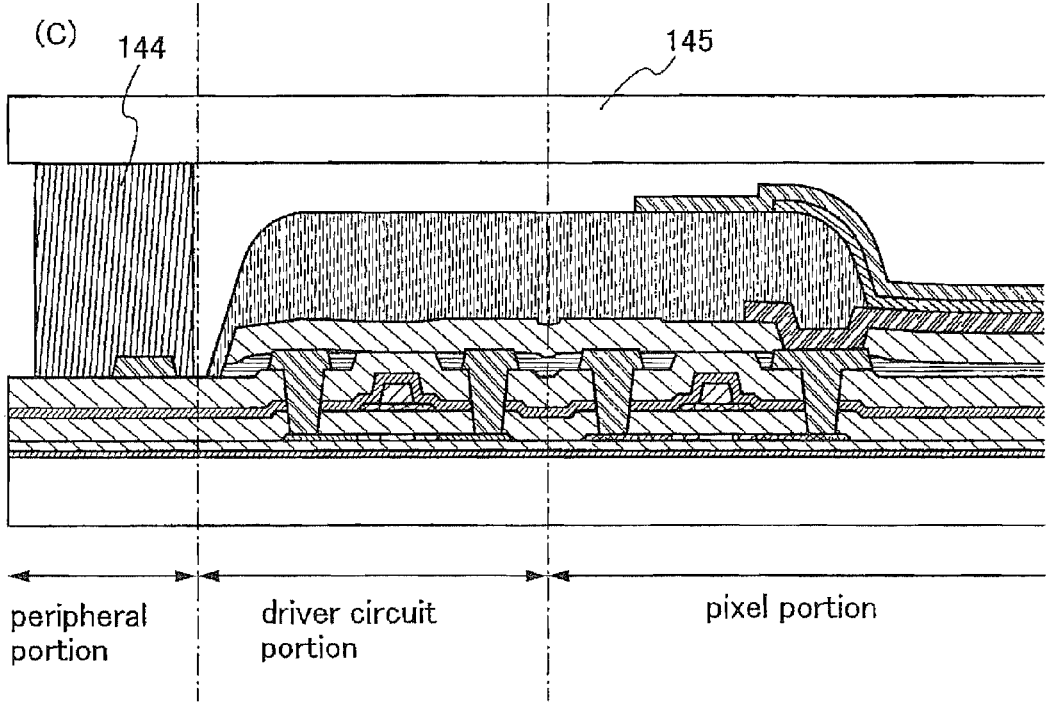
144
145
| peripheral portion | driver circuit portion | pixel portion |

FIG. 16
(A)
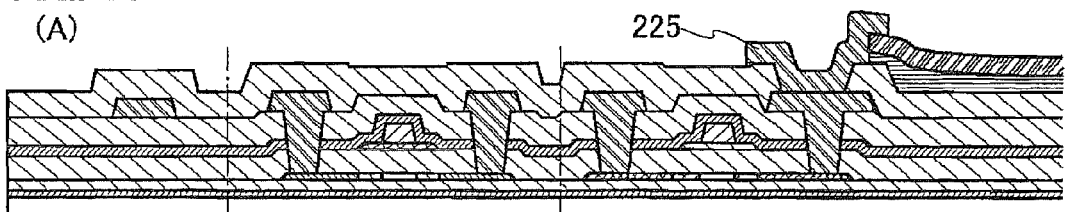
(B)
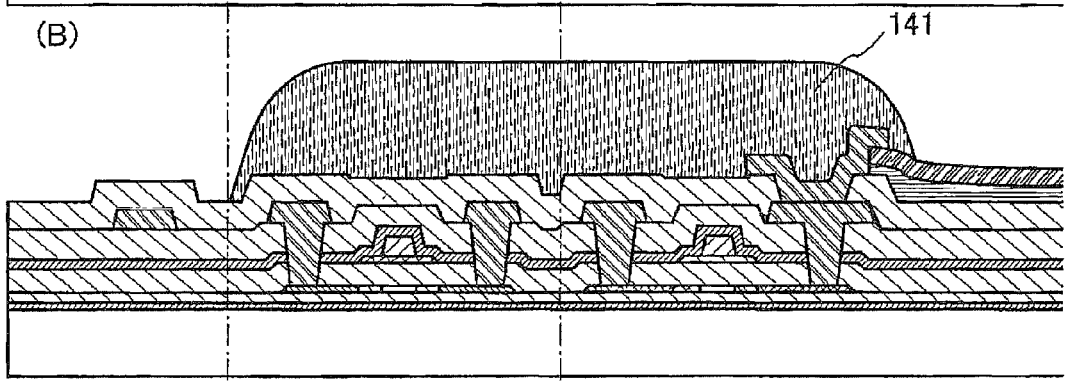
(C)
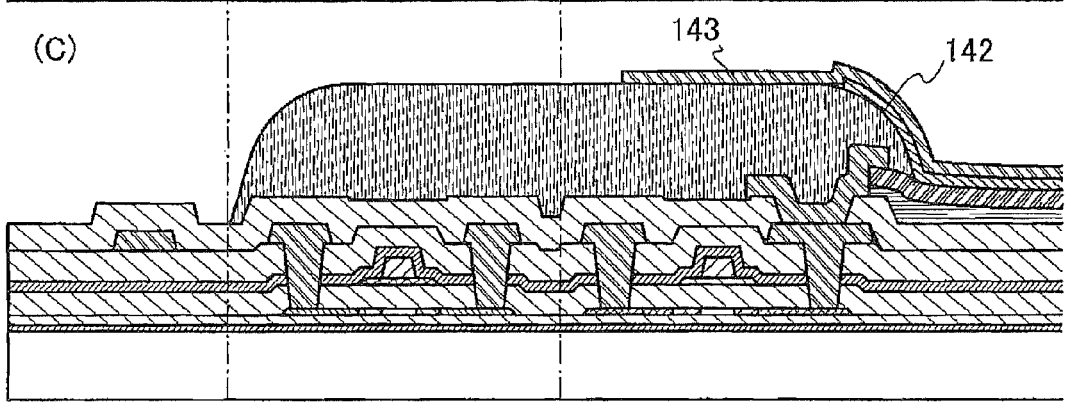
(D)
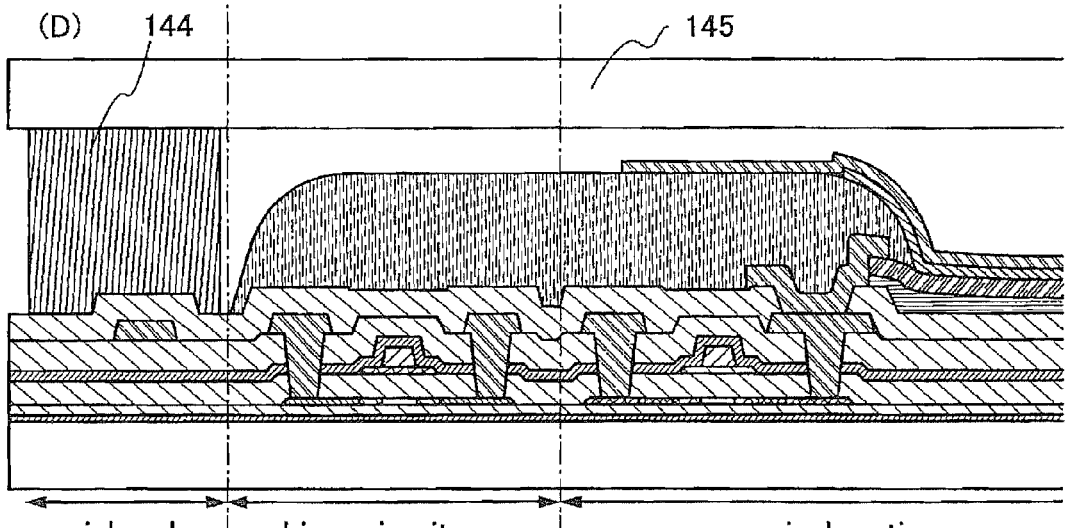
peripheral portion | driver circuit portion | pixel portion FIG. 17
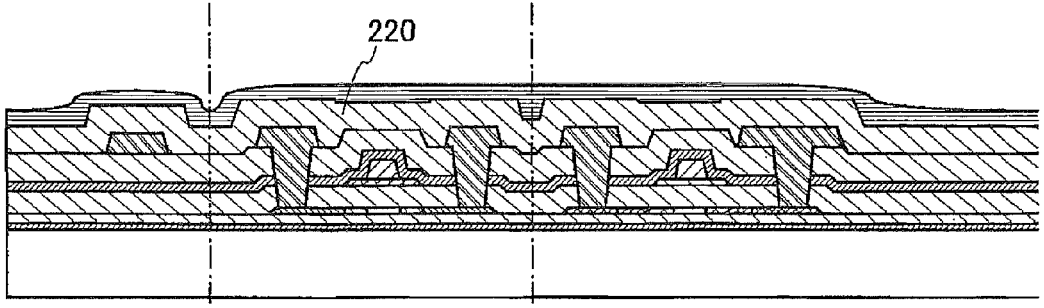
(A)
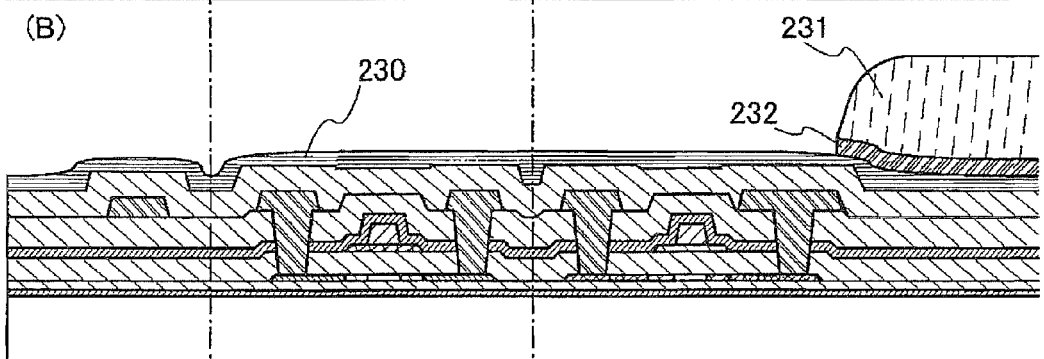
(B)
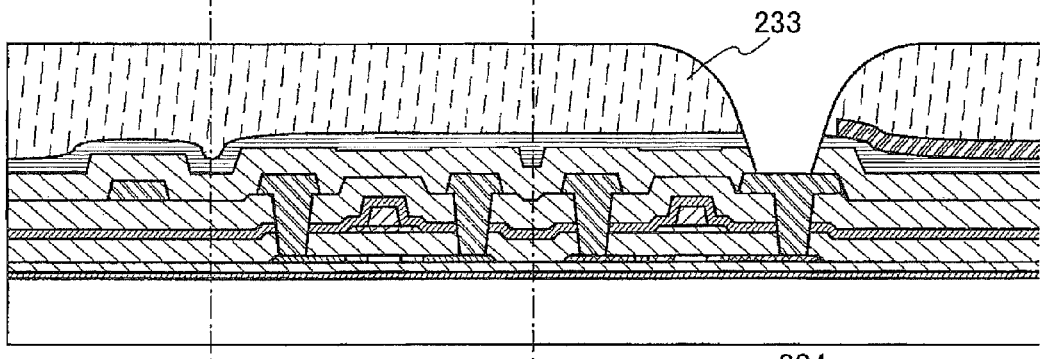
(C)
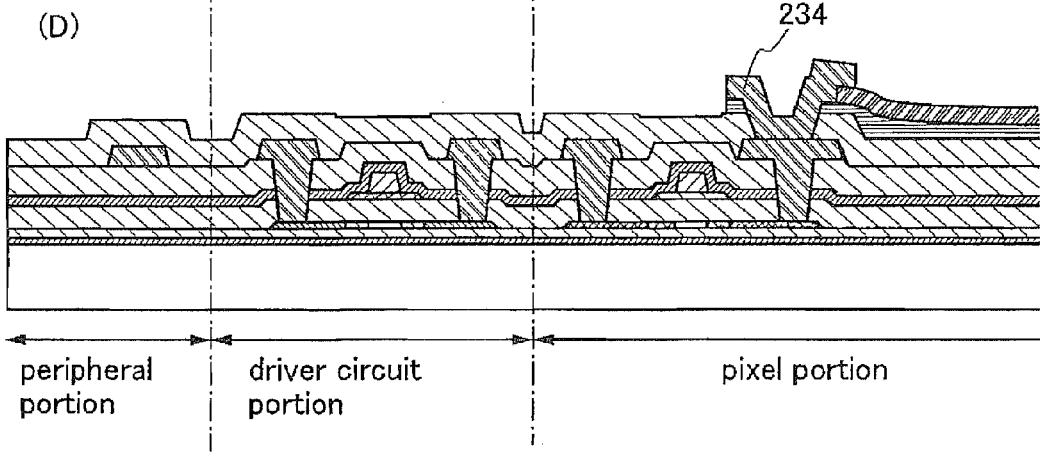
(D)
peripheral portion | driver circuit portion | pixel portion FIG. 18
(A)
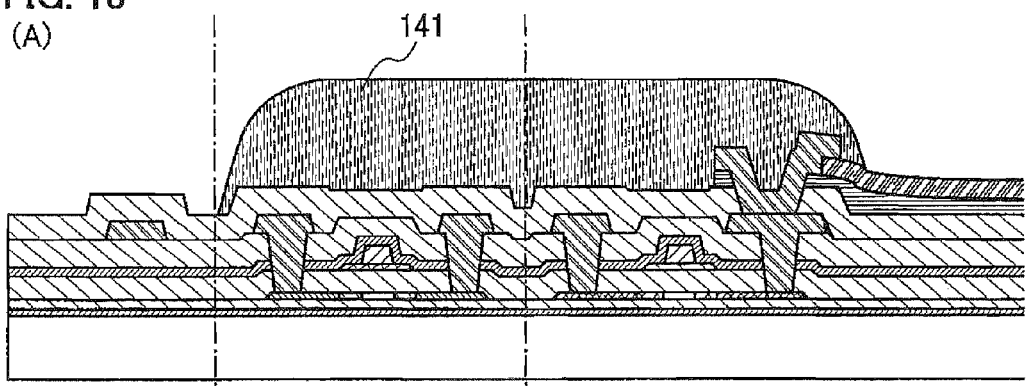
(B)
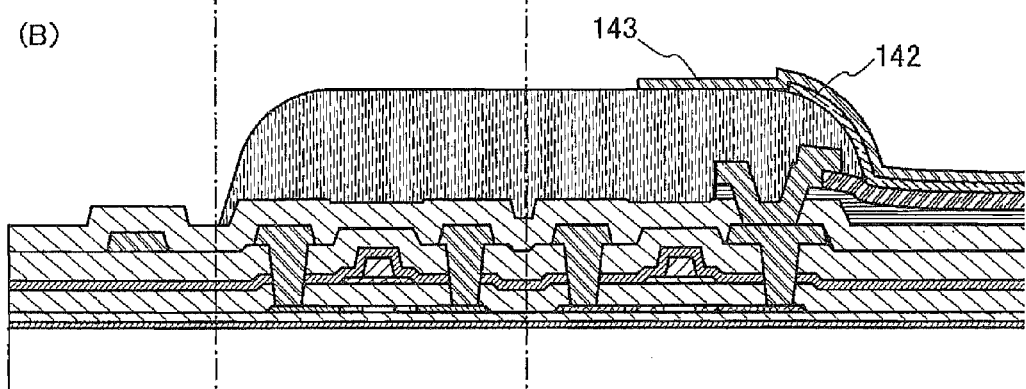
(C)
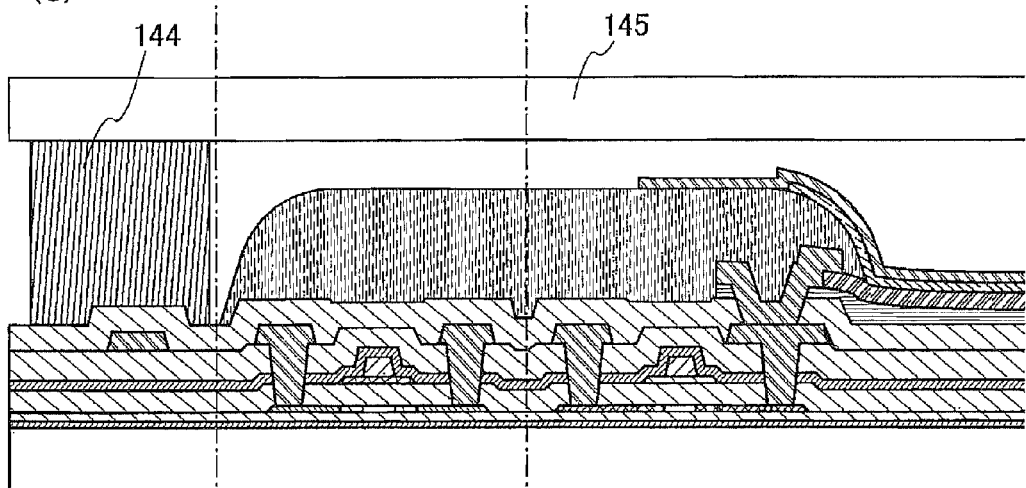
peripheral portion | driver circuit portion | pixel portion peripheral portion | driver circuit portion | pixel portion FIG. 22
(A) 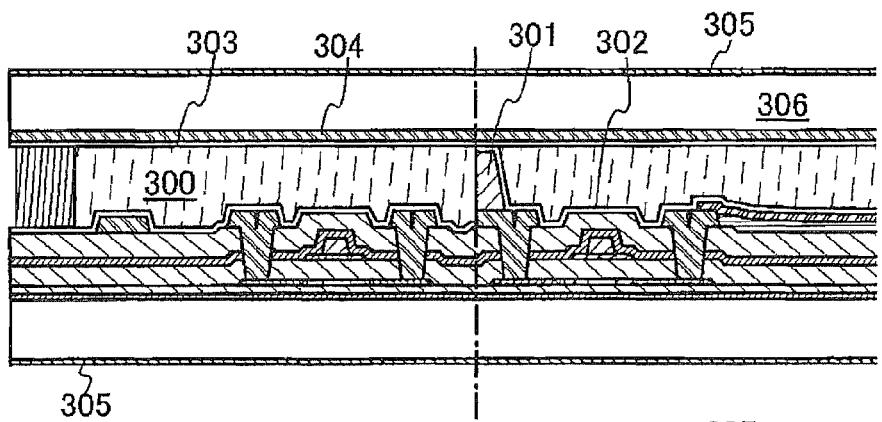
(B) 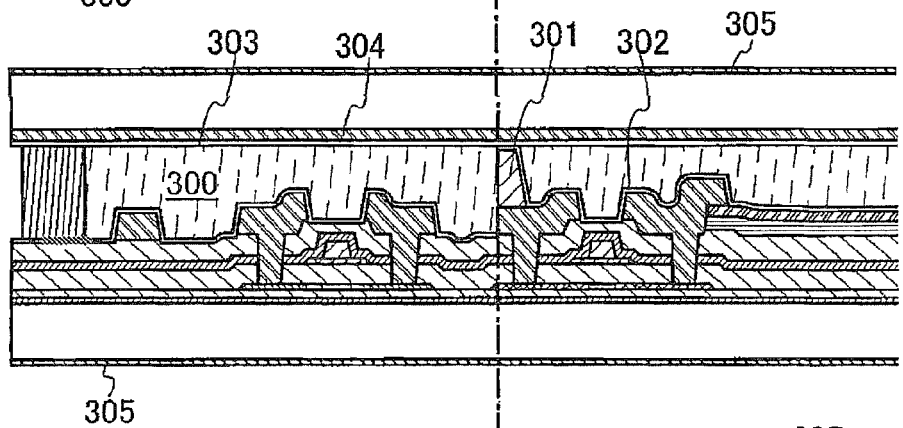
(C) 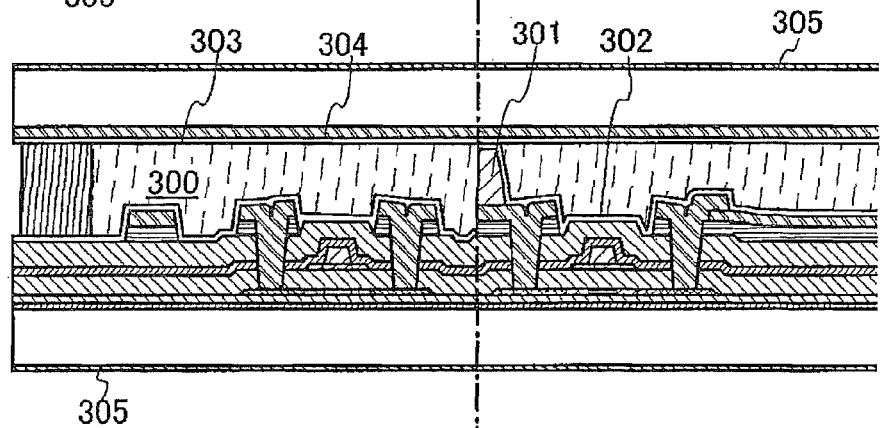
(D) 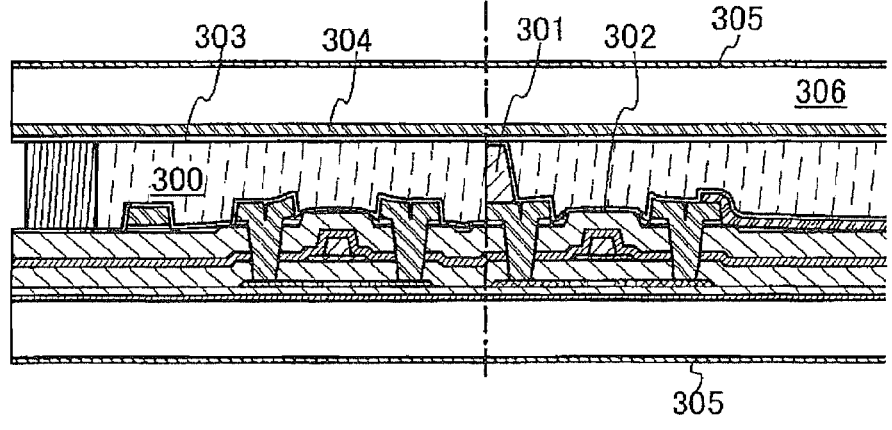

FIG. 24
(A)
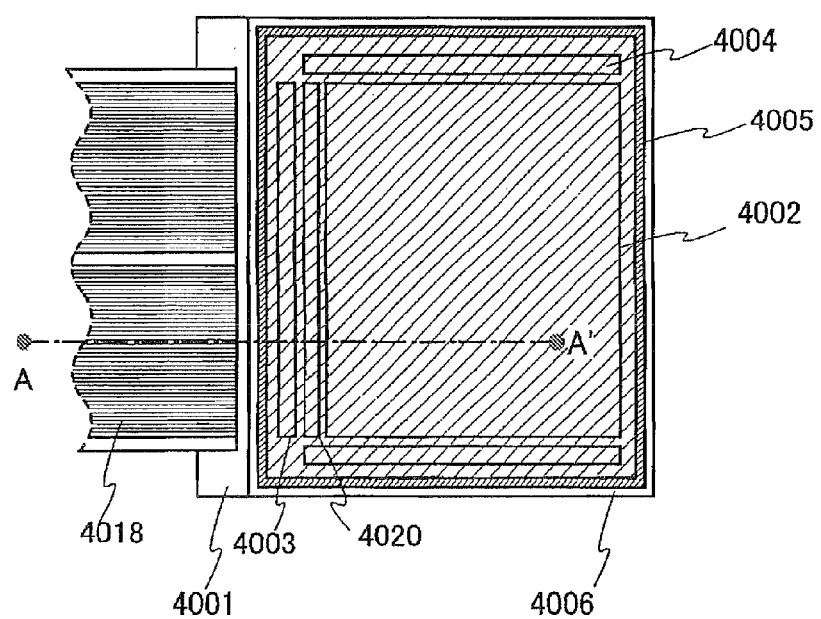
(B)
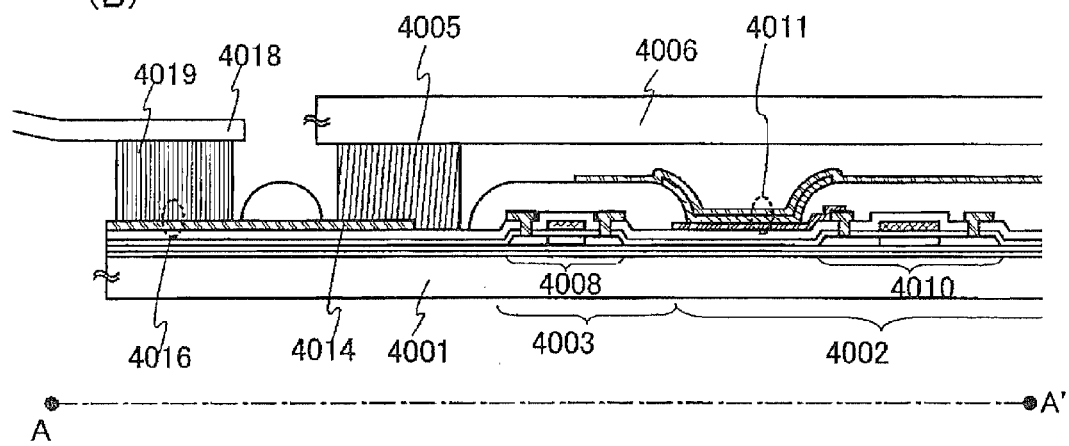

DISPLAY DEVICE AND MANUFACTURING METHOD OF THE SAME

BACKGROUND OF THE INVENTION

The present invention relates to a method for manufacturing a display device using an element emitting light (light-emitting element) by applying current between electrodes interposing a light-emitting material therebetween.

DESCRIPTION OF RELATED ART

In recent years, a thin lightweight display using a light-emitting element has been actively developed. The light-emitting element is manufactured by interposing a material which emits light by applying current between a pair of electrodes. Since the light-emitting element itself emits light unlike in the case of liquid crystal, a light source such as a backlight is not required, and the element is very thin. Therefore, it is extremely advantageous to manufacture a thin lightweight display.

However, one background of not reaching practical use yet while having such big advantages is a problem of reliability. The light-emitting element using an organic-based material often deteriorates due to moisture (water) and has a disadvantage of being hard to obtain long-term reliability. The light-emitting element which is deteriorated due to water causes a decrease in luminance or does not emit light. It is conceivable that this causes a dark spot (black spot) and shrinkage (decrease in luminance from an edge portion of a display device) in a display device using the light-emitting element. Various countermeasures are suggested to suppress such deterioration (refer to Patent Document 1 and Patent Document 2, for example).

However, these countermeasures are not enough to obtain sufficient reliability of the light-emitting element; thus, it is desired to further improve the reliability.

In addition, since a thin film light-emitting element is formed by laminating extremely thin films, the film and wiring covering an uneven portion is cut due to unevenness under the light-emitting element, which causes a defect.

Patent Document 1: Japanese Patent Laid-Open No. H9-148066
Patent Document 2: Japanese Patent Laid-Open No. H7-169567

SUMMARY OF THE INVENTION

Problem to be Solved by the Invention

In order to suppress the above defects, it is sufficient that unevenness under the light-emitting element is relieved; therefore, a planarizing film is formed over the surface on which unevenness exists.

However, an insulating film used for such a planarizing film often has high moisture permeability; therefore, there is a risk that water penetrates through the insulating film into the inside of a display device by exposing the insulating film to external atmosphere. In addition, if the insulating film is removed by etching or the like so as not to be exposed to external atmosphere, a new mask is needed, which causes an increase in processing steps, and the problem can not be disregarded.

Considering the above facts, it is an object of the present invention to provide a method for manufacturing a display device in which unevenness generated under a light-emitting element does not impart an adverse effect on the light-emitting element. It is another object of the invention to provide a method for manufacturing a display device in which penetration of water into the inside of the display device through a film having high moisture permeability can be suppressed without increasing processing steps considerably. It is another object of the invention to provide a method for manufacturing a display device satisfying the above two simultaneously.

Means for Solving the Problem

A display device of the present invention to solve the above problems includes a thin film transistor and a light-emitting element over an insulating surface formed on a substrate, wherein the light-emitting element includes a light-emitting laminated body interposed between a first electrode and a second electrode; wherein the first electrode is formed over an insulating film formed over the thin film transistor; and wherein a planarizing film is disposed so as to correspond to at least a position of the first electrode between the first electrode and the insulating film.

A display device of the present invention to solve the above problems includes a thin film transistor and a light-emitting element over an insulating surface on a substrate, wherein the light-emitting element includes a light-emitting laminated body interposed between a first electrode and a second electrode; wherein the first electrode is formed over a first insulating film formed over the thin film transistor; wherein a planarizing film is disposed in response to at least a position of the first electrode at least between the first electrode and the insulating film; and wherein the planarizing film is not formed outside a sealant forming region of the substrate.

A method for manufacturing a display device of the present invention to solve the above problems, includes the steps of: forming a semiconductor film, a gate insulating film, and a gate electrode over an insulating surface; forming a first insulating film over the gate electrode; forming a contact hole reaching to the semiconductor film by etching the gate insulating film and the first insulating film; forming a conductive film electrically connected to the semiconductor film over the first insulating film; forming a second insulating film covering the first insulating film and the conductive film with the use of a material having a self-planarizing property; exposing at least part of the conductive film by etching the second insulating film; forming a pixel electrode electrically connected to the conductive film; removing a region of the second insulating film not covered with the pixel electrode with the use of the pixel electrode as a mask by etching; and forming a light-emitting element having the pixel electrode as one electrode.

A method for manufacturing a display device of the present invention to solve the above problems, includes the steps of: forming a semiconductor film over an insulating surface; forming a gate insulating film covering the semiconductor film; forming a gate electrode over the gate insulating film and the semiconductor film; forming a first insulating film covering the gate insulating film and the gate electrode; forming a second insulating film covering the first insulating film with the use of a material having a self-planarizing property; forming a pixel electrode over the second insulating film; removing a region of the second insulating film not covered with the pixel electrode with the use of the pixel electrode as a mask by etching; forming a contact hole reaching to the semiconductor film in the first insulating film and the gate insulating film; forming a wiring electrically connected to the semiconductor film through the contact hole over the first insulating film; and forming a light-emitting element in which part of the wiring is also electrically connected to the pixel electrode and having the pixel electrode as one electrode.

A method for manufacturing a display device of the present invention to solve the above problems, includes the steps of: forming a semiconductor film over an insulating surface; forming a gate insulating film covering the semiconductor film; forming a gate electrode over the gate insulating film and the semiconductor film; forming a first insulating film covering the gate insulating film and the gate electrode; forming a second insulating film covering the first insulating film with the use of a material having a self-planarizing property; forming a pixel electrode over the second insulating film; forming a contact hole reaching to the semiconductor film in the second insulating film, the first insulating film, and the gate insulating film; forming a conductive film electrically connected to the semiconductor film through the contact hole over the second insulating film; removing a region of the second insulating film not covered with the conductive film and the pixel electrode with the use of the conductive film and the pixel electrode as masks by etching; and forming a light-emitting element in which part of the conductive film is also electrically connected to the pixel electrode and having the pixel electrode as one electrode.

A method for manufacturing a display device of the present invention to solve the above problems, includes the steps of: forming a semiconductor film over an insulating surface; forming a gate insulating film covering the semiconductor film; forming a gate electrode over the gate insulating film and the semiconductor film; forming a first insulating film covering the gate insulating film and the gate electrode; forming a second insulating film covering the first insulating film with the use of a material having a self-planarizing property; forming a contact hole reaching to the semiconductor film in the second insulating film, the first insulating film, and the gate insulating film; forming a conductive film electrically connected to the semiconductor film through the contact hole over the second insulating film; forming a pixel electrode overlapped with at least part of the conductive film over the second insulating film; and forming a light-emitting element having the pixel electrode as one electrode.

A method for manufacturing a display device of the present invention to solve the above problems, includes the steps of: forming a semiconductor film, a gate insulating film and a gate electrode over an insulating surface formed on a substrate; forming a first insulating film covering the gate electrode; forming a contact hole reaching to the semiconductor film by etching the gate insulating film and the first insulating film; forming a conductive film electrically connected to the semiconductor film through the contact hole over the first insulating film; forming a second insulating film over the first insulating film and the conductive film with the use of a material having a self-planarizing property; exposing at least part of the conductive film by etching the second insulating film; forming a third insulating film covering the second insulating film and the exposed portion of the conductive film; forming a mask over the third insulating film; forming a contact hole reaching to the conductive film by etching, and removing the second insulating film in an edge portion of the substrate with the use of the mask by etching; forming a pixel electrode electrically connected to the conductive film through the contact hole; and forming a light-emitting element having the pixel electrode as one electrode.

A method for manufacturing a display device of the present invention to solve the above problems, includes the steps of: forming a semiconductor film, a gate insulating film, and a gate electrode over an insulating surface; forming a first insulating film over the gate electrode; forming a contact hole reaching to the semiconductor film by etching the gate insulating film and the first insulating film; forming a first conductive film electrically connected to the semiconductor film through the contact hole over the first insulating film; forming a second insulating film over the first insulating film and the first conductive film; forming a contact hole reaching to the first conductive film by etching the second insulating film; forming a second conductive film electrically connected to at least part of the first conductive film; forming a third insulating film covering the second insulating film and the second conductive film with the use of a material having a self-planarizing property; exposing at least part of the second conductive film by etching the third insulating film; forming a pixel electrode electrically connected to the second conductive film over the third insulating film with the use of a mask; removing a region of the third insulating film not covered with the mask and the pixel electrode with the use of the mask and the pixel electrode as masks by etching; and forming a light-emitting element having the pixel electrode as one electrode.

A method for manufacturing a display device of the present invention to solve the above problems, includes the steps of: forming a semiconductor film over an insulating surface; forming a gate insulating film covering the semiconductor film; forming a gate electrode over the gate insulating film and the semiconductor film; forming a first insulating film covering the gate insulating film and the gate electrode; forming a contact hole reaching to the semiconductor film in the first insulating film and the gate insulating film; forming a first conductive film electrically connected to the semiconductor film through the contact hole over the first insulating film; forming a second insulating film covering the first insulating film and the first conductive film; forming a third insulating film covering the second insulating film with the use of a material having a self-planarizing property; forming a pixel electrode over the third insulating film with the use of a mask; removing a region of the third insulating film not covered with the mask and the pixel electrode with the use of the mask and the pixel electrode as masks by etching; forming a contact hole reaching to the first conductive film in the second insulating film; forming a second conductive film electrically connected to the first conductive film through the contact hole over the second insulating film; and forming a light-emitting element in which part of the second conductive film is also electrically connected to the pixel electrode and having the pixel electrode as one electrode.

A method for manufacturing a display device of the present invention to solve the above problems, includes the steps of: forming a semiconductor film over an insulating surface; forming a gate insulating film covering the semiconductor film; forming a gate electrode over the gate insulating film and the semiconductor film; forming a first insulating film covering the gate insulating film and the gate electrode; forming a contact hole reaching to the semiconductor film in the first insulating film and the gate insulating film; forming a first conductive film electrically connected to the semiconductor film through the contact hole over the first insulating film; forming a second insulating film covering the first insulating film and the first conductive film; forming a third insulating film covering the second insulating film with the use of a material having a self-planarizing property; forming a pixel electrode over the third insulating film with the use of a mask; forming a contact hole reaching to the first conductive film in the third insulating film and the second insulating film; forming a second conductive film electrically connected to the first conductive film through the contact hole over the third insulating film with the use of a mask; removing a region of the third insulating film not covered with the pixel electrode and the second conductive film with the use of the pixel electrode and the second conductive film as masks; and forming a light-emitting element having the pixel electrode as one electrode.

A method for manufacturing a display device of the present invention to solve the above problems, includes the steps of: forming a semiconductor film over an insulating surface; forming a gate insulating film covering the semiconductor film; forming a gate electrode over the gate insulating film and the semiconductor film; forming a first insulating film covering the gate insulating film and the gate electrode; forming a contact hole reaching to the semiconductor film in the first insulating film and the gate insulating film; forming a first conductive film electrically connected to the semiconductor film through the contact hole over the first insulating film; forming a second insulating film covering the first insulating film and the first conductive film; forming a extremely thin third insulating film covering the second insulating film with the use of a material having a self-planarizing property; forming a contact hole reaching to the first conductive film in the third insulating film and the second insulating film; forming a second conductive film electrically connected to the first conductive film through the contact hole over the third insulating film with the use of a mask; forming a pixel electrode in contact with the second conductive film; and forming a light-emitting element having the pixel electrode as one electrode.

Effect of the Invention

In accordance with a method for manufacturing a display device of the present invention, a light-emitting device in which unevenness generated under a light-emitting element does not impart an adverse effect on the light-emitting element can be manufactured. Further, a light-emitting device in which penetration of water into the inside of the light-emitting device through a film having high moisture permeability can be suppressed without increasing processing steps considerably can be manufactured. Furthermore, a light-emitting device satisfying the above two simultaneously can be manufactured.

BRIEF DESCRIPTION OF THE DRAWINGS

FIGS. 2A-2E Diagrams showing a method for manufacturing a display device of the invention (Embodiment Mode 1).

FIGS. 7A-7E Diagrams showing a method for manufacturing a display device of the invention (Embodiment Mode 3).

FIGS. 8A-8C Diagrams showing a method for manufacturing a display device of the invention (Embodiment Mode 3).

FIGS. 9A-9E Diagrams showing a method for manufacturing a display device of the invention (Embodiment Mode 4).

FIGS. 11A-11D Diagrams showing a method for manufacturing a display device of the invention (Embodiment Mode 5).

FIGS. 12A-12C Diagrams showing a method for manufacturing a display device of the invention (Embodiment Mode 5).

FIGS. 16A-16D Diagrams showing a method for manufacturing a display device of the invention (Embodiment Mode 7).

FIGS. 17A-17D Diagrams showing a method for manufacturing a display device of the invention (Embodiment Mode 8).

FIGS. 18A-18C Diagrams showing a method for manufacturing a display device of the invention (Embodiment Mode 8).

FIGS. 22A-22D Diagrams showing an example of a liquid crystal display device manufactured by a method for manufacturing a display device of the invention (Embodiment Modes 1 to 4).

FIGS. 24A-24B Diagrams exemplifying one structure of a panel mounting a display device manufactured by a method for manufacturing a display device of the invention.

DETAILED DESCRIPTION OF THE INVENTION

Figure 1:
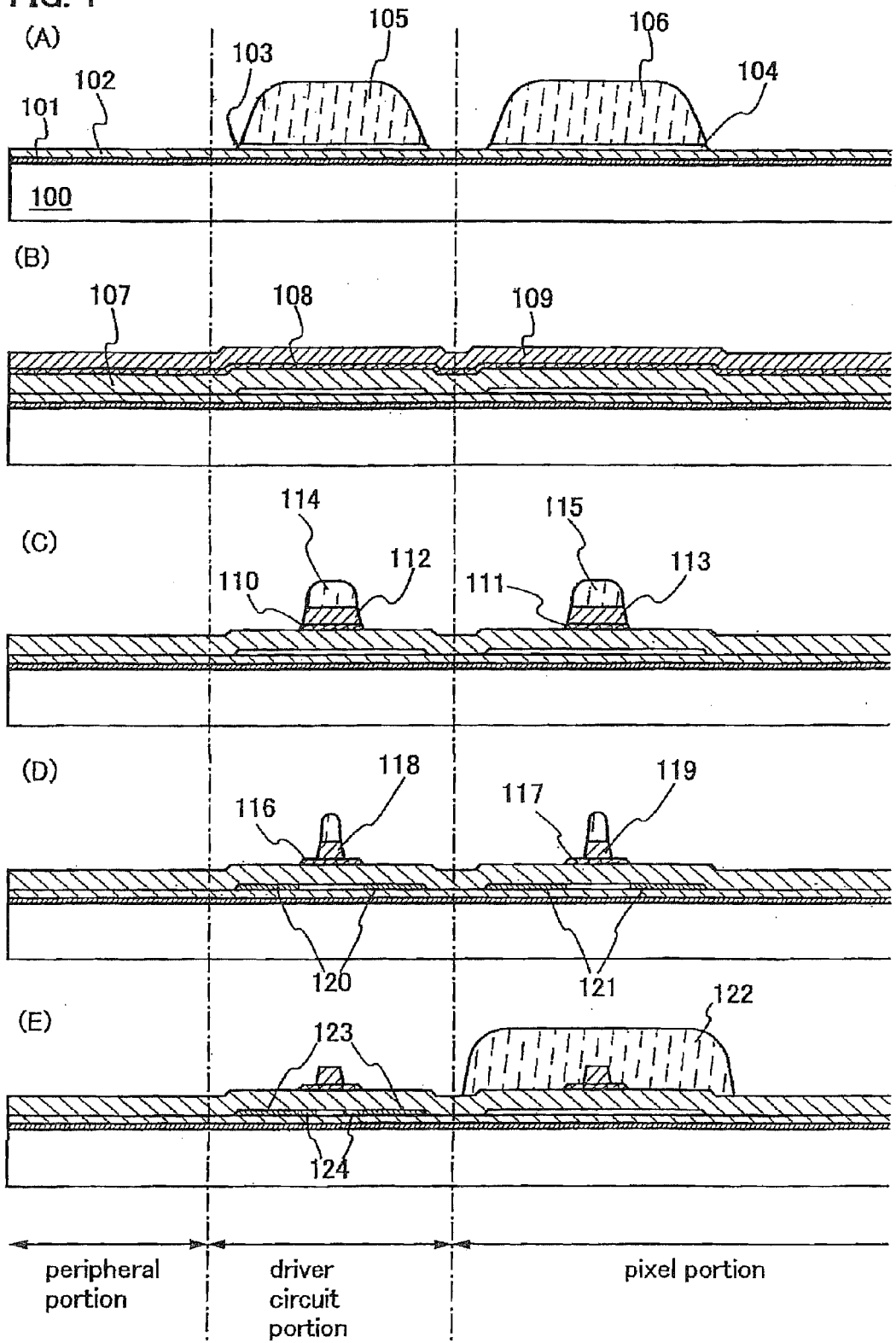
FIGS. 1A-1E Diagrams showing a method for manufacturing a display device of the present invention (Embodiment Mode 1).
Figure 3:
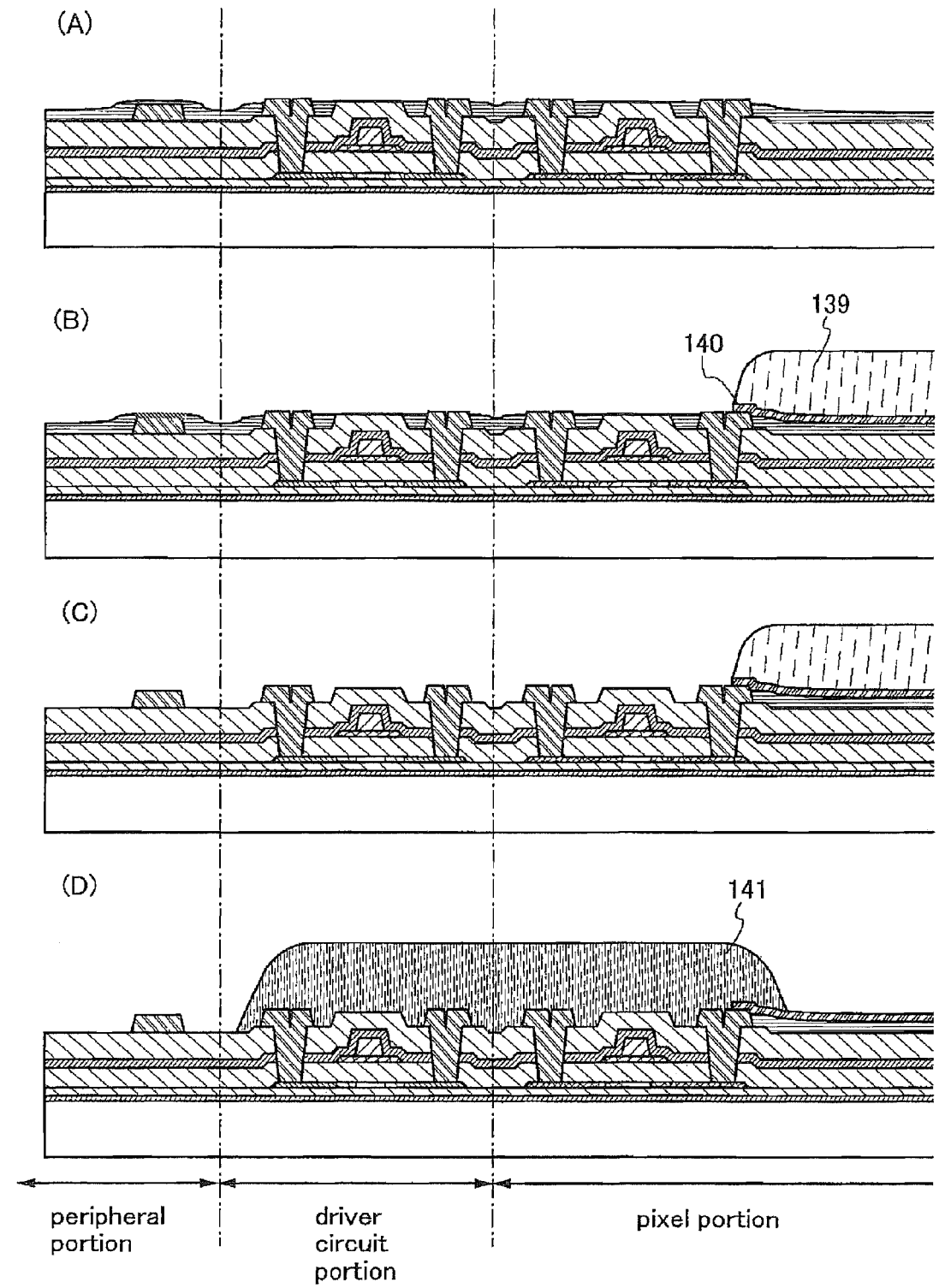
FIGS. 3A-3D Diagrams showing a method for manufacturing a display device of the invention (Embodiment Mode 1).
Figure 4:
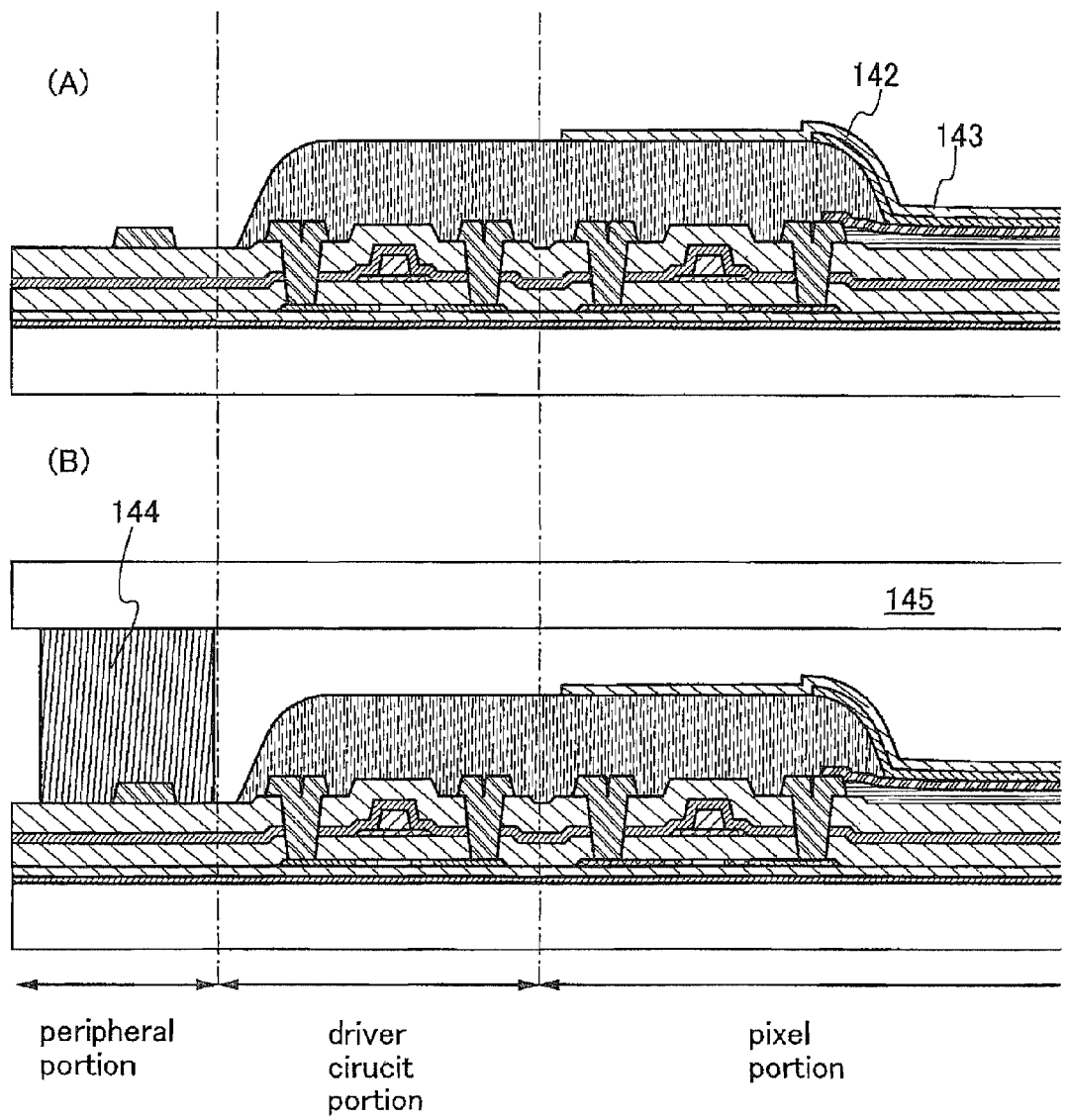
FIGS. 4A-4B Diagrams showing a method for manufacturing a display device of the invention (Embodiment Mode 1).

Best Mode for Carrying Out the Invention

Hereinafter, an Embodiment Mode of the present invention will be described with reference to the attached drawings. However, the invention can be carried out with many different modes. As is easily known to a person skilled in the art, the mode and the detail of the invention can be variously changed without departing from the purpose and the scope of the invention. Thus, the invention is not interpreted while limiting to the following description of the Embodiment Modes.

Embodiment Mode 1

A method for manufacturing a display device of the present invention will be described with reference to FIGS. 1 to 4.

First, a first base insulating film 101 and a second base insulating film 102 are formed over a substrate 100, and a semiconductor layer is then formed over the second base insulating film 102. The semiconductor layer is etched with the use of masks 105 and 106 of photoresist or the like in order to form island-shaped semiconductor layers 103 and 104 (FIG. 1A).

Glass, quartz, plastic (such as polyimide, acrylic, polyethylene terephthalate, polycarbonate, polyacrylate, or polyethersulfone), or the like can be used as a material of the substrate 100. The substrate thereof may be used after being polished by CMP or the like, if necessary. In this Embodiment Mode, a glass substrate is used.

The first base insulating film 101 and the second base insulating film 102 are formed in order to prevent an element imparting an adverse effect on characteristics of a semiconductor layer, such as alkali metal or alkali-earth metal contained in the substrate 100, from diffusing into the semiconductor layers 103 and 104. Silicon oxide, silicon nitride, silicon oxide containing nitrogen, silicon nitride containing oxygen, or the like can be used as a material thereof. In this Embodiment Mode, the first base insulating film 101 and the second base insulating film 102 are formed from silicon nitride and silicon oxide, respectively. In this Embodiment Mode, although a base insulating film is formed in two layers of the first base insulating film 101 and the second base insulating film 102, the base insulating film can be formed to be a single layer or to have a laminated structure of two or more layers. Note that a base insulating film is not necessarily required to be formed when diffusion of impurities from a substrate need not be worried about.

The subsequently formed semiconductor layer is obtained by performing laser crystallization on an amorphous silicon film in this Embodiment Mode. An amorphous silicon film is formed to be 25 to 100 nm (preferably 30 to 60 nm) in thickness over the second base insulating film 102. A known method such as a sputtering method, a low pressure CVD method, or a plasma CVD method can be used as a manufacturing method thereof. Subsequently, heat treatment is performed at a temperature of 500° C. for one hour for dehydrogenation of the thus formed silicon film.

Then, the amorphous silicon film is crystallized with the use of a laser irradiation apparatus to form a crystalline silicon film. As to the laser crystallization in this Embodiment Mode, an excimer laser is used, and an emitted laser beam is processed to have a linear beam spot with an optical system. The amorphous silicon film is irradiated therewith to be a crystalline silicon film, and is used as the semiconductor layer.

As another method for crystallizing an amorphous silicon film, there is a crystallizing method only by heat treatment or a crystallizing method by heat treatment with the use of a catalytic element which promotes crystallization. Nickel, iron, palladium, tin, lead, cobalt, platinum, copper, gold, or the like can be used as the element which promotes crystallization. By using the above element, crystallization can be performed at a lower temperature in a shorter time, compared to the case of performing crystallization only by heat treatment. Therefore, a glass substrate or the like is less damaged.

In the case of performing crystallization only by heat treatment, a highly heat resistant quartz substrate or the like may be used as the substrate 100.

Subsequently, addition of a very small amount of impurities, so-called channel doping, is performed on the semiconductor layer to control a threshold value of gate voltage in a transistor, if necessary. An N type or a P type impurity (phosphorus, boron, or the like) is added by an ion doping method to obtain a required threshold value.

Thereafter, the semiconductor layer is patterned to have a predetermined shape as shown in FIG. 1A, thereby obtaining the island-shaped semiconductor layers 103 and 104. The patterning is performed as follows: a photoresist is applied to the semiconductor layer, exposed to light and developed to form predetermined shapes of masks, and then baked to form the masks over the semiconductor layer; thereafter, etching is performed using the masks 105 and 106.

A gate insulating film 107 is formed to cover the semiconductor layers 103 and 104. Subsequently, a first conductive film 108 and a second conductive film 109 are formed over the gate insulating film 107 (FIG. 1B). The gate insulating film 107 is formed to be 40 to 150 nm in thickness with an insulating film containing silicon by a plasma CVD method or a sputtering method. In this Embodiment Mode, silicon oxide is used.

The first conductive film 108 and the second conductive film 109 may be formed by using an element of tantalum, tungsten, titanium, molybdenum, aluminum, copper, chromium, or niobium or by using an alloy material or a compound material which mainly contains the above element. A semiconductor film typified by a polycrystalline silicon film doped with an impurity element such as phosphorus may also be used. Alternatively, an AgPdCu alloy may be used.

Subsequently, gate electrodes are formed in positions overlapped with part of the semiconductor layers 103 and 104 over the gate insulating film 107 by etching the first conductive film 108 and the second conductive film 109 (FIG. 1C). In this Embodiment Mode, as the first conductive film 108, tantalum nitride (TaN) is formed to be 30 nm in thickness over the gate insulating film 107, and as the second conductive film 109, tungsten (W) is formed to be 370 nm in thickness thereover. Note that, although the first conductive film 108 is formed from TaN to be 30 nm in thickness, and the second conductive film 109 is formed from W to be 370 nm in thickness in this Embodiment Mode, the first conductive film 108 may be formed in the range of 20 to 100 nm in thickness, and the second conductive film 109 may be formed in the range of 100 to 400 nm in thickness. In addition, although a laminated structure of two layers is used in this Embodiment Mode, a single layer or a laminated structure of three or more layers may be used.

Masks 114 and 115 of resist or the like are formed through a light-exposure step by photolithography in order to form the gate electrodes and a wiring by etching the first conductive film 108 and the second conductive film 109. In a first etching, etching is performed twice using a first etching condition and a second etching condition. Etching conditions may be suitably selected. The following method is used for etching in this Embodiment Mode.

In the first etching, an ICP (inductively coupled plasma) etching method is used. As the first etching condition, $CF_4$, $Cl_2$, and $O_2$ are used as etching gases of which gas flow rates are respectively 17/17/10, and plasma is generated with a pressure of 1.5 Pa by applying an RF (13.56 MHz) power of 500 W to a coil type electrode in order to perform etching. A substrate side (sample stage) is also applied with an RF (13.56 MHz) power of 120 W; thus, negative self-bias voltage is substantially applied. By the first etching condition, the W film is etched so that an edge portion of the first conductive film has a tapered shape.

Subsequently, etching is performed after moving to the second etching condition. With the masks of resist or the like remaining, etching is performed for approximately 17 seconds by using $CF_4$ and $Cl_2$ as etching gases of which gas flow rates are respectively 20/20, and by applying an RF (13.56 MHz) power of 500 W to a coil type electrode with a pressure of 1.5 Pa to generate plasma. A substrate side (sample stage) is also applied with an RF (13.56 MHz) power of 10 W; thus, negative self bias voltage is substantially applied. Under the second etching condition mixing $CF_4$ and $Cl_2$, both of the W film and the TaN film are etched to the same extent. In this first etching, edge portions of the first conductive films 110, 111 and the second conductive films 112, 113 are each formed into a tapered shape by an effect of the bias voltages applied to the substrate sides.

Subsequently, a second etching is performed without removing the masks of resist or the like (FIG. 1D). In the second etching, etching is performed for approximately 25 seconds by using $SF_6$, $Cl_2$, and $O_2$ as etching gases of which gas flow rates are respectively 16/8/30, and by applying an RF (13.56 MHz) power of 700 W to a coil side electrode with a pressure of 2.0 Pa to generate plasma. A substrate side (sample stage) is also applied with an RF (13.56 MHz) power of 10 W, thus negative self-bias voltage is substantially applied. In this etching condition, the W film is selectively etched to form a conductive film in a second shape. At this time, the first conductive film is slightly etched. By the first and second etchings, gate electrodes formed of the first conductive films 116, 117 and the second conductive films 118, 119 are formed.

Without removing the masks of resist or the like, a first doping is performed. By the first doping, impurities which impart an N type to the crystalline semiconductor layers are lightly doped. The first doping may be performed by an ion doping method or an ion implantation method. A condition for the ion doping may be set with a dosage of $1\times10^{13}$ to $5\times10^{14}$ atoms/cm$^2$ and an acceleration voltage of 40 to 80 kV. In this Embodiment Mode, the acceleration voltage is 50 kV. As an impurity element which imparts an N type, an element belonging to a group 15 of the periodic table, typically phosphorus (P) or arsenic (As), can be used. In this Embodiment Mode, phosphorus (P) is used. Accordingly, first impurity regions 120 and 121 (N⁻ region) doped with impurities at law concentrations are formed in self-alignment with the use of the first conductive films 116 and 117 as masks.

Subsequently, the masks 114 and 115 of resist or the like are removed. Then, a mask 122 is formed of resist or the like and a second doping is performed at a higher acceleration voltage than in the first doping (FIG. 1E). Also in this second doping, impurities which impart an N type are doped. A condition for the ion doping may be set with a dosage of $1\times10^{13}$ to $3\times10^{15}$ atoms/cm$^2$ and an acceleration voltage of 60 to 120 kV. In this Embodiment Mode, the dosage is $3.0\times10^{15}$ atoms/cm$^2$ and the acceleration voltage is 65 kV. The second doping is performed so that the semiconductor layers under the first conductive films 116 and 117 are also doped with impurity elements with the use of the second conductive films 118 and 119 as masks for the impurity elements.

By performing the second doping, a second impurity region 124 (N⁻ region, Lov region) is formed in a portion of the semiconductor layers overlapped with the first conductive films 116 and 117 but not overlapped with the second conductive films 118 and 119 or in a portion not covered with the mask. The second impurity region 124 is doped with impurities which impart an N type in a concentration range from $1\times10^{18}$ to $5\times10^{19}$ atoms/cm$^3$. In addition, a portion of the semiconductor layer not covered with the first conductive film nor the mask (third impurity region 123: N⁺ region) is doped with impurities which impart an N type at a high concentration in the range of $1\times10^{19}$ to $5\times10^{21}$ atoms/cm$^3$.

Each of the impurity regions is formed by doping twice in this Embodiment Mode; however, the invention is not limited to this. Doping may be performed once or multiple times to form an impurity region having a desired impurity concentration by suitably setting a condition.

Next, the mask of resist or the like is removed, then, a mask 125 is formed of resist or the like to perform a third doping (FIG. 2A). By this third doping, the semiconductor layer to be a P-channel TFT is doped with an impurity element which imparts an opposite conductivity type to the first and second conductivity types in order to form a fourth impurity region 126 (P⁺ region) and a fifth impurity region 127 (P⁻ region).

In the third doping, the fourth impurity region 126 (P⁺ region) is formed in a portion not covered with the mask 125 of resist or the like nor overlapped with the first conductive film 117, and the fifth impurity region 127 (P⁻ region) is formed in a portion not covered with the mask of resist or the like but overlapped with the first conductive film, and not overlapped with the second conductive film. As an impurity element which imparts a P type, an element belonging to a group 13 of the periodic table, such as boron (B), aluminum (Al), or gallium (Ga) is known.

In this embodiment, the fourth and fifth impurity regions 126 and 127 are formed with boron (B) as the P type impurity element by an ion doping method using diborane ($B_2H_6$). A condition for the ion doping is set with a dosage of $1\times10^{16}$ atoms/cm$^2$ and an acceleration voltage of 80 kV.

Note that the semiconductor layer to form an N-channel TFT is covered with the mask 125 of resist or the like in the third doping.

Here, the fourth impurity region 126 (P⁺ region) and the fifth impurity region 127 (P⁻ region) are doped with phosphorus at different concentrations by the first and second dopings. However, the third doping is performed so that each of the fourth impurity region 126 (P⁺ region) and the fifth impurity region 127 (P⁻ region) contains the impurity element which imparts a P type at a concentration of $1\times10^{19}$ to $5\times10^{21}$ atoms/cm$^2$. Therefore, the fourth impurity region (P⁺ region) and the fifth impurity region (P⁻ region) function as source and drain regions of the P-channel TFT without problems.

In this Embodiment Mode, the fourth impurity region 126 (P⁺ region) and the fifth impurity region 127 (P⁻ region) are formed by performing the third doping once; however, the invention is not limited to this. Doping may also be suitably performed multiple times to form the fourth impurity region 126 (P⁺ region) and the fifth impurity region 127 (P⁻ region) depending on a condition of the doping.

Consequently, a thin film transistor formed of a semiconductor layer, a gate insulating film, and a gate electrode is formed. Further, a TFT 146 (N-channel type) for a driver circuit portion formed of the semiconductor layer 103, the gate insulating film 107, and the gate electrodes 116 and 118 and a TFT 147 (P-channel type) for a pixel portion (for driving a light-emitting element) formed of the semiconductor layer 104, the gate insulating film 107, and the gate electrodes 117 and 119 are formed. Note that a manufacturing method of a thin film transistor is not limited to this, and a known manufacturing method may be appropriately used. Further, the polarity of a TFT may also be freely designed by a user.

A top gate thin film transistor using a crystalline silicon film crystallized by laser crystallization is manufactured in this Embodiment Mode; however, a bottom gate thin film transistor using an amorphous semiconductor film can be used for the pixel portion. Silicon germanium as well as silicon can be used for an amorphous semiconductor. In the case of using silicon germanium, the concentration of germanium is preferably approximately 0.01 to 4.5 atomic %.

A microcrystalline semiconductor film (semi-amorphous semiconductor), in which a crystal grain of 0.5 to 20 nm can be observed within an amorphous semiconductor, may also be used. A microcrystal in which a crystal grain of 0.5 to 20 nm can be observed is also referred to as a microcrystal (μc).

Semi-amorphous silicon (also referred to as SAS) that is a semi-amorphous semiconductor can be obtained by performing glow discharge decomposition on a silicide gas. $SiH_4$ is typically used as the silicide gas. In addition, $Si_2H_6$, $SiH_2Cl_2$, $SiHCl_3$, $SiCl_4$, $SiF_4$, or the like can also be used. The silicide gas can be diluted with hydrogen, or hydrogen and one or more rare gas elements of helium, argon, krypton, and neon, thereby making formation of the SAS easy. At this time, it is preferable to dilute the silicide gas so that a dilution ratio ranges from 10 to 1000 times. Reaction production of the film by glow discharge decomposition may be performed with a pressure in the range of 0.1 to 133 Pa. A high-frequency power of 1 to 120 MHz, preferably 13 MHz to 60 MHz, may be supplied to form a glow discharge. A substrate heating temperature is preferably 300° C. or less, and a recommended substrate heating temperature is in the range of 100 to 250° C.

In the thus formed SAS, a Raman spectrum is shifted to a lower wavenumber side than 520 cm$^{-1}$. A diffraction peak of (111) or (220) caused by a crystal lattice of silicon is observed in X-ray diffraction. The SAS contains hydrogen or halogen of at least 1 atomic % or more to terminate a dangling bond. It is desirable that an atmospheric constituent impurity such as oxygen, nitrogen, or carbon is $1\times10^{20}$/cm$^{-1}$ or less as an impurity element in the film; in particular, an oxygen concentration is $5\times10^{19}$/cm$^3$ or less, preferably $1\times10^{19}$/cm$^3$ or less. When the SAS is processed into a TFT, μ=1 to 10 cm$^2$/Vsec is given.

In addition, the SAS may be used by further crystallizing with a laser.

Subsequently, an insulating film (hydrogenated film) 128 is formed from silicon nitride to cover the gate electrodes and the gate insulating film 107, and heat treatment is performed at 410° C. for about one hour in order to activate the impurity elements and hydrogenate the semiconductor layers 103 and 104. Subsequently, an interlayer insulating film 129 is formed to cover the insulating film (hydrogenated film) 128 (FIG. 2B). As a material for forming the interlayer insulating film 129, an inorganic insulating film such as silicon oxide, silicon nitride, or a Low-k material may be used. In this Embodiment Mode, a silicon oxide film is formed as an interlayer insulating film.

Next, contact holes reaching to the semiconductor layers 103 and 104 are opened (FIG. 2C). The contact holes can be formed by etching with the use of a mask 130 of resist or the like until the semiconductor layers 103 and 104 are exposed. Either wet etching or dry etching can be employed. Note that, etching may be performed once or in several batches depending on a condition. When etching is carried out in several batches, both wet etching and dry etching may be employed.

Next, a conductive film is formed to cover the contact holes and the interlayer insulating film. The conductive film is processed into a predetermined shape using a mask 131 of resist or the like in order to form conductive films 132 to 136 to be a wiring, source or drain electrodes, and the like, each of which is formed of the conductive film (FIG. 2D). This conductive film may be a single layer of a single metal such as aluminum or copper, a metal alloy typified by an aluminum alloy such as an alloy of aluminum, carbon and titanium, an alloy of aluminum, carbon and nickel, or an alloy of aluminum, carbon and titanium, a compound, or the like. However, in this Embodiment Mode, the conductive film is a laminated structure of molybdenum, aluminum and molybdenum in this order from the bottom. In addition, a laminated structure formed of titanium, aluminum and titanium; titanium, titanium nitride, aluminum and titanium; titanium and an aluminum alloy, or the like may be employed.

Thereafter, a planarizing film 137 is formed to cover the conductive films 132 to 136 and the interlayer insulating film 129 (FIG. 2E). As a material of the planarizing film 137, an application film with a self-planarizing property that can relieve unevenness formed in the lower layer by forming the film, for example, acrylic, polyimide, or siloxane is preferably used. That is, a material that can form a film having unevenness smaller than that formed in the lower layer can be publicly employed. In addition, a film of which unevenness is relieved by reflowing or polishing the film once formed may be used. Hereinafter, these films are generally referred to as planarizing films. In this Embodiment Mode, the planarizing film 137 is formed from siloxane. This insulating film having a self-planarizing property such as siloxane is applied; thus, it is possible to relieve unevenness due to transference of ridges of the semiconductor layers 103 and 104, a slight unevenness of the interlayer insulating film, and unevenness of the lower layer generated such as in forming the conductive films 132 to 136, and to perform planarization. Note that in this invention, siloxane is a material of which a skeleton structure is formed of the bond of silicon and oxygen, and in which an organic group containing at least hydrogen (such as an alkyl group or aryl group), a fluoro group, or an organic group containing at least hydrogen and a fluoro group may be used as the substituent.

Subsequently, etchback is performed on the planarizing film 137 in order to expose the surface of the conductive film 136 as the drain electrode of the TFT 147 for a pixel portion (for driving a light-emitting element) (FIG. 3A). Consequently, contact with an electrode can be realized with the surface planarizing and without forming a new mask; thus, a defect caused by unevenness of the lower layer can be decreased without increasing processing steps considerably.

Subsequently, a conductive film having a light transmitting property is formed to cover the planarizing film 137 and the exposed portion of the conductive film 136, and then a first electrode (anode) 140 of a thin film light-emitting element is formed by processing the conductive film having a light transmitting property with the use of a mask 139 of resist or the like by etching (FIG. 3B). Here, the first electrode (anode) 140 is electrically in contact with the conductive film 136. As a material of the first electrode (anode) 140, metal, an alloy, an electrically conductive compound each of which has high work function (work function of 4.0 eV or more), a mixture of these, or the like is preferably used. For example, ITO (indium tin oxide), ITO containing silicon (ITSO), IZO (indium zinc oxide) in which zinc oxide (ZnO) is mixed by 2 to 20 atomic % into indium oxide, zinc oxide, GZO (gallium zinc oxide) in which gallium is mixed into zinc oxide, gold (Au), platinum (Pt), nickel (Ni), tungsten (W), chromium (Cr), molybdenum (Mo), iron (Fe), cobalt (Co), copper (Cu), palladium (Pd), or metal nitride (TiN) can be used. In this Embodiment Mode, ITSO is used as the first electrode (anode) 140.

After forming the first electrode (anode) 140, the planarizing film 137 is removed by etching with the use of the first electrode (anode) 140 and the mask 139 as masks without removing the mask 139 of resist or the like (FIG. 3C). By removing the planarizing film 137 in this processing step, the planarizing film corresponding to the first electrode (anode) 140 remains; thus, planarization is realized under the first electrode (anode) 140, that is a portion in which the light-emitting element is formed; on the other hand, the planarizing film 137 corresponding to the other portion is removed. Therefore, the planarizing film is not exposed outside a sealant forming region, and the planarizing film 137 is not exposed to external atmosphere. Consequently, penetration of water into the inside of a panel through the planarizing film 137 is prevented, and it is possible to decrease deterioration of the light-emitting element due to water. In addition, the planarizing film 137 remains under the first electrode (anode) 140; thus, planarization is realized, and a defect caused by unevenness under the light-emitting element can be decreased. Note that in this processing step, a new special mask is not required; the first electrode (anode) 140 and the mask 139 of resist or the like used in manufacturing the anode are used. Therefore, it is unnecessary to further increase a processing step such as photolithography, and planarization of the anode is realized without increasing processing steps considerably.

A light-emitting device manufactured with the thus formed element substrate in which the first electrode (anode) 140 is used as a first electrode of a light-emitting element has few defects caused by unevenness under the light-emitting element. Further, since water does not penetrate from external atmosphere through a planarizing film, the reliability is high. Note that it is desirable that unevenness of a first electrode of a light-emitting element (first electrode (anode) 140 in this Embodiment Mode) is 30 nm or less in a P-V value (maximum difference of elevation) of one pixel, preferably 15 nm or less, more preferably 10 nm or less. When the unevenness of the first electrode belongs to the above range in the P-V value of one pixel, a defect increasing with an accumulated drive time (emergence and expansion of a non-light-emitting region, hereinafter referred to as an increasing type defect) can be greatly decreased.

Hereinafter, an example of a manufacturing method of a light-emitting element and a display device using the first electrode (anode) 140 fabricated by following this Embodiment Mode is shown. Needless to say, the manufacturing method of a light-emitting element and a display device is not limited to this.

An insulating film is formed of an organic or inorganic material to cover the interlayer insulating film 129 and the first electrode (anode) 140. Subsequently, the insulating film is processed to expose part of the first electrode (anode) 140, thereby forming a partition wall 141 (FIG. 3D). As a material of the partition wall 141, a photosensitive organic material (acrylic, polyimide, or the like) is preferably used; however, a non-photosensitive organic material or an inorganic material may also be used. Further, the partition wall 141 may be used as a black matrix by making the partition wall 141 black in such a way that a black pigment or dye such as titanium black or carbon nitride is diffused into the material of the partition wall 141 with the use of a diffuse material or the like. It is desirable that the partition wall 141 has a tapered shape in its end surface toward the first electrode (anode) 140 with its curvature changing continuously.

Note that it is desirable that an angle formed by the end surface of the partition wall 141 toward the first electrode 140 side and the first electrode 140 is approximately 45±5°. Photosensitive polyimide is used as the material of the partition wall 141 in order to obtain such a shape; specifically, the film thickness is approximately 1.0 µm, the temperature of baking performed after exposing to light and developing for patterning is approximately 300° C., thereby obtaining a preferable angle of approximately 43°. In addition, if exposure is performed on the entire surface again before baking is performed and after exposing to light and developing for patterning, it is possible to make the angle smaller.

Subsequently, a light-emitting laminated body 142 is formed to cover the first electrode (anode) 140 exposed from the partition wall 141. The light-emitting laminated body 142 may be formed by a vapor deposition method, a spin coating method, an ink-jet method, or the like. Subsequently, a second electrode (cathode) 143 is formed to cover the light-emitting laminated body 142 (FIG. 4A). Accordingly, a light-emitting element including the first electrode (anode) 140, the light-emitting laminated body 142, and the second electrode (cathode) 143 can be manufactured. As a cathode material for forming the second electrode (cathode) 143, it is preferable to use metal, an alloy, an electrically conductive compound, each of which has low work function (work function of 3.8 eV or less), a mixture of these, or the like. Note that as specific examples of the cathode material, the followings can be given: an element belonging to group 1 or 2 of the periodic table such as Li or Cs, which are alkali metal, Mg, Ca, or Sr, which are alkali-earth metal; an alloy (Mg:Ag or Al:Li) or a compound (LiF, CsF, or $CaF_2$) containing the above element. In addition, the cathode can also be formed from transition metal containing rare-earth metal. Further, a multilayer formed of the above material and metal (including an alloy) such as Al, Ag, or ITO can be used. In this Embodiment Mode, the cathode is formed from aluminum.

In addition, a buffer layer may be formed between a first electrode of a light-emitting element and a light-emitting laminated body.

When the first electrode of a light-emitting element is an anode, the buffer layer is formed of a layer including both a hole-transporting material and an electron-accepting material that can receive electrons from the hole-transporting material, a P type semiconductor layer, or a layer including a P type semiconductor. As the hole-transporting material, an aromatic amine-based (having a bond of a benzene ring with nitrogen) compound, phthalocyanine (abbreviation: H2Pc), or a phthalocyanine compound such as copper phthalocyanine (abbreviation: CuPc) or vanadyl phthalocyanine (abbreviation: VOPc) can be used. The aromatic amine-based compound is, for example, 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4"-tris(N,N-diphenyl-amino)-triphenylamine (abbreviation: TDATA), 4,4',4"-tris[N-(3-methylphenyl)-N-phenyl-amino]-triphenylamine (abbreviation: MTDATA), or 4,4'-bis(N-(4-(N,N-di-m-tolylamino)phenyl)-N-phenylamino)biphenyl (abbreviation: DNTPD). As the electron-accepting material that can receive electrons from the above hole-transporting material, for example, molybdenum oxide, vanadium oxide, 7,7,8,8,-tetracyanoquinodimethane (abbreviation: TCNQ), 2,3-dicyanonaphtoquinone (abbreviation: DCNNQ), 2,3,5,6-tetrafluoro-7,7,8,8,-tetracyanoquinodimethane (abbreviation: F4-TCNQ), or the like is given. The electron-accepting material that can receive electrons is selected in combination with the hole-transporting material. Further, metal oxide such as molybdenum oxide, vanadium oxide, ruthenium oxide, cobalt oxide, nickel oxide, or copper oxide can be used as the P type semiconductor.

When the first electrode of a light-emitting element is a cathode, the buffer layer is formed of a layer including both an electron-transporting material and an electron-donating material that can donate electrons to the electron-transporting material, an N type semiconductor layer, or a layer including an N type semiconductor. As the electron-transporting material, for example, the following can be used: a material including a metal complex having a quinoline skeleton or a benzoquinoline skeleton, or the like such as tris-(8-quinolinolato) aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), or bis(2-methyl-8-quinolinolato)-4-phenylphenolato-aluminum (abbreviation: BAlq). Besides the above, a material such as a metal complex having an oxazole or thiazole ligand, such as bis[2-(2-hydroxyphenyl)benzoxazolate] zinc (abbreviation: $Zn(BOX)_2$) or bis[2-(2-hydroxyphenyl) benzothiazolate]zinc (abbreviation: $Zn(BTZ)_2$), can be used. In addition to the metal complex, 2-(4-biphenylyl)-5-(4-tert-butylphenyl)-1,3,4-oxadiazole (abbreviation: PBD), 1,3-bis [5-(p-tert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like can be used. As the electron donating material that can donate electrons to the above electron-transporting material, for example, alkali metal such as lithium or cesium and its oxide, alkali-earth metal such as magnesium, calcium and its oxide, or rare-earth metal such as erbium or ytterbium can be used. The electron donating material that can donate electrons is selected in combination with the electron-transporting material. Further, a metal compound such as metal oxide can also be used as the N type semiconductor, and zinc oxide, zinc sulfide, zinc selenide, titanium oxide, or the like can be used.

The buffer layer formed of the above materials can further reduce the adverse effect of unevenness of the first electrode and further suppress an increasing type defect since it is possible for the buffer layer to be a thick film without increasing the drive voltage much. When the buffer layer is formed, assuming that it has a thickness of d nm, the P-V value of the first electrode of the light-emitting element in the pixel portion is 30 nm+d×0.2 nm or less, preferably 15 nm+d×0.2 nm or less, more preferably 10 nm+d×0.2 nm or less; therefore, it is possible to relieve unevenness better.

Note that the buffer layer may also be formed between a second electrode (second electrode (cathode) 143 in this Embodiment Mode) and the light-emitting laminated body.

Note that in this Embodiment Mode, the anode is electrically in contact with the conductive film 136 to be the drain electrode of the driving TFT for the light-emitting element. Alternatively, the cathode may be electrically in contact with the conductive film 136.

Thereafter, a silicon oxide film containing nitrogen may be formed as a passivation film by a plasma CVD method. In the case of using the silicon oxide film containing nitrogen, a silicon oxynitride film formed from $SiH_4$, $N_2O$, and $NH_3$, a silicon oxynitride film formed from $SiH_4$ and $N_2O$, or a silicon oxynitride film formed from a gas in which $SiH_4$ and $N_2O$ are diluted with Ar may be deposited by a plasma CVD method. Alternatively, a silicon oxynitride hydride film formed from $SiH_4$, $N_2O$, and $H_2$ may be used as the passivation film. Naturally, a structure of the passivation film is not limited to a single layer structure. The passivation film may have a laminated structure of another insulating film containing silicon. In addition, a multilayer film of a carbon nitride film and a silicon nitride film, a multilayer film of styrene polymer, a silicon nitride film, or a diamond like carbon film may be formed as a substitute.

The passivation film can suppress the entrance of elements which promote deterioration of a light-emitting element from the top surface of the light-emitting element; thus the reliability is improved.

Subsequently, in order to protect the light-emitting element from a deterioration-promoting material such as water, the display portion is sealed (FIG. 4B). In the case of using an opposite substrate 145 for sealing, the opposite substrate is attached by an insulating sealing material 144. The space between the opposite substrate 145 and the element substrate may be filled with inert gas such as dry nitrogen; alternatively, the sealing material may be applied to the entire surface of the pixel portion for attaching the opposite substrate 145. It is preferable to use an ultraviolet curable resin or the like as the sealing material 144. A drying agent or particles for keeping the gap between the substrates uniform may be mixed into the sealing material 144.

A light-emitting device thus manufactured has few defects caused by unevenness under a light-emitting element. Further, a planarizing film is not in contact with external atmosphere, and water does not penetrate through the planarizing film; therefore, the light-emitting device has high reliability.

Figure 21:
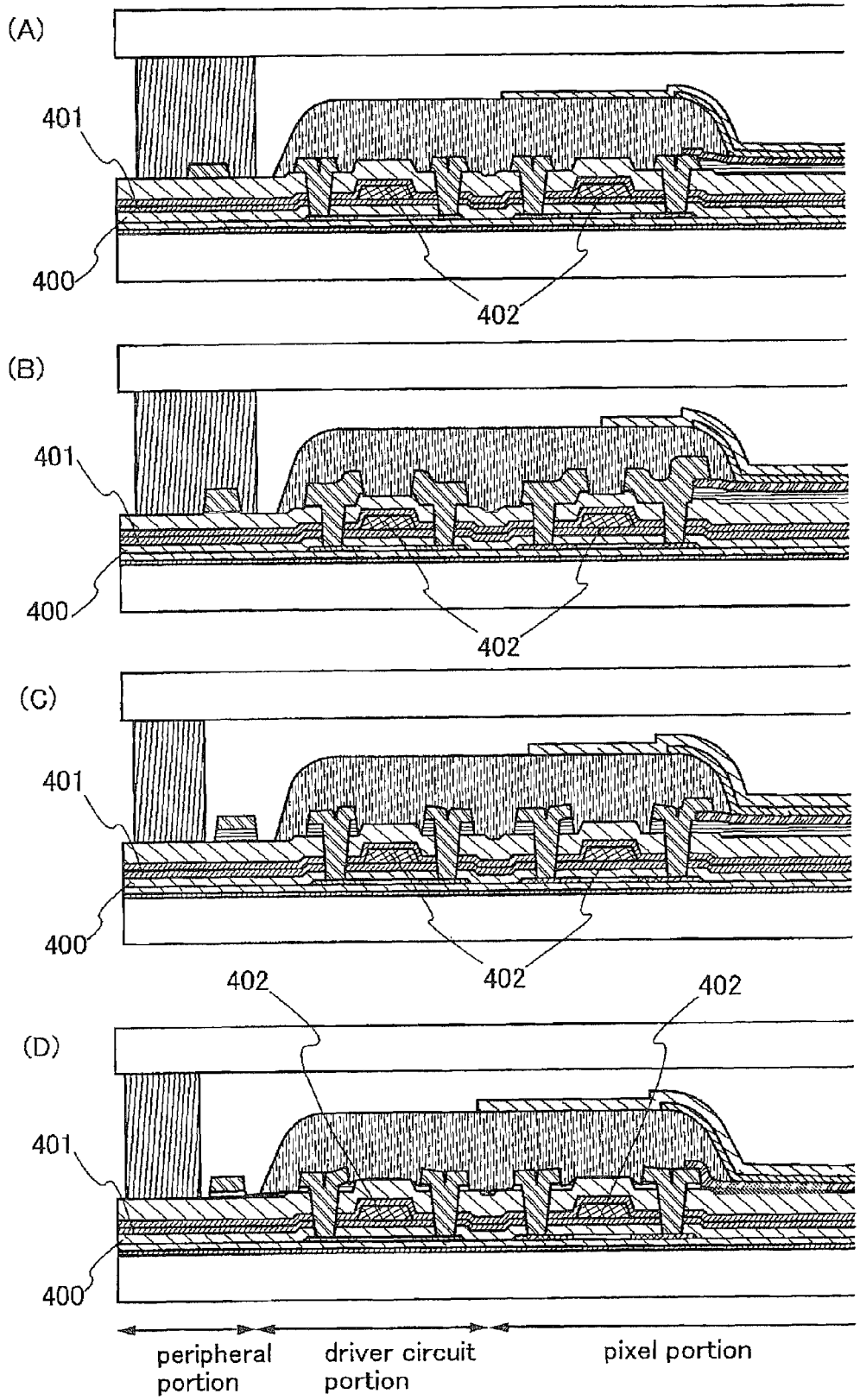
FIGS. 21A-21D Diagrams showing an example of a light-emitting device manufactured by a method for manufacturing a display device of the invention (Embodiment Modes 1 to 4).

Further, the method for manufacturing a display device of the invention is applied to a light-emitting device including a thin film transistor of another shape; the example is shown in FIG. 21A. The difference between FIG. 21A and FIG. 4B is the structures of the gate insulating films and the shapes of the gate electrodes. In FIG. 21A, a gate insulating film is formed of two layers: a first gate insulating film 400 and a second gate insulating film 401. In addition, a gate electrode 402 has a single layer structure having a tapered shape in its edge portion. The first gate insulating film 400 is preferably formed of a silicon oxide-based film having a high insulating property and few trap levels since it is in contact with a semiconductor layer. In addition, forming the second gate insulating film 401 with a silicon nitride-based film can make the operation stable even if the gate electrode 402 is formed from a material that is comparatively easy to be oxidized such as Mo. In addition, a sealing material 144 is overlapped with an interlayer insulating film 129.

Furthermore, an example of a liquid crystal display device manufactured with the method for manufacturing a display device of the invention is shown in FIG. 22A. After the liquid crystal display device is manufactured up to the state shown in FIG. 3C, a spacer 301 is obtained by forming an insulating film and patterning it. Thereafter, an alignment film 302 is formed over the entire surface of the exposed portion, and then rubbing treatment is performed.

Subsequently, a sealing material 144 is formed by a droplet discharge method or the like, and then liquid crystal 300 is dropped and sealed in by an opposite substrate 306. A method for sealing in liquid crystal is described below. A pattern of the sealing material 144 is made a closed pattern, and liquid crystal may be dropped by a liquid crystal dropping apparatus. Alternatively, an opening is formed in the pattern of the sealing material 144, and the opposite substrate 306 is attached; thereafter, a dip method (pumping up method) using a capillary phenomenon may be employed. In addition, the sealing material 144 is overlapped with an interlayer insulating film 129.

The opposite substrate 306 is provided with an opposite electrode 304 and an alignment film 303 in this order from the opposite substrate 306 side in advance.

The spacer 301 is formed by patterning the insulating film in FIG. 22A; however, a spherical spacer prepared separately may be dispersed over the alignment film 302 in order to control a cell gap.

As described above, a liquid crystal display device can be completed by applying the method for manufacturing a display device of the invention.

Embodiment Mode 2

Figure 5:
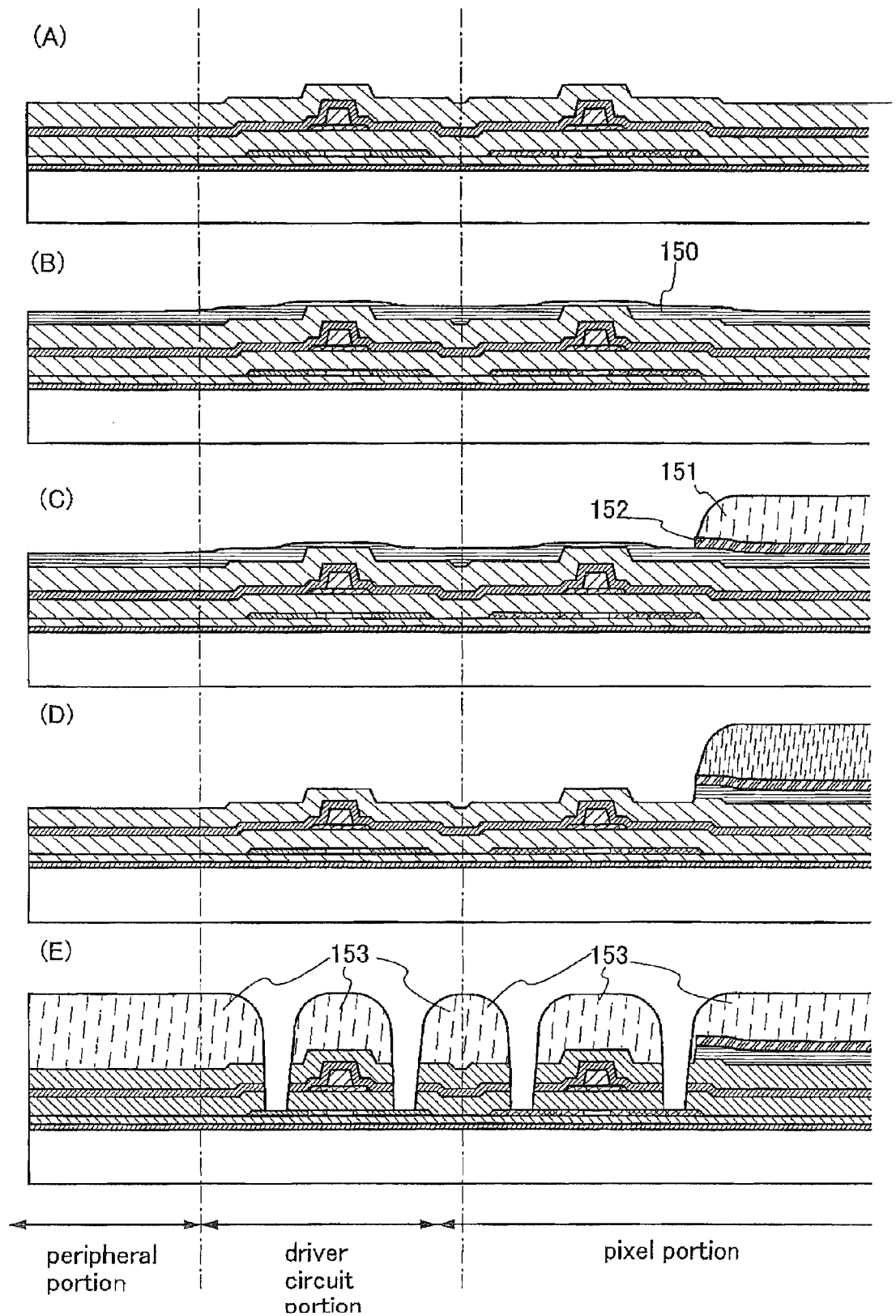
FIGS. 5A-5E Diagrams showing a method for manufacturing a display device of the invention (Embodiment Mode 2).
Figure 6:
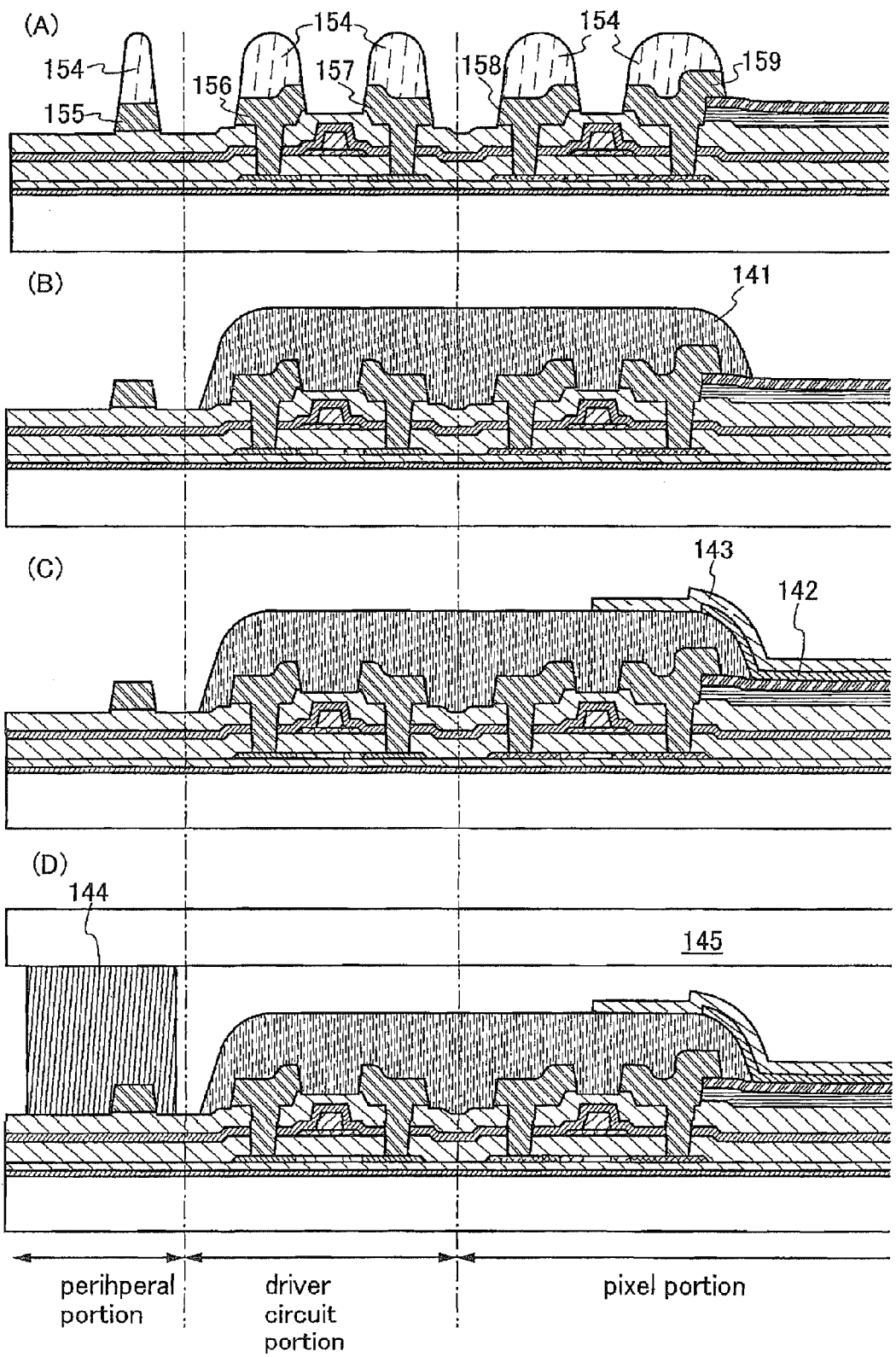
FIGS. 6A-6D Diagrams showing a method for manufacturing a display device of the invention (Embodiment Mode 2).

A method for manufacturing a display device of the present invention, which is different from that of Embodiment Mode 1, will be described with reference to FIGS. 5 and 6. The processing steps are halfway the same as those of Embodiment Mode 1; thus, the description and diagrams are omitted. Refer to Embodiment Mode 1. FIG. 5A corresponds to FIG. 2B.

After manufacturing up to the state shown in FIG. 5A following Embodiment Mode 1, a planarizing film 150 is formed to cover an interlayer insulating film 129 (FIG. 5B). As a material of the planarizing film 150, an application film with a self-planarizing property that can relieve unevenness formed in the lower layer by forming the film, for example, acrylic, polyimide, or siloxane is preferably used. That is, a material that can form a film having unevenness smaller than that formed in the lower layer can be publicly employed. In addition, a film of which unevenness is relieved by reflowing or polishing the film once formed may be used. In this Embodiment Mode, the planarizing film 150 is formed from siloxane. This insulating film having a self-planarizing property such as siloxane is applied; thus, it is possible to relieve unevenness due to a reflection of ridges of semiconductor layers 103 and 104 or a slight unevenness of the interlayer insulating film, and to perform planarization.

Subsequently, a conductive film having a light transmitting property is formed to cover the planarizing film 150, and then a first electrode (anode) 152 of a thin film light-emitting element is formed by processing the conductive film having a light transmitting property with the use of a mask 151 of resist or the like (FIG. 5C). A material of the first electrode (anode) 152 is the same as that of Embodiment Mode 1; thus, the description is omitted. Refer to Embodiment Mode 1. In this Embodiment Mode, ITO is used as the first electrode (anode) 152.

After forming the first electrode (anode) 152, the planarizing film 150 is removed by etching with the use of the first electrode (anode) 152 and the mask 151 as masks without removing the mask 151 of resist or the like (FIG. 5D). By removing the planarizing film 150 in this processing step, the planarizing film 150 corresponding to the first electrode (anode) 152 remains; thus, planarization is realized under the first electrode (anode) 152, which is a portion in which the light-emitting element is formed; on the other hand, the planarizing film 150 corresponding to the other portion is removed. Therefore, the planarizing film is not exposed outside a sealant forming region, and the planarizing film 150 is not exposed to external atmosphere. Consequently, penetration of water into the inside of a panel through the planarizing film 150 is prevented, and it is possible to decrease deterioration of the light-emitting element due to water.

In addition, the planarizing film 150 remains under the first electrode (anode) 152 of the light-emitting element; thus, planarization is realized in the first electrode, and a defect caused by unevenness under the light-emitting element can be decreased. Note that it is desirable that unevenness of the first electrode of the light-emitting element is 30 nm or less in a P-V value of one pixel, preferably 15 nm or less, more preferably 10 nm or less. When the unevenness of the first electrode belongs to the above range in the P-V value of one pixel, an increasing type defect can be greatly decreased.

In this processing step, a new special mask is not required; the first electrode (anode) 152 and the mask 151 of resist or the like used in manufacturing the anode are used. Therefore, it is unnecessary to further increase a processing step such as photolithography, and planarization of the anode is realized without increasing processing steps considerably.

Next, contact holes reaching to the semiconductor layers 103 and 104 are opened (FIG. 5E). The contact holes can be formed by etching with the use of a mask 153 of resist or the like until the semiconductor layers 103 and 104 are exposed. Either wet etching or dry etching can be employed. Note that, etching may be performed once or in several batches depending on a condition. When etching is carried out in several batches, both wet etching and dry etching may be employed.

Next, a conductive film is formed to cover the contact holes and the interlayer insulating film. The conductive film is processed into a predetermined shape using a mask 154 of resist or the like in order to form conductive films 155 to 159 to be a wiring and source or drain electrodes (FIG. 6A). This conductive film may be a single layer of a single metal such as aluminum or copper, a metal alloy typified by an aluminum alloy such as an alloy of aluminum, carbon and titanium, an alloy of aluminum, carbon and nickel, or an alloy of aluminum, carbon and titanium, a compound, or the like. However, in this Embodiment Mode, this conductive film is a laminated structure of molybdenum, aluminum and molybdenum in this order of manufacture. In addition, a laminated structure formed of titanium, aluminum and titanium; titanium, titanium nitride, aluminum and titanium; titanium and an aluminum alloy, or the like may be employed. In addition, a conductive film 159 to be the drain electrode of the driving TFT for the pixel portion is electrically in contact with the first electrode (anode) 152 that is a pixel electrode.

A light-emitting device manufactured with the thus formed element substrate in which the first electrode (anode) 152 is used as a first electrode of a light-emitting element has few defects caused by unevenness under the light-emitting element. Further, since water does not penetrate from external atmosphere through a planarizing film, the reliability is high. Hereinafter, an example of a manufacturing method of a light-emitting element and a display device using the first electrode (anode) 152 fabricated by following this Embodiment Mode is shown. Needless to say, the manufacturing method of a light-emitting element and a display device is not limited to this.

An insulating film is formed of an organic or inorganic material to cover the interlayer insulating film 129 and the first electrode (anode) 152. Subsequently, the insulating film is processed to expose part of the first electrode (anode) 152, thereby forming a partition wall 141 (FIG. 6B). As a material of the partition wall 141, a photosensitive organic material (acrylic, polyimide, or the like) is preferably used; however, a non-photosensitive organic material or an inorganic material may also be used. Further, the partition wall 141 may be used as a black matrix by making the partition wall 141 black in such a way that a black pigment or dye such as titanium black or carbon nitride is diffused into the material of the partition wall 141 with the use of a diffuse material or the like. It is desirable that the partition wall 141 has a tapered shape in its end surface toward the first electrode (anode) 152 with its curvature changing continuously.

Note that it is desirable that an angle formed by the end surface of the partition wall 141 toward the first electrode 152 side and the first electrode 152 is approximately 45±5°. Photosensitive polyimide is used as the material of the partition wall 141 in order to obtain such a shape; specifically, the film thickness is approximately 1.0 µm, the temperature of baking performed after exposing to light and developing for patterning is approximately 300° C., thereby obtaining a preferable angle of approximately 43°. In addition, if a processing step in which exposure is performed on the entire surface again before baking is performed and after exposing to light and developing for patterning, it is possible to make the angle smaller.

Subsequently, a light-emitting laminated body 142 is formed to cover the first electrode (anode) 152 exposed from the partition wall 141. The light-emitting laminated body 142 may be formed by a vapor deposition method, a spin coating method, an ink-jet method, or the like. Subsequently, a second electrode (cathode) 143 is formed to cover the light-emitting laminated body 142 (FIG. 6C). Accordingly, a light-emitting element including the first electrode (anode) 152, the light-emitting laminated body 142, and the second electrode (cathode) 143 can be manufactured. As a cathode material for forming the second electrode (cathode) 143, it is preferable to use metal, an alloy, an electrically conductive compound, each of which has low work function (work function of 3.8 eV or less), a mixture of these, or the like. Note that as specific examples of the cathode material, the followings can be given: an element belonging to group 1 or 2 of the periodic table such as Li or Cs, which are alkali metal, Mg, Ca, or Sr, which are alkali-earth metal; an alloy (Mg:Ag or Al:Li) or a compound (LiF, CsF, or $CaF_2$) containing the above element. In addition, the cathode can also be formed from transition metal containing rare-earth metal. Further, a multilayer formed of the above material and metal (including an alloy) such as Al, Ag, or ITO can be used. In this Embodiment Mode, the cathode is formed from aluminum.

Note that a buffer layer may be formed in the light-emitting element. Refer to Embodiment Mode 1 for the explanation of the buffer layer.

Note that in this Embodiment Mode, the anode is electrically in contact with the conductive film 159 as the drain electrode of the driving TFT for the light-emitting element. Alternatively, the cathode may be electrically in contact with the conductive film 159.

Thereafter, a silicon nitride film containing oxygen may be formed as a passivation film by a plasma CVD method. In the case of using the silicon nitride film containing oxygen, a silicon nitride film containing oxygen formed from $SiH_4$, $N_2O$, and $NH_3$, a silicon nitride film containing oxygen formed from $SiH_4$ and $N_2O$, or a silicon nitride film containing oxygen formed from a gas in which $SiH_4$ and $N_2O$ are diluted with Ar may be deposited by a plasma CVD method.

Alternatively, a silicon oxynitride hydride film formed from $SiH_4$, $N_2O$, and $H_2$ may be used as the passivation film. Naturally, a structure of the passivation film is not limited to a single layer structure. The passivation film may have a single layer structure or a laminated structure of another insulating film containing silicon. In addition, a multilayer film of a carbon nitride film and a silicon nitride film, a multilayer film of styrene polymer, a silicon nitride film, or a diamond like carbon film may be formed as a substitute for a silicon nitride film containing oxygen.

The passivation film can suppress the entrance of elements which promote deterioration of a light-emitting element from the top surface of the light-emitting element; thus the reliability is improved.

Subsequently, in order to protect the light-emitting element from a deterioration-promoting material such as water, the display portion is sealed (FIG. 6D). In the case of using an opposite substrate 145 for sealing, the opposite substrate is attached by an insulating sealing material 144. The space between the opposite substrate 145 and the element substrate may be filled with inert gas such as dry nitrogen; alternatively, the sealing material may be applied to the entire surface of the pixel portion for attaching the opposite substrate 145. It is preferable to use an ultraviolet curable resin or the like as the sealing material 144. A drying agent or particles for keeping the gap between the substrates uniform may be mixed into the sealing material 144.

Further, the method for manufacturing a display device of the invention is applied to a light-emitting device including a thin film transistor of another shape; the example is shown in FIG. 21B. The difference between FIG. 21B and FIG. 6D is the structures of the gate insulating films and shapes of the gate electrodes. In FIG. 21B, a gate insulating film is formed of two layers: a first gate insulating film 400 and a second gate insulating film 401. In addition, a gate electrode 402 has a single layer structure having a tapered shape in its edge portion. The first gate insulating film 400 is preferably formed of a silicon oxide-based film having a high insulating property and few trap levels since it is in contact with a semiconductor layer. In addition, forming the second gate insulating film 401 with a silicon nitride-based film can make the operation stable even if the gate electrode 402 is formed from a material that is comparatively easy to be oxidized such as Mo. In addition, a sealing material 144 is overlapped with an interlayer insulating film 129.

A light-emitting device thus manufactured has few defects caused by unevenness under a light-emitting element. Further, water does not penetrate from external atmosphere through a planarizing film; therefore, the light-emitting device has high reliability.

Furthermore, an example of a liquid crystal display device manufactured with the method for manufacturing a display device of the invention is shown in FIG. 22B. After the liquid crystal display device is manufactured up to the state shown in FIG. 6A, a spacer 301 is obtained by forming an insulating film and patterning it. Thereafter, an alignment film 302 is formed over the entire surface, and then rubbing treatment is performed.

Subsequently, a sealing material 144 is formed by a droplet discharge method or the like, and then liquid crystal 300 is dropped and sealed in by an opposite substrate 306. A method for sealing in liquid crystal is described below. A pattern of the sealing material 144 is made a closed pattern, and liquid crystal may be dropped by a liquid crystal dropping apparatus. Alternatively, an opening is formed in the pattern of the sealing material 144, and the opposite substrate 306 is attached; thereafter, a dip method (pumping up method) using a capillary phenomenon may be employed. In addition, the sealing material 144 is overlapped with an interlayer insulating film 129.

The opposite substrate 306 is provided with an opposite electrode 304 and an alignment film 303 in advance.

The spacer 301 is formed by patterning the insulating film in FIG. 22B; however, a spherical spacer prepared separately may be dispersed over the alignment film 302 in order to control a cell gap.

As described above, a liquid crystal display device can be completed by applying the method for manufacturing a display device of the invention.

Embodiment Mode 3

A method for manufacturing a display device of the present invention, which is different from those of Embodiment Modes 1 and 2, will be described with reference to FIGS. 7 and 8. The processing steps are halfway the same as those of Embodiment Mode 1; thus, the description and diagrams are omitted. Refer to Embodiment Mode 1. FIG. 7A corresponds to FIG. 2B.

After manufacturing up to the state shown in FIG. 7A following Embodiment Mode 1, a planarizing film 150 is formed to cover an interlayer insulating film 129 (FIG. 7B). As a material of the planarizing film 150, an application film with a self-planarizing property that can relieve unevenness formed in the lower layer by forming the film, for example, acrylic, polyimide, or siloxane is preferably used. That is, a material that can form a film having unevenness smaller than that formed in the lower layer can be publicly employed. In addition, a film of which unevenness is relieved by reflowing or polishing the film once formed may be used. In this Embodiment Mode, the planarizing film 150 is formed from siloxane. This insulating film having a self-planarizing property such as siloxane is applied; thus, it is possible to relieve unevenness due to a reflection of ridges of semiconductor layers 103 and 104 or a slight unevenness of the interlayer insulating film, and to perform planarization.

Subsequently, a conductive film having a light transmitting property is formed to cover the planarizing film 150, and then a first electrode (anode) 152 of a thin film light-emitting element is formed by processing the conductive film having a light transmitting property with the use of a mask 151 of resist or the like (FIG. 7C). A material of the first electrode (anode) 152 is the same as that of Embodiment Mode 1; thus, the description is omitted. Refer to Embodiment Mode 1. In this Embodiment Mode, ITO is used as the first electrode (anode) 152.

Next, contact holes reaching to the semiconductor layers 103 and 104 are opened (FIG. 7D). The contact holes can be formed by etching with the use of a mask 170 of resist or the like until the semiconductor layers 103 and 104 are exposed. Either wet etching or dry etching can be employed. Note that, etching may be performed once or in several batches depending on a condition. When etching is carried out in several batches, both wet etching and dry etching may be employed.

Next, a conductive film is formed to cover the contact holes and the interlayer insulating film. The conductive film is processed into a predetermined shape using a mask 171 of resist or the like in order to form conductive films 172 to 176 to be a wiring and source or drain electrodes (FIG. 7E). This conductive film may be a single layer of a single metal such as aluminum or copper, a metal alloy typified by an aluminum alloy such as an alloy of aluminum, carbon and titanium, an alloy of aluminum, carbon and nickel, or an alloy of aluminum, carbon and titanium, a compound, or the like. However, in this Embodiment Mode, this conductive film is a laminated structure of molybdenum, aluminum and molybdenum in this order of manufacture. In addition, a laminated structure formed of titanium, aluminum and titanium; titanium, titanium nitride, aluminum and titanium; titanium and an aluminum alloy, or the like may be employed. In addition, a conductive film 176 to be the drain electrode of the driving TFT for the pixel portion is electrically in contact with the first electrode (anode) 152 that is a pixel electrode.

Subsequently, the planarizing film 150 is removed by etching with the use of the conductive films 172 to 176 and the first electrode (anode) 152 as masks (FIG. 7E). This removing of the planarizing film 150 may be performed at the same time as the etching performed in manufacturing the conductive films 172 to 176; alternatively, it may be performed separately. By removing the planarizing film 150 in this processing step, the planarizing film 150 corresponding to the first electrode (anode) 152 remains; thus, planarization is realized under the first electrode (anode) 152, which is a portion in which the light-emitting element is formed; on the other hand, the planarizing film 150 corresponding to the other portion is removed. Therefore, the planarizing film is not exposed outside a sealant forming region, and the planarizing film 150 is not exposed to external atmosphere. Consequently, penetration of water into the inside of a panel through the planarizing film 150 is prevented, and it is possible to decrease deterioration of the light-emitting element due to water.

In addition, the planarizing film 150 remains under the first electrode (anode) 152 of the light-emitting element; thus, planarization is realized, and a defect caused by unevenness under the light-emitting element can be decreased. Note that it is desirable that unevenness of the first electrode of the light-emitting element is 30 nm or less in a P-V value of one pixel, preferably 15 nm or less, more preferably 10 nm or less. When the unevenness of the first electrode belongs to the above range in the P-V value of one pixel, an increasing type defect can be greatly decreased.

In this processing step, a new special mask is not required; the conductive films 172 to 176, the first electrode (anode) 152 and the mask 171 of resist or the like used in manufacturing the above are used. Therefore, it is unnecessary to further increase a processing step such as photolithography, and planarization of the anode is realized without increasing processing steps considerably.

A light-emitting device manufactured with the thus formed element substrate in which the first electrode (anode) 152 is used as a first electrode of a light-emitting element has few defects caused by unevenness under the light-emitting element. Further, since water does not penetrate from external atmosphere through a planarizing film, the reliability is high. Hereinafter, an example of a manufacturing method of a light-emitting element and a display device using the first electrode (anode) 152 fabricated by following this Embodiment Mode is shown. Needless to say, the manufacturing method of a light-emitting element and a display device is not limited to this.

An insulating film is formed of an organic or inorganic material to cover the interlayer insulating film 129 and the first electrode (anode) 152. Subsequently, the insulating film is processed to expose part of the first electrode (anode) 152, thereby forming a partition wall 141 (FIG. 8A). As a material of the partition wall 141, a photosensitive organic material (acrylic, polyimide, or the like) is preferably used; however, a non-photosensitive organic material or an inorganic material may also be used. Further, the partition wall 141 may be used as a black matrix by making the partition wall 141 black in such a way that a black pigment or dye such as titanium black or carbon nitride is diffused into the material of the partition wall 141 with the use of a diffuse material or the like. It is desirable that the partition wall 141 has a tapered shape in its end surface toward the first electrode (anode) 152 with its curvature changing continuously.

Note that it is desirable that an angle formed by the end surface of the partition wall 141 toward the first electrode 152 side and the first electrode 152 is approximately 45±5°. Photosensitive polyimide is used as the material of the partition wall 141 in order to obtain such a shape; specifically, the film thickness is approximately 1.0 µm, the temperature of baking performed after exposing to light and developing for patterning is approximately 300° C., thereby obtaining a preferable angle of approximately 43°. In addition, if a processing step in which exposure is performed on the entire surface again before baking is performed and after exposing to light and developing for patterning, it is possible to make the angle smaller.

Subsequently, a light-emitting laminated body 142 is formed to cover the first electrode (anode) 152 exposed from the partition wall 141. The light-emitting laminated body 142 may be formed by a vapor deposition method, a spin coating method, an ink-jet method, or the like. Subsequently, a second electrode (cathode) 143 is formed to cover the light-emitting laminated body 142 (FIG. 8B). Accordingly, a light-emitting element including the first electrode (anode) 152, the light-emitting laminated body 142, and the second electrode (cathode) 143 can be manufactured. As a cathode material for forming the second electrode (cathode) 143, it is preferable to use metal, an alloy, an electrically conductive compound, each of which has low work function (work function of 3.8 eV or less), a mixture of these, or the like. Note that as specific examples of the cathode material, the followings can be given: an element belonging to group 1 or 2 of the periodic table such as Li or Cs, which are alkali metal, Mg, Ca, or Sr, which are alkali-earth metal; an alloy (Mg:Ag or Al:Li) or a compound (LiF, CsF, or $CaF_2$) containing the above element. In addition, the cathode can also be formed from transition metal containing rare-earth metal. Further, a multilayer formed of the above material and metal (including an alloy) such as Al, Ag, or ITO can be used. In this Embodiment Mode, the cathode is formed from aluminum.

Note that a buffer layer may be formed in the light-emitting element. Refer to Embodiment Mode 1 for the explanation of the buffer layer.

Note that in this Embodiment Mode, the anode is electrically in contact with the conductive film 176 as the drain electrode of the driving TFT for the light-emitting element. Alternatively, the cathode may be electrically in contact with the conductive film 176.

Thereafter, a silicon oxide film containing nitrogen may be formed as a passivation film by a plasma CVD method. In the case of using the silicon oxide film containing nitrogen, a silicon oxynitride film formed from $SiH_4$, $N_2O$, and $NH_3$, a silicon oxynitride film formed from $SiH_4$ and $N_2O$, or a silicon oxynitride film formed from a gas in which $SiH_4$ and $N_2O$ are diluted with Ar may be deposited by a plasma CVD method.

Alternatively, a silicon oxynitride hydride film formed from $SiH_4$, $N_2O$, and $H_2$ may be used as the passivation film. Naturally, a structure of the passivation film is not limited to a single layer structure. The passivation film may have a single layer structure or a laminated structure of another insulating film containing silicon. In addition, a multilayer film of a carbon nitride film and a silicon nitride film, a multilayer film of styrene polymer, a silicon nitride film, or a diamond like carbon film may be formed as a substitute for a silicon oxide film containing nitrogen.

The passivation film can suppress the entrance of elements which promote deterioration of a light-emitting element from the top surface of the light-emitting element; thus the reliability is improved.

Subsequently, in order to protect the light-emitting element from a deterioration-promoting material such as water, the display portion is sealed (FIG. 8C). In the case of using an opposite substrate 145 for sealing, the opposite substrate is attached by an insulating sealing material 144. In this Embodiment Mode, since the planarizing film 150 remains under the conductive film 172 to be the wiring, it is preferable that the sealing material 144 is provided so as not to be overlapped with the conductive film 172 in a lead portion. By thus providing the sealing material, penetration of water through the sealing material 144 and the planarizing film 150 under the conductive film 172 can be effectively prevented.

The space between the opposite substrate 145 and the element substrate may be filled with inert gas such as dry nitrogen; alternatively, the sealing material may be applied to the entire surface of the pixel portion for attaching the opposite substrate 145. It is preferable to use an ultraviolet curable resin or the like as the sealing material 144. A drying agent or particles for keeping the gap between the substrates uniform may be mixed into the sealing material 144.

A light-emitting device thus manufactured has few defects caused by unevenness under a light-emitting element. Further, water does not penetrate from external atmosphere through a planarizing film; therefore, the light-emitting device has high reliability.

Further, the method for manufacturing a display device of the invention is applied to a light-emitting device including a thin film transistor of another shape; the example is shown in FIG. 21C. The difference between FIG. 21C and FIG. 8C is the structures of the gate insulating films and shapes of the gate electrodes. In FIG. 21C, a gate insulating film is formed of two layers: a first gate insulating film 400 and a second gate insulating film 401. In addition, a gate electrode 402 has a single layer structure having a tapered shape in its edge portion. The first gate insulating film 400 is preferably formed of a silicon oxide-based film having a high insulating property and few trap levels since it is in contact with a semiconductor layer. In addition, forming the second gate insulating film 401 with a silicon nitride-based film can make the operation stable even if the gate electrode 402 is formed from a material that is comparatively easy to be oxidized such as Mo. In addition, a sealing material 144 is overlapped with an interlayer insulating film 129.

Furthermore, an example of a liquid crystal display device manufactured with the method for manufacturing a display device of the invention is shown in FIG. 22C. After the liquid crystal display device is manufactured up to the state shown in FIG. 7E, a spacer 301 is obtained by forming an insulating film and patterning it. Thereafter, an alignment film 302 is formed over the entire surface, and then rubbing treatment is performed.

Subsequently, a sealing material 144 is formed by a droplet discharge method or the like, and then liquid crystal 300 is dropped and sealed in by an opposite substrate 306. A method for sealing in liquid crystal is described below. A pattern of the sealing material 144 is made a closed pattern, and liquid crystal may be dropped by a liquid crystal dropping apparatus. Alternatively, an opening is formed in the pattern of the sealing material 144, and the opposite substrate 306 is attached; thereafter, a dip method (pumping up method) using a capillary phenomenon may be employed. In addition, the sealing material 144 is overlapped with an interlayer insulating film 129.

The opposite substrate 306 is provided with an opposite electrode 304 and an alignment film 303 in this order from the opposite substrate 306 side in advance.

The spacer 301 is formed by patterning the insulating film in FIG. 22C; however, a spherical spacer prepared separately may be dispersed over the alignment film 302 in order to control a cell gap.

As described above, a liquid crystal display device can be completed by applying the method for manufacturing a display device of the invention.

Embodiment Mode 4

Figure 10:
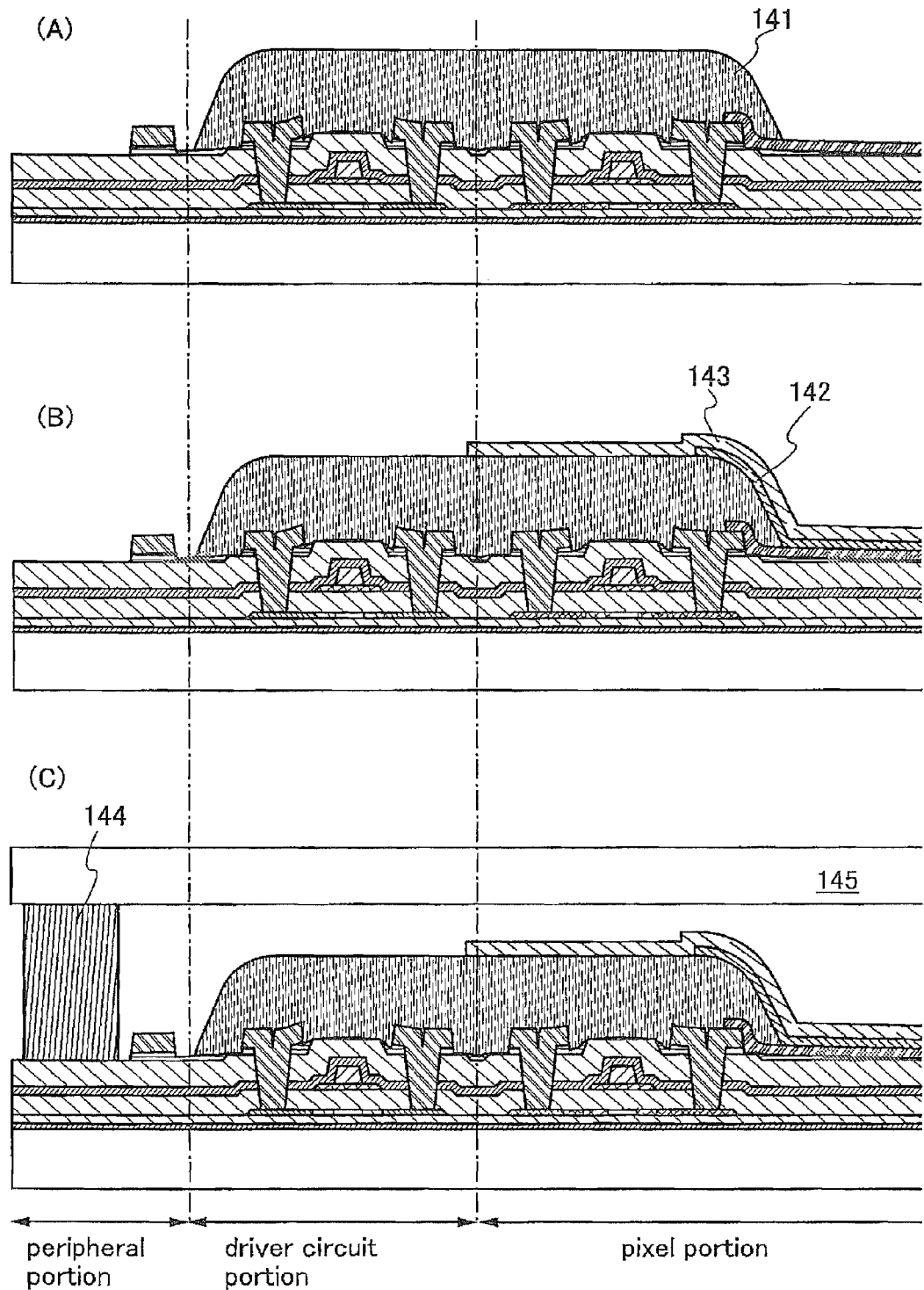
FIGS. 10A-10C Diagrams showing a method for manufacturing a display device of the invention (Embodiment Mode 4).

A method for manufacturing a display device, which is different from those of Embodiment Modes 1 to 3, will be described with reference to FIGS. 9 and 10. The processing steps are halfway the same as those of Embodiment Mode 1; thus, the description and diagrams are omitted. Refer to Embodiment Mode 1. FIG. 9A corresponds to FIG. 2B.

After manufacturing up to the state shown in FIG. 9A following Embodiment Mode 1, an extremely thin planarizing film 190 is formed to cover an interlayer insulating film 129 to the extent that unevenness of the interlayer insulating film 129 is hidden (FIG. 9B). As a material of the planarizing film 190, an application film with a self-planarizing property that can relieve unevenness formed in the lower layer by forming the film, for example, acrylic, polyimide, or siloxane is preferably used. That is, a material that can form a film having unevenness smaller than that formed in the lower layer can be publicly employed. In addition, a film of which unevenness is relieved by reflowing or polishing the film once formed may be used. In this Embodiment Mode, the planarizing film 190 is formed from siloxane. This insulating film having a self-planarizing property such as siloxane is applied; thus, it is possible to relieve unevenness due to a reflection of ridges of semiconductor layers 103 and 104 or a slight unevenness of the interlayer insulating film, and to perform planarization.

Next, contact holes reaching to the semiconductor layers 103 and 104 are opened (FIG. 9C). The contact holes can be formed by etching with the use of a mask 191 of resist or the like until the semiconductor layers 103 and 104 are exposed. Either wet etching or dry etching can be employed. Note that, etching may be performed once or in several batches depending on a condition. When etching is carried out in several batches, both wet etching and dry etching may be employed.

Next, a conductive film is formed to cover the contact holes and the interlayer insulating film. The conductive film is processed into a predetermined shape using a mask 192 of resist or the like in order to form conductive films 193 to 197 to be a wiring and source or drain electrodes (FIG. 9(D)). A single metal such as aluminum or copper, a metal alloy typified by an aluminum alloy such as an alloy of aluminum, carbon and titanium, an alloy of aluminum, carbon and nickel, or an alloy of aluminum, carbon and titanium, a compound, or the like can be used for forming this conductive film. The conductive film may be formed of a single layer; however, in this Embodiment Mode, this conductive film is a laminated structure of molybdenum, aluminum and molybdenum in this order of manufacture. In addition, a laminated structure formed of titanium, aluminum and titanium; titanium, titanium nitride, aluminum and titanium; titanium and an aluminum alloy, or the like may be employed.

Subsequently, a conductive film having a light transmitting property is formed to cover the interlayer insulating film 129 and the conductive films 193 to 197, and then a first electrode (anode) 199 of a thin film light-emitting element is formed by processing the conductive film having a light transmitting property with the use of a mask 198 of resist or the like by etching (FIG. 9E). Here, the first electrode (anode) 199 is electrically in contact with the conductive film 197 of the driving TFT for the light-emitting element. A material of the first electrode (anode) 199 is the same as that of Embodiment Mode 1; thus, the description is omitted. Refer to Embodiment Mode 1. In this Embodiment Mode, ITO is used as the first electrode (anode) 199.

A light-emitting device manufactured with the thus formed element substrate in which the first electrode (anode) 199 is used as a first electrode of a light-emitting element has few defects caused by unevenness under the light-emitting element. Further, since water hardly penetrates from external atmosphere through a planarizing film due to the extremely thin planarizing film 190, the reliability is high. Hereinafter, an example of a manufacturing method of a light-emitting element and a display device using the first electrode (anode) 199 fabricated by following this Embodiment Mode is shown. Needless to say, the manufacturing method of a light-emitting element and a display device is not limited to this.

Note that it is desirable that unevenness of the first electrode of the light-emitting element is 30 nm or less in a P-V value of one pixel, preferably 15 nm or less, more preferably 10 nm or less. When the unevenness of the first electrode belongs to the above range in the P-V value of one pixel, an increasing type defect can be greatly decreased.

An insulating film is formed of an organic or inorganic material to cover the interlayer insulating film 129 and the first electrode (anode) 199. Subsequently, the insulating film is processed to expose part of the first electrode (anode) 199, thereby forming a partition wall 141 (FIG. 10A). As a material of the partition wall 141, a photosensitive organic material (acrylic, polyimide, or the like) is preferably used; however, a non-photosensitive organic material or an inorganic material may also be used. Further, the partition wall 141 may be used as a black matrix by making the partition wall 141 black in such a way that a black pigment or dye such as titanium black or carbon nitride is diffused into the material of the partition wall 141 with the use of a diffuse material or the like. It is desirable that the partition wall 141 has a tapered shape in its end surface toward the first electrode (anode) 199 with its curvature changing continuously.

Note that it is desirable that an angle formed by the end surface of the partition wall 141 toward the first electrode 199 side and the first electrode 199 is approximately 45±5°. Photosensitive polyimide is used as the material of the partition wall 141 in order to obtain such a shape; specifically, the film thickness is approximately 1.0 µm, the temperature of baking performed after exposing to light and developing for patterning is approximately 300° C., thereby obtaining a preferable angle of approximately 43°. In addition, if a processing step in which exposure is performed on the entire surface again before baking is performed and after exposing to light and developing for patterning, it is possible to make the angle smaller.

Subsequently, a light-emitting laminated body 142 is formed to cover the first electrode (anode) 199 exposed from the partition wall 141. The light-emitting laminated body 142 may be formed by a vapor deposition method, a spin coating method, an ink-jet method, or the like. Subsequently, a second electrode (cathode) 143 is formed to cover the light-emitting laminated body 142 (FIG. 10B). Accordingly, a light-emitting element including the first electrode (anode) 199, the light-emitting laminated body 142, and the second electrode (cathode) 143 can be manufactured. As a cathode material for forming the second electrode (cathode) 143, it is preferable to use metal, an alloy, an electrically conductive compound, each of which has low work function (work function of 3.8 eV or less), a mixture of these, or the like. Note that as specific examples of the cathode material, the following can be given: an element belonging to group 1 or 2 of the periodic table such as Li or Cs, which are alkali metal, Mg, Ca, or Sr, which are alkali-earth metal; an alloy (Mg:Ag or Al:Li) or a compound (LiF, CsF, or $CaF_2$) containing the above element. In addition, the cathode can also be formed from transition metal containing rare-earth metal. Further, a multilayer formed of the above material and metal (including an alloy) such as Al, Ag, or ITO can be used. In this Embodiment Mode, the cathode is formed from aluminum.

Note that a buffer layer may be formed in the light-emitting element. Refer to Embodiment Mode 1 for the explanation of the buffer layer.

Note that in this Embodiment Mode, the anode is electrically in contact with the conductive film 197 of the driving TFT for the light-emitting element. Alternatively, the cathode may be electrically in contact with the conductive film 197.

Thereafter, a silicon nitride film containing oxygen may be formed as a passivation film by a plasma CVD method. In the case of using the silicon nitride film containing oxygen, a silicon nitride film containing oxygen formed from $SiH_4$, $N_2O$, and $NH_3$, a silicon nitride film containing oxygen formed from $SiH_4$ and $N_2O$, or a silicon nitride film containing oxygen formed from a gas in which $SiH_4$ and $N_2O$ are diluted with Ar may be deposited by a plasma CVD method.

Alternatively, a silicon nitride film containing hydrogen and oxygen formed from $SiH_4$, $N_2O$, and $H_2$ may be used as the passivation film. Naturally, a structure of the passivation film is not limited to a single layer structure. The passivation film may have a single layer structure or a laminated structure of another insulating film containing silicon. In addition, a multilayer film of a carbon nitride film and a silicon nitride film, a multilayer film of styrene polymer, a silicon nitride film, or a diamond like carbon film may be formed as a substitute for a silicon nitride film containing oxygen.

The passivation film can suppress the entrance of elements which promote deterioration of a light-emitting element from the top surface of the light-emitting element; thus the reliability is improved.

Subsequently, in order to protect the light-emitting element from a deterioration-promoting material such as water, the display portion is sealed (FIG. 10C). In the case of using an opposite substrate 145 for sealing, the opposite substrate is attached by an insulating sealing material 144. In this Embodiment Mode, since the planarizing film 190 remains under the conductive film 193 to be the wiring, it is preferable that the sealing material 144 is provided so as not to be overlapped with the conductive film 193 in a lead portion. By thus providing the sealing material, penetration of water through the sealing material 144 and the planarizing film 190 under the conductive film 193 can be effectively prevented.

The space between the opposite substrate 145 and the element substrate may be filled with inert gas such as dry nitrogen; alternatively, the sealing material may be applied to the entire surface of a pixel portion for attaching the opposite substrate 145. It is preferable to use an ultraviolet curable resin or the like as the sealing material 144. A drying agent or particles for keeping the gap between the substrates uniform may be mixed into the sealing material 144.

A light-emitting device thus manufactured has few defects caused by unevenness under a light-emitting element. Further, water does not penetrate from external atmosphere through a planarizing film; therefore, the light-emitting device has high reliability.

Further, the method for manufacturing a display device of the invention is applied to a light-emitting device including a thin film transistor of another shape; the example is shown in FIG. 21D. The difference between FIG. 21D and FIG. 10C is the structures of the gate insulating films and shapes of the gate electrodes. In FIG. 21D, a gate insulating film is formed of two layers: a first gate insulating film 400 and a second gate insulating film 401. In addition, a gate electrode 402 has a single layer structure having a tapered shape in its edge portion. The first gate insulating film 400 is preferably formed of a silicon oxide-based film having a high insulating property and few trap levels since it is in contact with a semiconductor layer. In addition, forming the second gate insulating film 401 with a silicon nitride-based film can make the operation stable even if the gate electrode 402 is formed from a material that is comparatively easy to be oxidized such as Mo. In addition, a sealing material 144 is overlapped with an interlayer insulating film 129.

Furthermore, an example of a liquid crystal display device manufactured with the method for manufacturing a display device of the invention is shown in FIG. 22D. After the liquid crystal display device is manufactured up to the state shown in FIG. 9E, a spacer 301 is obtained by forming an insulating film and patterning it. Thereafter, an alignment film 302 is formed over the entire surface of the exposed portion, and then rubbing treatment is performed.

Subsequently, a sealing material 144 is formed by a droplet discharge method or the like, and then liquid crystal 300 is dropped and sealed in by an opposite substrate 306. A method for sealing in liquid crystal is described below. A pattern of the sealing material 144 is made a closed pattern, and liquid crystal may be dropped by a liquid crystal dropping apparatus. Alternatively, an opening is formed in the pattern of the sealing material 144, and the opposite substrate 306 is attached; thereafter, a dip method (pumping up method) using a capillary phenomenon may be employed. In addition, the sealing material 144 is overlapped with an interlayer insulating film 129.

The opposite substrate 306 is provided with an opposite electrode 304 and an alignment film 303 in this order from the opposite substrate 306 side in advance.

The spacer 301 is formed by patterning the insulating film in FIG. 22A; however, a spherical spacer prepared separately may be dispersed over the alignment film 302 in order to control a cell gap.

As described above, a liquid crystal display device can be completed by applying the method for manufacturing a display device of the invention.

Embodiment Mode 5

A method for manufacturing a display device of the present invention, which is different from those of Embodiment Modes 1 to 4, will be described with reference to FIGS. 11 and 12. The processing steps are halfway the same as those of Embodiment Mode 1; thus, the description and diagrams are omitted. Refer to Embodiment Mode 1. FIG. 11A corresponds to FIG. 3A.

After manufacturing up to the state shown in FIG. 11A, a second interlayer insulating film 200 is formed to cover a planarizing film 137 and an exposed portion of a conductive film 136. As a material for forming the second interlayer insulating film 200, an inorganic insulating film such as silicon oxide, silicon nitride, or a Low-k material may be used. In this Embodiment Mode, a silicon oxide film is formed as the second interlayer insulating film.

Next, a contact hole reaching to the conductive film 136 is opened in the second interlayer insulating film 200. The contact hole can be formed by etching with the use of a mask 201 of resist or the like until a source electrode or the conductive film 136 is exposed. Either wet etching or dry etching can be employed.

After forming the contact hole, the planarizing film 137 is removed by etching with the use of the mask 201 as a mask without removing the mask 201 of resist or the like (FIG. 11C).

Subsequently, a conductive film having a light transmitting property is formed to cover the exposed portion of the conductive film 136, and then a first electrode (anode) 203 of a thin film light-emitting element is formed by processing the conductive film having a light transmitting property with the use of a mask 202 of resist or the like by etching (FIG. 11D). Here, the first electrode (anode) 203 is electrically in contact with the conductive film 136 of the driving TFT for the light-emitting element. As a material of the first electrode (anode) 203, metal, an alloy, an electrically conductive compound each of which has high work function (work function of 4.0 eV or more), a mixture of these, or the like is preferably used. For example, ITO (indium tin oxide), ITO containing silicon (ITSO), IZO (indium zinc oxide) in which zinc oxide (ZnO) is mixed by 2 to 20 atomic % into indium oxide, zinc oxide, GZO (gallium zinc oxide) in which gallium is mixed into zinc oxide, gold (Au), platinum (Pt), nickel (Ni), tungsten (W), chromium (Cr), molybdenum (Mo), iron (Fe), cobalt (Co), copper (Cu), palladium (Pd), or metal nitride (TiN) can be used. In this Embodiment Mode, ITSO is used as the first electrode (anode) 203.

By removing the planarizing film 137 in this processing step, the planarizing film 137 corresponding to the first electrode (anode) 203 remains; thus, planarization is realized under the first electrode (anode) 203, which is a portion in which the light-emitting element is formed; on the other hand, the planarizing film 137 around the substrate 100 is removed. Therefore, the planarizing film is not exposed outside a sealant forming region, and the planarizing film 137 is not exposed to external atmosphere. Consequently, penetration of water into the inside of a panel through the planarizing film 137 is prevented, and it is possible to decrease deterioration of the light-emitting element due to water. In addition, the planarizing film 137 remains under the first electrode (anode) 203; thus, planarization is realized, and a defect caused by unevenness under the light-emitting element can be decreased. Note that it is desirable that unevenness of the first electrode of the light-emitting element is 30 nm or less in a P-V value of one pixel, preferably 15 nm or less, more preferably 10 nm or less. When the unevenness of the first electrode belongs to the above range in the P-V value of one pixel, an increasing type defect can be greatly decreased.

Note that in this processing step of removing the planarizing film 137, a new special mask is not required; the mask 201 of resist or the like used in forming the contact hole in the second interlayer insulating film 200 is used. Therefore, it is unnecessary to further increase a processing step such as photolithography, and planarization of the anode is realized without increasing processing steps considerably.

A light-emitting device manufactured with the thus formed element substrate in which the first electrode (anode) 203 is used as a first electrode of a light-emitting element has few defects caused by unevenness under the light-emitting element. Further, since water does not penetrate from external atmosphere through a planarizing film, the reliability is high. Hereinafter, an example of a manufacturing method of a light-emitting element and a display device using the first electrode (anode) 203 fabricated by following this Embodiment Mode is shown. Needless to say, the manufacturing method of a light-emitting element and a display device is not limited to this.

An insulating film is formed of an organic or inorganic material to cover the second interlayer insulating film 200 and the first electrode (anode) 203. Subsequently, the insulating film is processed to expose part of the first electrode (anode) 203, thereby forming a partition wall 141 (FIG. 12A). As a material of the partition wall 141, a photosensitive organic material (acrylic, polyimide, or the like) is preferably used; however, a non-photosensitive organic material or an inorganic material may also be used. Further, the partition wall 141 may be used as a black matrix by making the partition wall 141 black in such a way that a black pigment or dye such as titanium black or carbon nitride is diffused into the material of the partition wall 141 with the use of a diffuse material or the like. It is desirable that the partition wall 141 has a tapered shape in its end surface toward the first electrode (anode) 203 with its curvature changing continuously.

Note that it is desirable that an angle formed by the end surface of the partition wall 141 toward the first electrode 203 side and the first electrode 203 is approximately 45±5°. Photosensitive polyimide is used as the material of the partition wall 141 in order to obtain such a shape; specifically, the film thickness is approximately 1.0 µm, the temperature of baking performed after exposing to light and developing for patterning is approximately 300° C., thereby obtaining a preferable angle of approximately 43°. In addition, if a processing step in which exposure is performed on the entire surface again before baking is performed and after exposing to light and developing for patterning is added, it is possible to make the angle smaller.

Subsequently, a light-emitting laminated body 142 is formed to cover the first electrode (anode) 203 exposed from the partition wall 141. The light-emitting laminated body 142 may be formed by a vapor deposition method, a spin coating method, an ink-jet method, or the like. Subsequently, a second electrode (cathode) 143 is formed to cover the light-emitting laminated body 142 (FIG. 12B). Accordingly, a light-emitting element including the first electrode (anode) 203, the light-emitting laminated body 142, and the second electrode (cathode) 143 can be manufactured. As a cathode material for forming the second electrode (cathode) 143, it is preferable to use metal, an alloy, an electrically conductive compound, each of which has low work function (work function of 3.8 eV or less), a mixture of these, or the like. Note that as specific examples of the cathode material, the following can be given: an element belonging to group 1 or 2 of the periodic table such as Li or Cs, which are alkali metal, Mg, Ca, or Sr, which are alkali-earth metal; an alloy (Mg:Ag or Al:Li) or a compound (LiF, CsF, or $CaF_2$) containing the above element. In addition, the cathode can also be formed from transition metal containing rare-earth metal. Further, a multilayer formed of the above material and metal (including an alloy) such as Al, Ag, or ITO can be used. In this Embodiment Mode, the cathode is formed from aluminum.

Note that a buffer layer may be formed in the light-emitting element. Refer to Embodiment Mode 1 for the explanation of the buffer layer.

Note that in this Embodiment Mode, the anode is electrically in contact with the conductive film 136 of the driving TFT for the light-emitting element. Alternatively, the cathode may be electrically in contact with the conductive film 136.

Thereafter, a silicon nitride film containing oxygen may be formed as a passivation film by a plasma CVD method. In the case of using the silicon nitride film containing oxygen, a silicon nitride film containing oxygen formed from $SiH_4$, $N_2O$, and $NH_3$, a silicon nitride film containing oxygen formed from $SiH_4$ and $N_2O$, or a silicon nitride film containing oxygen formed from a gas in which $SiH_4$ and $N_2O$ are diluted with Ar may be deposited by a plasma CVD method.

Alternatively, a silicon nitride film containing hydrogen and oxygen formed from $SiH_4$, $N_2O$, and $H_2$ may be used as the passivation film. Naturally, a structure of the passivation film is not limited to a single layer structure. The passivation film may have a single layer structure or a laminated structure of another insulating film containing silicon. In addition, a multilayer film of a carbon nitride film and a silicon nitride film, a multilayer film of styrene polymer, a silicon nitride film, or a diamond like carbon film may be formed as a substitute for a silicon nitride film containing oxygen.

The passivation film can suppress the entrance of elements which promote deterioration of a light-emitting element from the top surface of the light-emitting element; thus the reliability is improved.

Subsequently, in order to protect the light-emitting element from a deterioration-promoting material such as water, the display portion is sealed (FIG. 12C). In the case of using an opposite substrate 145 for sealing, the opposite substrate is attached by an insulating sealing material 144. The space between the opposite substrate 145 and the element substrate may be filled with inert gas such as dry nitrogen; alternatively, the sealing material may be applied to the entire surface of the pixel portion for attaching the opposite substrate 145. It is preferable to use an ultraviolet curable resin or the like as the sealing material 144. A drying agent or particles for keeping the gap between the substrates uniform may be mixed into the sealing material 144.

A light-emitting device thus manufactured has few defects caused by unevenness under a light-emitting element. Further, a planarizing film is not in contact with external atmosphere, and water does not penetrate through the planarizing film; therefore, the light-emitting device has high reliability.

Embodiment Mode 6

Figure 13:
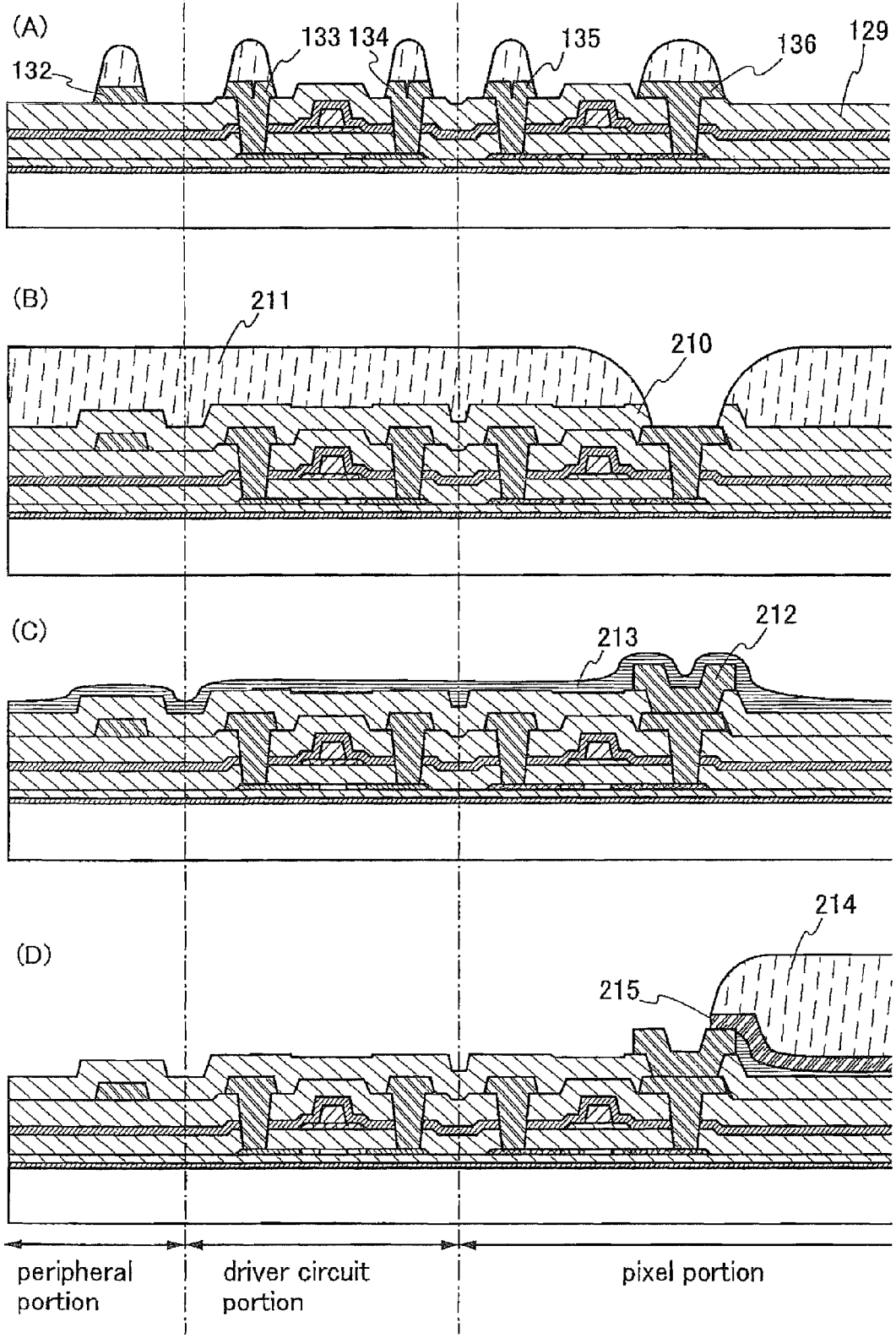
FIGS. 13A-13D Diagrams showing a method for manufacturing a display device of the invention (Embodiment Mode 6).
Figure 14:
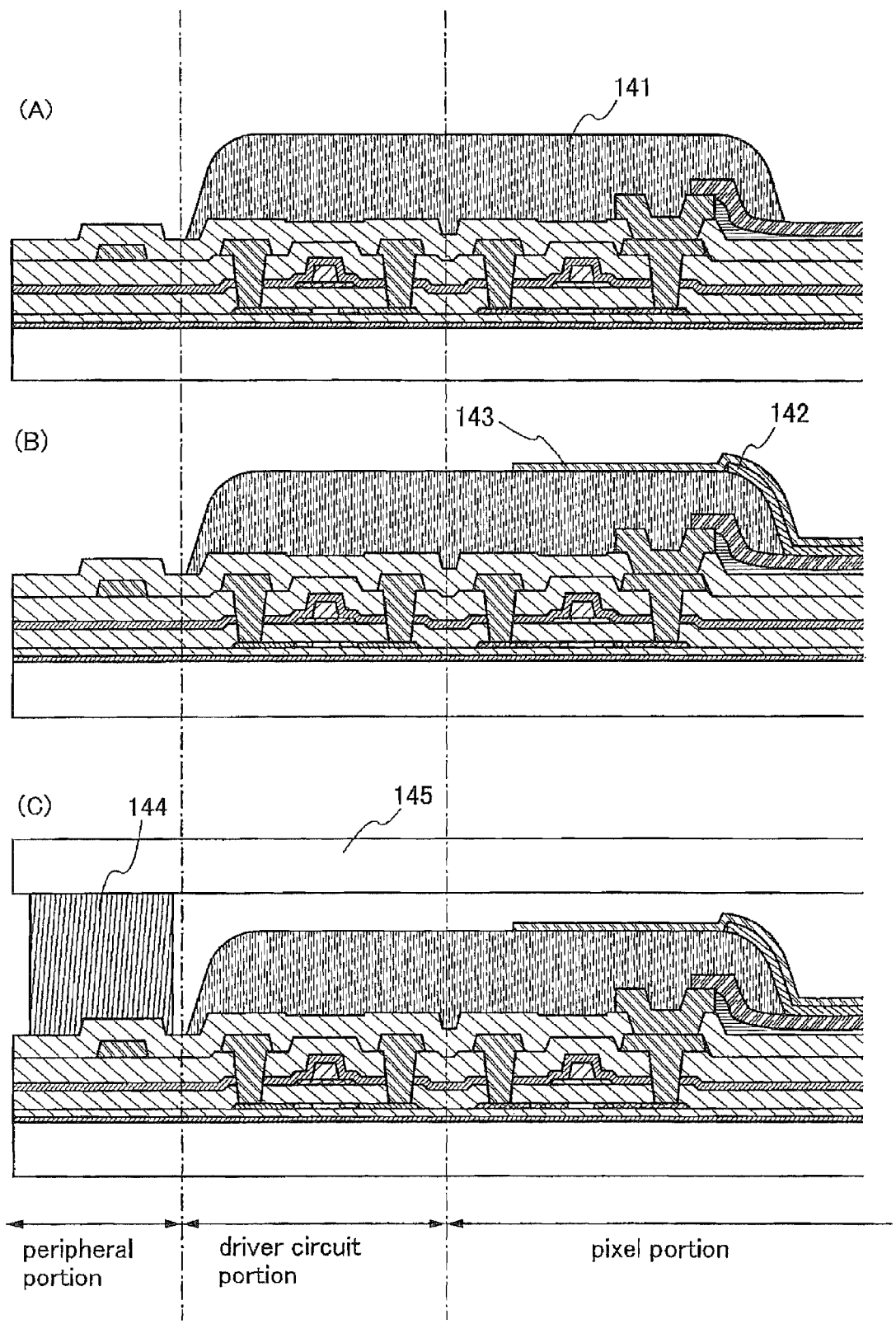
FIGS. 14A-14C Diagrams showing a method for manufacturing a display device of the invention (Embodiment Mode 6).

A method for manufacturing a display device of the present invention, which is different from those of Embodiment Modes 1 to 5, will be described with reference to FIGS. 13 and 14. The processing steps are halfway the same as those of Embodiment Mode 1; thus, the description and diagrams are omitted. Refer to Embodiment Mode 1. FIG. 13A corresponds to FIG. 2D.

After manufacturing up to the state shown in FIG. 13A, a second interlayer insulating film 210 is formed to cover conductive films 132 to 136 and an interlayer insulating film 129 after removing a mask 131. As a material for forming the second interlayer insulating film 210, an inorganic insulating film such as silicon oxide, silicon nitride, or a Low-k material may be used. In this Embodiment Mode, a silicon oxide film is formed as the second interlayer insulating film 210.

Next, a contact hole reaching to the conductive film 136 is opened in the second interlayer insulating film 210 (FIG. 13B). The contact hole can be formed by etching with the use of a mask 211 of resist or the like until the conductive film 136 is exposed. Either wet etching or dry etching can be employed.

Next, the mask 211 is removed, and then a conductive film is formed to cover the contact hole and the second interlayer insulating film 210. The conductive film is processed into a predetermined shape using a mask of resist or the like in order to form a wiring 212 electrically connected to the conductive film 136. A single metal such as aluminum or copper, a metal alloy typified by an aluminum alloy such as an alloy of aluminum, carbon and titanium, an alloy of aluminum, carbon and nickel, or an alloy of aluminum, carbon and titanium, a compound, or the like may be used for forming this conductive film. The conductive film may be formed of a single layer; however, in this Embodiment Mode, this conductive film is a laminated structure of molybdenum, aluminum and molybdenum in this order of manufacture. In addition, a laminated structure formed of titanium, aluminum and titanium; titanium, titanium nitride, aluminum and titanium; titanium and an aluminum alloy, or the like may be employed.

Subsequently, a planarizing film 213 is formed to cover the second interlayer insulating film 210 and the wiring 212 (FIG. 13C). As a material of the planarizing film 213, an application film with a self-planarizing property that can relieve unevenness formed in the lower layer by forming the film, for example, acrylic, polyimide, or siloxane is preferably used. That is, a material that can form a film having unevenness smaller than that formed in the lower layer can be publicly employed. In addition, a film of which unevenness is relieved by reflowing or polishing the film once formed may be used. In this Embodiment Mode, the planarizing film 213 is formed from siloxane. This insulating film having a self-planarizing property such as siloxane is applied; thus, it is possible to relieve unevenness due to a reflection of ridges of semiconductor layers 103 and 104, a slight unevenness of the interlayer insulating film, and unevenness of the lower layer generated such as in forming the conductive films 132 to 136 and the wiring 212, and to perform planarization.

Subsequently, a conductive film having a light transmitting property is formed to cover at least part of the wiring 212, and then a first electrode (anode) 215 of a thin film light-emitting element is formed by processing the conductive film having a light transmitting property with the use of a mask 214 of resist or the like. Here, the first electrode (anode) 215 is electrically in contact with the conductive film 136 of the driving TFT for the light-emitting element through the wiring 212. As a material of the first electrode (anode) 215, metal, an alloy, an electrically conductive compound each of which has high work function (work function of 4.0 eV or more), a mixture of these, or the like is preferably used. For example, ITO (indium tin oxide), ITO containing silicon (ITSO), IZO (indium zinc oxide) in which zinc oxide (ZnO) is mixed by 2 to 20 atomic % into indium oxide, zinc oxide, GZO (gallium zinc oxide) in which gallium is mixed into zinc oxide, gold (Au), platinum (Pt), nickel (Ni), tungsten (W), chromium (Cr), molybdenum (Mo), iron (Fe), cobalt (Co), copper (Cu), palladium (Pd), or metal nitride (TiN) can be used. In this Embodiment Mode, ITSO is used as the first electrode (anode) 215.

After forming the first electrode (anode) 215, the planarizing film 213 is removed by etching with the use of the first electrode (anode) 215 and the mask 214 as masks without removing the mask 214 of resist or the like (FIG. 13D). By removing the planarizing film 213 in this processing step, the planarizing film 213 corresponding to the first electrode (anode) 215 remains; thus, planarization is realized under the first electrode (anode) 215, which is a portion in which the light-emitting element is formed; on the other hand, the planarizing film 213 corresponding to the other portion is removed. Therefore, the planarizing film is not exposed outside a sealant forming region, and the planarizing film 213 is not exposed to external atmosphere. Consequently, penetration of water into the inside of a panel through the planarizing film 213 is prevented, and it is possible to decrease deterioration of the light-emitting element due to water.

In addition, the planarizing film 213 remains under the first electrode (anode) 215 of the light-emitting element; thus, planarization is realized, and a defect caused by unevenness under the light-emitting element can be decreased. Note that it is desirable that unevenness of the first electrode of the light-emitting element is 30 nm or less in a P-V value of one pixel, preferably 15 nm or less, more preferably 10 nm or less. When the unevenness of the first electrode belongs to the above range in the P-V value of one pixel, an increasing type defect can be greatly decreased.

In this processing step, a new special mask is not required; the first electrode (anode) 215 and the mask 214 of resist or the like used in manufacturing the anode are used. Therefore, it is unnecessary to further increase a processing step such as photolithography, and planarization of the anode is realized without increasing processing steps considerably.

A light-emitting device manufactured with the thus formed element substrate in which the first electrode (anode) 215 is used as a first electrode of a light-emitting element has few defects caused by unevenness under the light-emitting element. Further, since water hardly penetrates from external atmosphere through a planarizing film, the reliability is high. Hereinafter, an example of a manufacturing method of a light-emitting element and a display device using the first electrode (anode) 215 fabricated by following this Embodiment Mode is shown. Needless to say, the manufacturing method of a light-emitting element and a display device is not limited to this.

An insulating film is formed of an organic or inorganic material to cover the second interlayer insulating film 210 and the first electrode (anode) 215. Subsequently, the insulating film is processed to expose part of the first electrode (anode) 215, thereby forming a partition wall 141 (FIG. 14A). As a material of the partition wall 141, a photosensitive organic material (acrylic, polyimide, or the like) is preferably used; however, a non-photosensitive organic material or an inorganic material may also be used. Further, the partition wall 141 may be used as a black matrix by making the partition wall 141 black in such a way that a black pigment or dye such as titanium black or carbon nitride is diffused into the material of the partition wall 141 with the use of a diffuse material or the like. It is desirable that the partition wall 141 has a tapered shape in its end surface toward the first electrode (anode) 215 with its curvature changing continuously.

Note that it is desirable that an angle formed by the end surface of the partition wall 141 toward the first electrode 215 side and the first electrode 215 is approximately 45±5°. Photosensitive polyimide is used as the material of the partition wall 141 in order to obtain such a shape; specifically, the film thickness is approximately 1.0 μm, the temperature of baking performed after exposing to light and developing for patterning is approximately 300° C., thereby obtaining a preferable angle of approximately 43°. In addition, if a processing step in which exposure is performed on the entire surface again before baking is performed and after exposing to light and developing for patterning is added, it is possible to make the angle smaller.

Subsequently, a light-emitting laminated body 142 is formed to cover the first electrode (anode) 215 exposed from the partition wall 141. The light-emitting laminated body 142 may be formed by a vapor deposition method, a spin coating method, an ink-jet method, or the like. Subsequently, a second electrode (cathode) 143 is formed to cover the light-emitting laminated body 142 (FIG. 14B). Accordingly, a light-emitting element including the first electrode (anode) 215, the light-emitting laminated body 142, and the second electrode (cathode) 143 can be manufactured. As a cathode material for forming the second electrode (cathode) 143, it is preferable to use metal, an alloy, an electrically conductive compound, each of which has low work function (work function of 3.8 eV or less), a mixture of these, or the like. Note that as specific examples of the cathode material, the following can be given: an element belonging to group 1 or 2 of the periodic table such as Li or Cs, which are alkali metal, Mg, Ca, or Sr, which are alkali-earth metal; an alloy (Mg:Ag or Al:Li) or a compound (LiF, CsF, or CaF$_2$) containing the above element. In addition, the cathode can also be formed from transition metal containing rare-earth metal. Further, a multilayer formed of the above material and metal (including an alloy) such as Al, Ag, or ITO can be used. In this Embodiment Mode, the cathode is formed from aluminum.

Note that a buffer layer may be formed in the light-emitting element. Refer to Embodiment Mode 1 for the explanation of the buffer layer.

Note that in this Embodiment Mode, the anode of the light-emitting element is electrically in contact with the conductive film 136 of the driving TFT for the light-emitting element. Alternatively, the cathode may be electrically in contact with the conductive film 136.

Thereafter, a silicon nitride film containing oxygen may be formed as a passivation film by a plasma CVD method. In the case of using the silicon nitride film containing oxygen, a silicon nitride film containing oxygen formed from SiH$_4$, N$_2$O, and NH$_3$, a silicon nitride film containing oxygen formed from SiH$_4$ and N$_2$O, or a silicon nitride film containing oxygen formed from a gas in which SiH$_4$ and N$_2$O are diluted with Ar may be deposited by a plasma CVD method.

Alternatively, a silicon nitride film containing hydrogen and oxygen formed from SiH$_4$, N$_2$O, and H$_2$ may be used as the passivation film. Naturally, a structure of the passivation film is not limited to a single layer structure. The passivation film may have a single layer structure or a laminated structure of another insulating film containing silicon. In addition, a multilayer film of a carbon nitride film and a silicon nitride film, a multilayer film of styrene polymer, a silicon nitride film, or a diamond like carbon film may be formed as a substitute for a silicon nitride film containing oxygen.

The passivation film can suppress the entrance of elements which promote deterioration of a light-emitting element from the top surface of the light-emitting element; thus the reliability is improved.

Subsequently, in order to protect the light-emitting element from a deterioration-promoting material such as water, the display portion is sealed (FIG. 14C). In the case of using an opposite substrate 145 for sealing, the opposite substrate is attached by an insulating sealing material 144. The space between the opposite substrate 145 and the element substrate may be filled with inert gas such as dry nitrogen; alternatively, the sealing material may be applied to the entire surface of the pixel portion for attaching the opposite substrate 145. It is preferable to use an ultraviolet curable resin or the like as the sealing material 144. A drying agent or particles for keeping the gap between the substrates uniform may be mixed into the sealing material 144.

A light-emitting device thus manufactured has few defects caused by unevenness under a light-emitting element. Further, a planarizing film is not in contact with external atmosphere, and water does not penetrate through the planarizing film; therefore, the light-emitting device has high reliability.

Embodiment Mode 7

Figure 15:
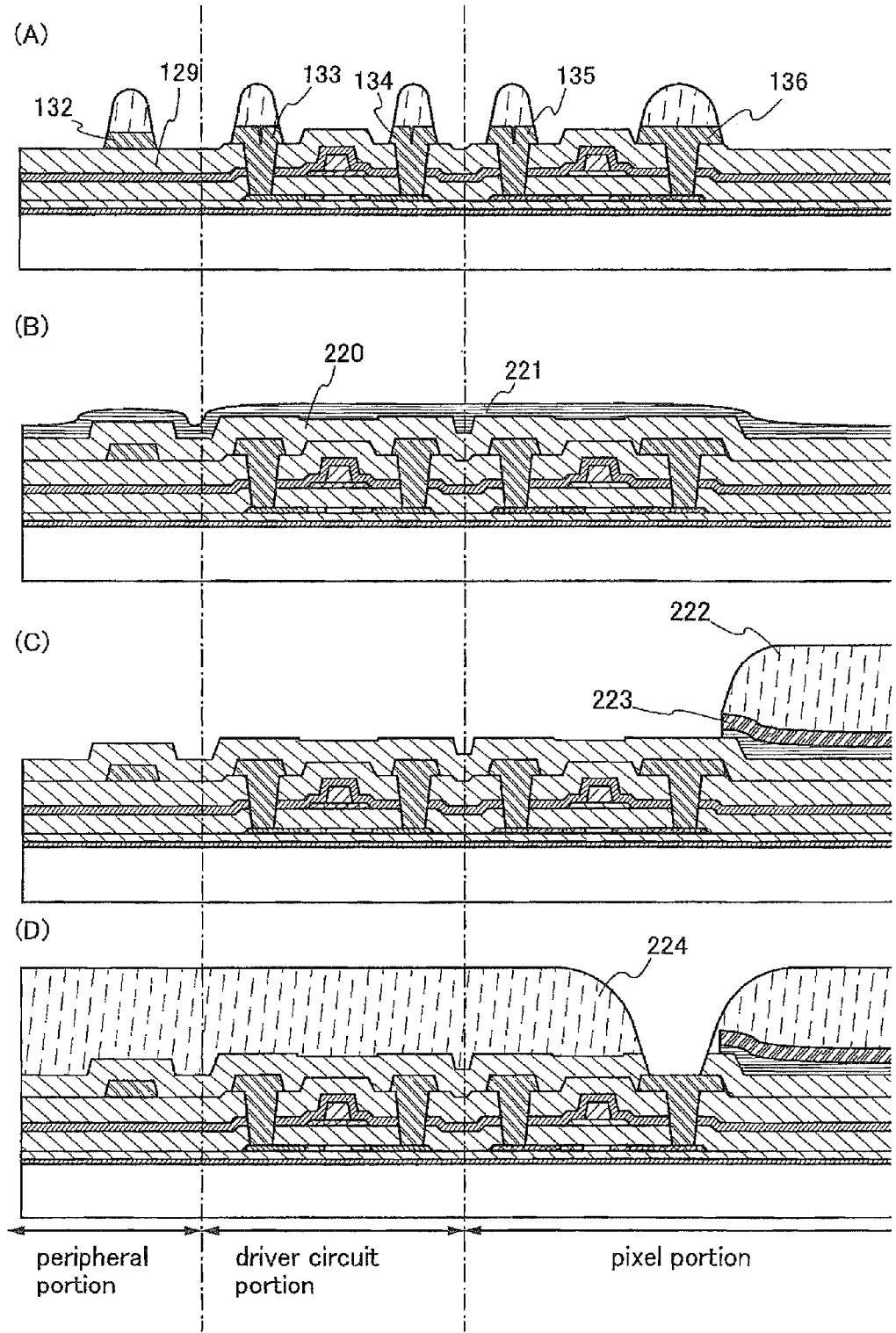
FIGS. 15A-15D Diagrams showing a method for manufacturing a display device of the invention (Embodiment Mode 7).

A method for manufacturing a display device of the present invention, which is different from those of Embodiment Modes 1 to 6, will be described with reference to FIGS. 15 and 16. The processing steps are halfway the same as those of Embodiment Mode 1; thus, the description and diagrams are omitted. Refer to Embodiment Mode 1. FIG. 15A corresponds to FIG. 2D.

After manufacturing up to the state shown in FIG. 15A, a second interlayer insulating film 220 is formed to cover an interlayer insulating film 129 and conductive films 132 to 136. As a material for forming the second interlayer insulating film 220, an inorganic insulating film such as silicon oxide, silicon nitride, or a Low-k material may be used. In this Embodiment Mode, a silicon oxide film is formed as the second interlayer insulating film 220.

Subsequently, a planarizing film 221 is formed to cover the second interlayer insulating film 220 (FIG. 15B). As a material of the planarizing film 221, an application film with a self-planarizing property that can relieve unevenness formed in the lower layer by forming the film, for example, acrylic, polyimide, or siloxane is preferably used. That is, a material that can form a film having unevenness smaller than that formed in the lower layer can be publicly employed. In addition, a film of which unevenness is relieved by reflowing or polishing the film once formed may be used. In this Embodiment Mode, the planarizing film 221 is formed from polyimide. This insulating film having a self-planarizing property such as polyimide is applied; thus, it is possible to relieve unevenness due to a reflection of ridges of semiconductor layers 103 and 104, a slight unevenness of the interlayer insulating film, and unevenness of the lower layer generated such as in forming the conductive films 132 to 136, and to perform planarization.

Subsequently, a conductive film having a light transmitting property is formed to cover the planarizing film 221, and then a first electrode (anode) 223 of a thin film light-emitting element is formed by processing the conductive film having a light transmitting property with the use of a mask 222 of resist or the like. As a material of the first electrode (anode) 223, metal, an alloy, an electrically conductive compound each of which has high work function (work function of 4.0 eV or more), a mixture of these, or the like is preferably used. For example, ITO (indium tin oxide), ITO containing silicon (ITSO), IZO (indium zinc oxide) in which zinc oxide (ZnO) is mixed by 2 to 20 atomic % into indium oxide, zinc oxide, GZO (gallium zinc oxide) in which gallium is mixed into zinc oxide, gold (Au), platinum (Pt), nickel (Ni), tungsten (W), chromium (Cr), molybdenum (Mo), iron (Fe), cobalt (Co), copper (Cu), palladium (Pd), or metal nitride (TiN) can be used. In this Embodiment Mode, ITSO is used as the first electrode (anode) 223.

After forming the first electrode (anode) 223, the planarizing film 221 is removed by etching with the use of the first electrode (anode) 223 and the mask 222 as masks without removing the mask 222 of resist or the like (FIG. 15C). By removing the planarizing film 221 in this processing step, the planarizing film 221 corresponding to the first electrode (anode) 223 remains; thus, planarization is realized under the first electrode (anode) 223, which is a portion in which the light-emitting element is formed; on the other hand, the planarizing film 221 corresponding to the other portion is removed. Therefore, the planarizing film is not exposed outside a sealant forming region, and the planarizing film 221 is not exposed to external atmosphere. Accordingly, penetration of water into the inside of a panel through the planarizing film 221 is much decreased, and it is possible to decrease deterioration of the light-emitting element due to water.

In addition, the planarizing film 221 remains under the first electrode (anode) 223 of the light-emitting element; thus, planarization is realized, and a defect caused by unevenness under the light-emitting element can be decreased. Note that it is desirable that unevenness of the first electrode of the light-emitting element is 30 nm or less in a P-V value of one pixel, preferably 15 nm or less, more preferably 10 nm or less. When the unevenness of the first electrode belongs to the above range in the P-V value of one pixel, an increasing type defect can be greatly decreased.

In this processing step, a new special mask is not required; the first electrode (anode) 223 and the mask 222 of resist or the like used in manufacturing the anode are used. Therefore, it is unnecessary to further increase a processing step such as photolithography, and planarization of the anode is realized without increasing processing steps considerably.

Next, a contact hole reaching to the conductive film 136 is opened in the second interlayer insulating film 220 (FIG. 15D). The contact hole can be formed by etching with the use of a mask 224 of resist or the like until the conductive film 136 is exposed. Either wet etching or dry etching can be employed.

Subsequently, the mask 224 is removed, and then a conductive film is formed to cover the contact hole and the second interlayer insulating film 220. The conductive film is processed into a predetermined shape using a mask of resist or the like in order to form such as a wiring 225 formed of the conductive film electrically connected to the conductive film 136 and the first electrode (anode) 223 (FIG. 16A). A single metal such as aluminum or copper, a metal alloy typified by an aluminum alloy such as an alloy of aluminum, carbon and titanium, an alloy of aluminum, carbon and nickel, or an alloy of aluminum, carbon and titanium, a compound, or the like may be used for forming this conductive film. The conductive film may be formed of a single layer; however, in this Embodiment Mode, this conductive film is a laminated structure of molybdenum, aluminum and molybdenum in this order from the bottom. In addition, a laminated structure formed of titanium, aluminum and titanium; titanium, titanium nitride, aluminum and titanium; titanium and an aluminum alloy, or the like may be employed.

A light-emitting device manufactured with the thus formed element substrate in which the first electrode (anode) 223 is used as a first electrode of a light-emitting element has few defects caused by unevenness under the light-emitting element. Further, since water does not penetrate from external atmosphere through a planarizing film, the reliability is high. Hereinafter, an example of a manufacturing method of a light-emitting element and a display device using the first electrode (anode) 223 fabricated by following this Embodiment Mode is shown. Needless to say, the manufacturing method of a light-emitting element and a display device is not limited to this.

An insulating film is formed of an organic or inorganic material to cover the second interlayer insulating film 220 and the first electrode (anode) 223. Subsequently, the insulating film is processed to expose part of the first electrode (anode) 223, thereby forming a partition wall 141 (FIG. 16B). As a material of the partition wall 141, a photosensitive organic material (acrylic, polyimide, or the like) is preferably used; however, a non-photosensitive organic material or an inorganic material may also be used. Further, the partition wall 141 may be used as a black matrix by making the partition wall 141 black in such a way that a black pigment or dye such as titanium black or carbon nitride is diffused into the material of the partition wall 141 with the use of a diffuse material or the like. It is desirable that the partition wall 141 has a tapered shape in its end surface toward the first electrode (anode) 223 with its curvature changing continuously.

Note that it is desirable that an angle formed by the end surface of the partition wall 141 toward the first electrode 223 side and the first electrode 223 is approximately 45±5°. Photosensitive polyimide is used as the material of the partition wall 141; specifically, the film thickness is approximately 1.0 μm, the temperature of baking performed after exposing to light and developing for patterning is approximately 300° C., thereby obtaining a preferable angle of approximately 43°. In addition, if a processing step in which exposure is performed on the entire surface again before baking is performed and after exposing to light and developing for patterning is added, it is possible to make the angle smaller.

Subsequently, a light-emitting laminated body 142 is formed to cover the first electrode (anode) 223 exposed from the partition wall 141. The light-emitting laminated body 142 may be formed by a vapor deposition method, a spin coating method, an ink-jet method, or the like. Subsequently, a second electrode (cathode) 143 is formed to cover the light-emitting laminated body 142 (FIG. 16C). Accordingly, a light-emitting element including the first electrode (anode) 223, the light-emitting laminated body 142, and the second electrode (cathode) 143 can be manufactured. As a cathode material for forming the second electrode (cathode) 143, it is preferable to use metal, an alloy, an electrically conductive compound, each of which has low work function (work function of 3.8 eV or less), a mixture of these, or the like. Note that as specific examples of the cathode material, the following can be given: an element belonging to group 1 or 2 of the periodic table such as Li or Cs, which are alkali metal, Mg, Ca, or Sr, which are alkali-earth metal; an alloy (Mg:Ag or Al:Li) or a compound (LiF, CsF, or $CaF_2$) containing the above element. In addition, the cathode can also be formed from transition metal containing rare-earth metal. Further, a multilayer formed of the above material and metal (including an alloy) such as Al, Ag, or ITO can be used. In this Embodiment Mode, the cathode is formed from aluminum.

Note that a buffer layer may be formed in the light-emitting element. Refer to Embodiment Mode 1 for the explanation of the buffer layer.

Note that in this Embodiment Mode, the anode is electrically in contact with the conductive film 136 of the driving TFT for the light-emitting element. Alternatively, the cathode may be electrically in contact with the conductive film 136.

Thereafter, a silicon nitride film containing oxygen may be formed as a passivation film by a plasma CVD method. In the case of using the silicon nitride film containing oxygen, a silicon nitride film containing oxygen formed from $SiH_4$, $N_2O$, and $NH_3$, a silicon nitride film containing oxygen formed from $SiH_4$ and $N_2O$, or a silicon nitride film containing oxygen formed from a gas in which $SiH_4$ and $N_2O$ are diluted with Ar may be deposited by a plasma CVD method.

Alternatively, a silicon oxynitride hydride film formed from $SiH_4$, $N_2O$, and $H_2$ may be used as the passivation film. Naturally, a structure of the passivation film is not limited to a single layer structure. The passivation film may have a single layer structure or a laminated structure of another insulating film containing silicon. In addition, a multilayer film of a carbon nitride film and a silicon nitride film, a multilayer film of styrene polymer, a silicon nitride film, or a diamond like carbon film may be formed as a substitute for a silicon nitride film containing oxygen.

The passivation film can suppress the entrance of elements which promote deterioration of a light-emitting element from the top surface of the light-emitting element; thus the reliability is improved.

Subsequently, in order to protect the light-emitting element from a deterioration-promoting material such as water, the display portion is sealed (FIG. 16D). In the case of using an opposite substrate 145 for sealing, the opposite substrate is attached by an insulating sealing material 144. The space between the opposite substrate 145 and the element substrate may be filled with inert gas such as dry nitrogen; alternatively, the sealing material may be applied to the entire surface of the pixel portion for attaching the opposite substrate 145. It is preferable to use an ultraviolet curable resin or the like as the sealing material 144. A drying agent or particles for keeping the gap between the substrates uniform may be mixed into the sealing material 144.

A light-emitting device thus manufactured has few defects caused by unevenness under a light-emitting element. Further, a planarizing film is not in contact with external atmosphere, and water does not penetrate through the planarizing film; therefore, the light-emitting device has high reliability.

Embodiment Mode 8

A method for manufacturing a display device of the present invention, which is different from those of Embodiment Modes 1 to 7, will be described with reference to FIGS. 17 and 18. The processing steps are halfway the same as those of Embodiment Mode 7; thus, the description and diagrams are omitted. Refer to Embodiment Mode 7. FIG. 17A corresponds to FIG. 15B.

After manufacturing up to the state shown in FIG. 15A, a planarizing film 230 is formed to cover a second interlayer insulating film 220. As a material of the planarizing film 230, an application film with a self-planarizing property that can relieve unevenness formed in the lower layer by forming the film, for example, acrylic, polyimide, or siloxane is preferably used. That is, a material that can form a film having unevenness smaller than that formed in the lower layer can be publicly employed. In addition, a film of which unevenness is relieved by reflowing or polishing the film once formed may be used. In this Embodiment Mode, the planarizing film 230 is formed from polyimide. This insulating film having a self-planarizing property such as polyimide is applied; thus, it is possible to relieve unevenness due to a reflection of ridges of semiconductor layers 103 and 104, a slight unevenness of the interlayer insulating film, and unevenness of the lower layer generated such as in forming conductive films 132 to 136 to be a wiring and source or drain electrodes, and to perform planarization.

Subsequently, a conductive film having a light transmitting property is formed to cover the planarizing film 230, and then a first electrode (anode) 232 of a thin film light-emitting element is formed by processing the conductive film having a light transmitting property with the use of a mask 231 of resist or the like (FIG. 17B). As a material of the first electrode (anode) 232, metal, an alloy, an electrically conductive compound each of which has high work function (work function of 4.0 eV or more), a mixture of these, or the like is preferably used. For example, ITO (indium tin oxide), ITO containing silicon (ITSO), IZO (indium zinc oxide) in which zinc oxide (ZnO) is mixed by 2 to 20 atomic % into indium oxide, zinc oxide, GZO (gallium zinc oxide) in which gallium is mixed into zinc oxide, gold (Au), platinum (Pt), nickel (Ni), tungsten (W), chromium (Cr), molybdenum (Mo), iron (Fe), cobalt (Co), copper (Cu), palladium (Pd), or metal nitride (TiN) can be used. In this Embodiment Mode, ITSO is used as the first electrode (anode) 232.

Next, a contact hole reaching to the conductive film 136 is opened in the planarizing film 230 and the second interlayer insulating film 220 (FIG. 17C). The contact hole can be formed by etching with the use of a mask 233 of resist or the like until the conductive film 136 is exposed. Either wet etching or dry etching can be employed.

Subsequently, the mask 233 is removed, and then a conductive film is formed to cover the contact hole and the second interlayer insulating film 220. The conductive film is processed into a predetermined shape using a mask of resist or the like in order to form such as a wiring 234 electrically connected to the conductive film 136 and the first electrode (anode) 232 (FIG. 17C). A single metal such as aluminum or copper, a metal alloy typified by an aluminum alloy such as an alloy of aluminum, carbon and titanium, an alloy of aluminum, carbon and nickel, or an alloy of aluminum, carbon and titanium, a compound, or the like may be used for forming this conductive film. The conductive film may be formed of a single layer; however, in this Embodiment Mode, this conductive film is a laminated structure of molybdenum, aluminum and molybdenum in this order from the bottom. In addition, a laminated structure formed of titanium, aluminum and titanium; titanium, titanium nitride, aluminum and titanium; titanium and an aluminum alloy, or the like may be employed.

After forming the wiring 234, the planarizing film 230 is removed by etching with the use of the wiring 234 and the mask of resist or the like as masks without removing the mask of resist or the like (FIG. 17D). By removing the planarizing film 230 in this processing step, the planarizing film 230 corresponding to the first electrode (anode) 232 remains; thus, planarization is realized under the first electrode (anode) 232, which is a portion in which the light-emitting element is formed; on the other hand, the planarizing film 230 corresponding to the other portion is removed. Therefore, the planarizing film is not exposed outside a sealant forming region, and the planarizing film 230 is not exposed to external atmosphere. Accordingly, penetration of water into the inside of a panel through the planarizing film 230 is much decreased, and it is possible to decrease deterioration of the light-emitting element due to water. In addition, the planarizing film 230 remains under the first electrode (anode) 232 of the light-emitting element; thus, planarization is realized, and a defect caused by unevenness under the light-emitting element can be decreased. Note that it is desirable that unevenness of the first electrode of the light-emitting element is 30 nm or less in a P-V value of one pixel, preferably 15 nm or less, more preferably 10 nm or less. When the unevenness of the first electrode belongs to the above range in the P-V value of one pixel, an increasing type defect can be greatly decreased.

In this processing step, a new special mask is not required; the wiring 234 and the mask of resist or the like used in manufacturing the anode are used. Therefore, it is unnecessary to further increase a processing step such as photolithography, and planarization of the anode is realized without increasing processing steps considerably.

A light-emitting device manufactured with the thus formed element substrate in which the first electrode (anode) 232 is used as a first electrode of a light-emitting element has few defects caused by unevenness under the light-emitting element. Further, since water does not penetrate from external atmosphere through a planarizing film, the light-emitting device has high reliability. Hereinafter, an example of a manufacturing method of a light-emitting element and a display device using the first electrode (anode) 232 fabricated by following this Embodiment Mode is shown. Needless to say, the manufacturing method of a light-emitting element and a display device is not limited to this.

An insulating film is formed of an organic or inorganic material to cover the second interlayer insulating film 220 and the first electrode (anode) 232. Subsequently, the insulating film is processed to expose part of the first electrode (anode) 232, thereby forming a partition wall 141 (FIG. 18A). As a material of the partition wall 141, a photosensitive organic material (acrylic, polyimide, or the like) is preferably used; however, a non-photosensitive organic material or an inorganic material may also be used. Further, the partition wall 141 may be used as a black matrix by making the partition wall 141 black in such a way that a black pigment or dye such as titanium black or carbon nitride is diffused into the material of the partition wall 141 with the use of a diffuse material or the like. It is desirable that the partition wall 141 has a tapered shape in its end surface toward the first electrode (anode) 232 with its curvature changing continuously.

Note that it is desirable that an angle formed by the end surface of the partition wall 141 toward the first electrode 232 side and the first electrode 232 is approximately 45±5°. Photosensitive polyimide is used as the material of the partition wall 141 in order to obtain such a shape; specifically, the film thickness is approximately 1.0 μm, the temperature of baking performed after exposing to light and developing for patterning is approximately 300° C., thereby obtaining a preferable angle of approximately 43°. In addition, if a processing step in which exposure is performed on the entire surface again before baking is performed and after exposing to light and developing for patterning is added, it is possible to make the angle smaller.

Subsequently, a light-emitting laminated body 142 is formed to cover the first electrode (anode) 232 exposed from the partition wall 141. The light-emitting laminated body 142 may be formed by a vapor deposition method, a spin coating method, an ink-jet method, or the like. Subsequently, a second electrode (cathode) 143 is formed to cover the light-emitting laminated body 142 (FIG. 18B). Accordingly, a light-emitting element including the first electrode (anode) 232, the light-emitting laminated body 142, and the second electrode (cathode) 143 can be manufactured. As a cathode material for forming the second electrode (cathode) 143, it is preferable to use metal, an alloy, an electrically conductive compound, each of which has low work function (work function of 3.8 eV or less), a mixture of these, or the like. Note that as specific examples of the cathode material, the following can be given: an element belonging to group 1 or 2 of the periodic table such as Li or Cs, which are alkali metal, Mg, Ca, or Sr, which are alkali-earth metal; an alloy (Mg:Ag or Al:Li) or a compound (LiF, CsF, or $CaF_2$) containing the above element. In addition, the cathode can also be formed from transition metal containing rare-earth metal. Further, a multilayer formed of the above material and metal (including an alloy) such as Al, Ag, or ITO can be used. In this Embodiment Mode, the cathode is formed from aluminum.

Note that a buffer layer may be formed in the light-emitting element. Refer to Embodiment Mode 1 for the explanation of the buffer layer.

Note that in this Embodiment Mode, the anode is electrically in contact with the conductive film 136 of the driving TFT for the light-emitting element. Alternatively, the cathode may be electrically in contact with the conductive film 136.

Thereafter, a silicon nitride film containing oxygen may be formed as a passivation film by a plasma CVD method. In the case of using the silicon nitride film containing oxygen, a silicon nitride film containing oxygen formed from $SiH_4$, $N_2O$, and $NH_3$, a silicon nitride film containing oxygen formed from $SiH_4$ and $N_2O$, or a silicon nitride film containing oxygen formed from a gas in which $SiH_4$ and $N_2O$ are diluted with Ar may be deposited by a plasma CVD method.

Alternatively, a silicon nitride film containing hydrogen and oxygen formed from $SiH_4$, $N_2O$, and $H_2$ may be used as the passivation film. Naturally, a structure of the passivation film is not limited to a single layer structure. The passivation film may have a single layer structure or a laminated structure of another insulating film containing silicon. In addition, a multilayer film of a carbon nitride film and a silicon nitride film, a multilayer film of styrene polymer, a silicon nitride film, or a diamond like carbon film may be formed as a substitute for a silicon nitride film containing oxygen.

The passivation film can suppress the entrance of elements which promote deterioration of a light-emitting element from the top surface of the light-emitting element; thus the reliability is improved.

Subsequently, in order to protect the light-emitting element from a deterioration-promoting material such as water, the display portion is sealed (FIG. 18C). In the case of using an opposite substrate 145 for sealing, the opposite substrate is attached by an insulating sealing material 144. The space between the opposite substrate 145 and the element substrate may be filled with inert gas such as dry nitrogen; alternatively, the sealing material may be applied to the entire surface of the pixel portion for attaching the opposite substrate 145. It is preferable to use an ultraviolet curable resin or the like as the sealing material 144. A drying agent or particles for keeping the gap between the substrates uniform may be mixed into the sealing material 144.

A light-emitting device thus manufactured has few defects caused by unevenness under a light-emitting element. Further, a planarizing film is not in contact with external atmosphere, and water does not penetrate through the planarizing film; therefore, the light-emitting device has high reliability.

Embodiment Mode 9

Figure 19:
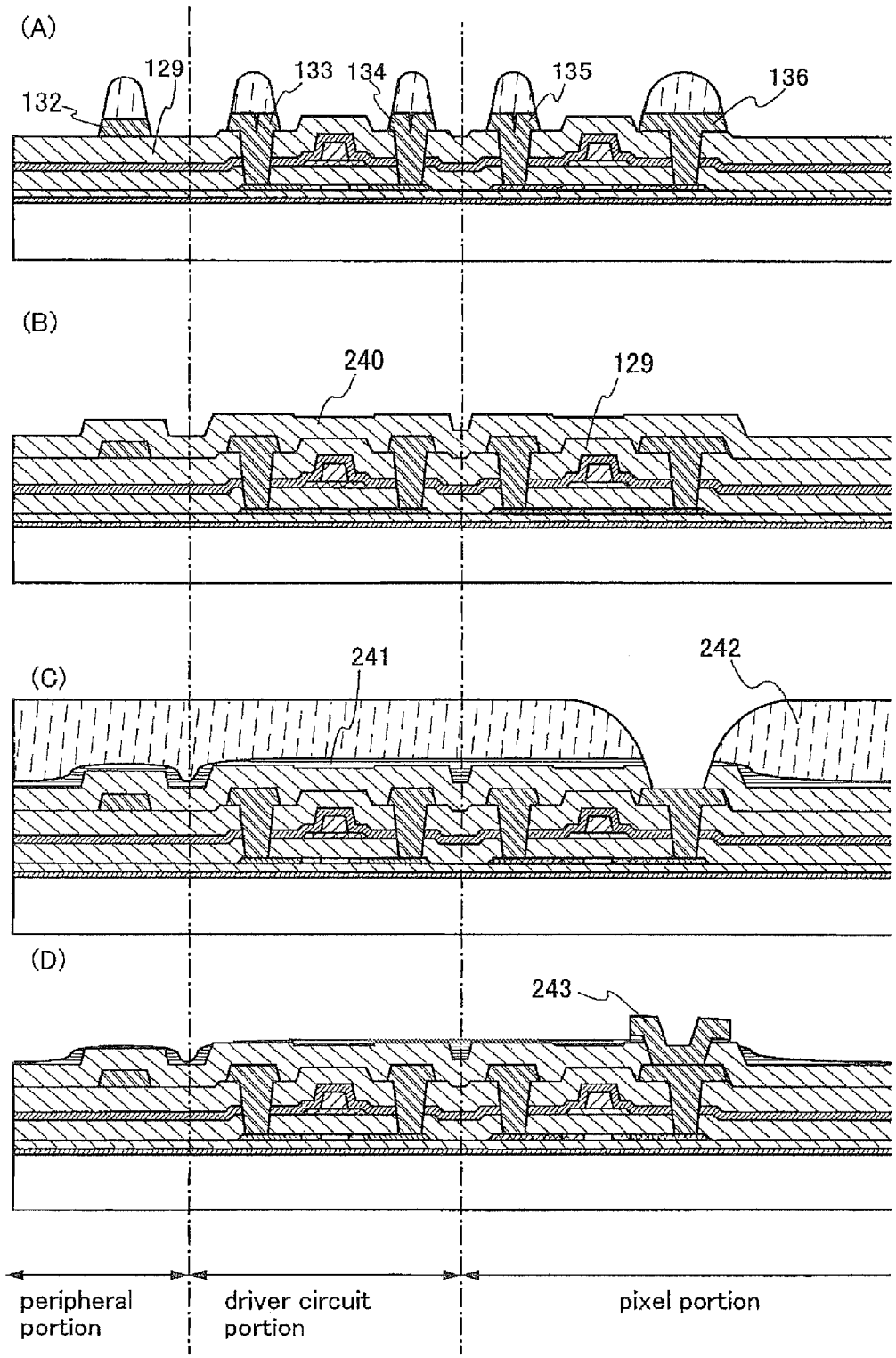
FIGS. 19A-19D Diagrams showing a method for manufacturing a display device of the invention (Embodiment Mode 9).
Figure 20:
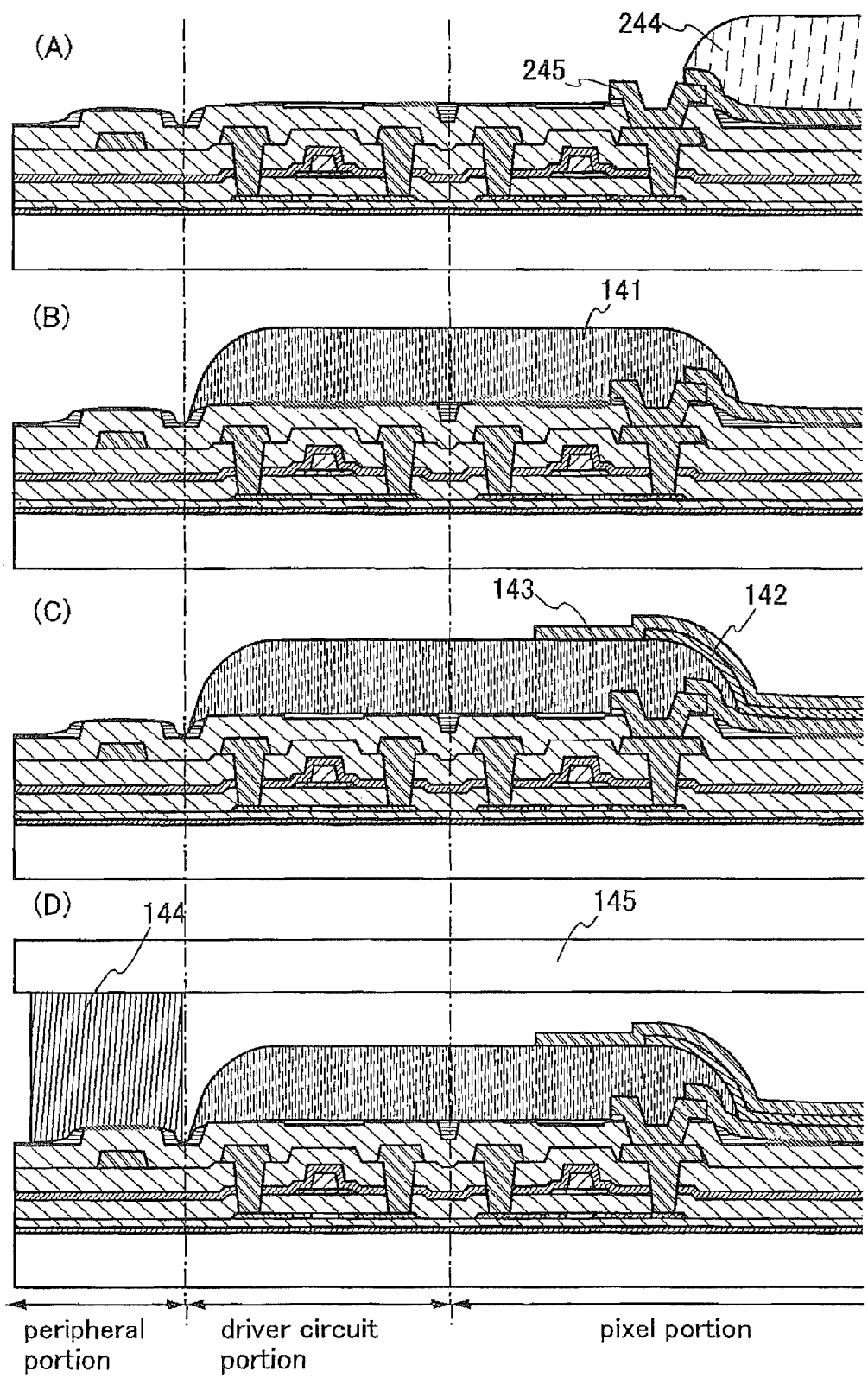
FIGS. 20A-20D Diagrams showing a method for manufacturing a display device of the invention (Embodiment Mode 9).

A method for manufacturing a display device of the present invention, which is different from those of Embodiment Modes 1 to 8, will be described with reference to FIGS. 19 and 20. The processing steps are halfway the same as those of Embodiment Mode 1; thus, the description and diagrams are omitted. Refer to Embodiment Mode 1. FIG. 19A corresponds to FIG. 2D.

After manufacturing up to the state shown in FIG. 19A, a mask 131 is removed, and then a second interlayer insulating film 240 is formed to cover an interlayer insulating film 129 and conductive films 132 to 136. As a material for forming the second interlayer insulating film 240, an inorganic insulating film such as silicon oxide, silicon nitride, or a Low-k material may be used. In this Embodiment Mode, a silicon oxide film is formed as the second interlayer insulating film 240 (FIG. 19B).

Subsequently, an extremely thin planarizing film 241 is formed to cover the second interlayer insulating film 240. As a material of the planarizing film 241, an application film with a self-planarizing property that can relieve unevenness formed in the lower layer by forming the film, for example, acrylic, polyimide, or siloxane is preferably used. That is, a material that can form a film having unevenness smaller than that formed in the lower layer can be publicly employed. In addition, a film of which unevenness is relieved by reflowing or polishing the film once formed may be used. In this Embodiment Mode, the planarizing film 241 is formed from acrylic. This insulating film having a self-planarizing property such as acrylic is applied; thus, it is possible to relieve unevenness due to a reflection of ridges of semiconductor layers 103 and 104, a slight unevenness of the interlayer insulating film, and unevenness of the lower layer generated such as in forming the conductive films 132 to 136, and to perform planarization.

Next, a contact hole reaching to the conductive film 136 is opened in the planarizing film 241 and the second interlayer insulating film 240 (FIG. 19C). The contact hole can be formed by etching with the use of a mask 242 of resist or the like until the conductive film 136 is exposed. Either wet etching or dry etching can be employed.

Subsequently, the mask 242 is removed, and then a conductive film is formed to cover the contact hole and the planarizing film 241. The conductive film is processed into a predetermined shape using a mask of resist or the like in order to form a wiring 243 electrically connected to the conductive film 136 (FIG. 19D). A single metal such as aluminum or copper, a metal alloy typified by an aluminum alloy such as an alloy of aluminum, carbon and titanium, an alloy of aluminum, carbon and nickel, or an alloy of aluminum, carbon and titanium, a compound, or the like may be used for forming this conductive film. The conductive film may be formed of a single layer; however, in this Embodiment Mode, this conductive film is a laminated structure of molybdenum, aluminum and molybdenum in this order of manufacture. In addition, a laminated structure formed of titanium, aluminum and titanium; titanium, titanium nitride, aluminum and titanium; titanium and an aluminum alloy, or the like may be employed.

Subsequently, a conductive film having a light transmitting property is formed to cover the planarizing film 241 and the wiring 243, and then a first electrode (anode) 245 of a thin film light-emitting element is formed by processing the conductive film having a light transmitting property with the use of a mask 244 of resist or the like (FIG. 20A). As a material of the first electrode (anode) 245, metal, an alloy, an electrically conductive compound each of which has high work function (work function of 4.0 eV or more), a mixture of these, or the like is preferably used. For example, ITO (indium tin oxide), ITO containing silicon (ITSO), IZO (indium zinc oxide) in which zinc oxide (ZnO) is mixed by 2 to 20 atomic % into indium oxide, zinc oxide, GZO (gallium zinc oxide) in which gallium is mixed into zinc oxide, gold (Au), platinum (Pt), nickel (Ni), tungsten (W), chromium (Cr), molybdenum (Mo), iron (Fe), cobalt (Co), copper (Cu), palladium (Pd), or metal nitride (TiN) can be used. In this Embodiment Mode, ITSO is used as the first electrode (anode) 245.

A light-emitting device manufactured with the thus formed element substrate in which the first electrode (anode) 245 is used as a first electrode of a light-emitting element has few defects caused by unevenness under the light-emitting element. Further, since water hardly penetrates from external atmosphere through a planarizing film due to the extremely thin planarizing film 241, the reliability is high. Hereinafter, an example of a manufacturing method of a light-emitting element and a display device using the first electrode (anode) 245 fabricated by following this Embodiment Mode is shown. Needless to say, the manufacturing method of a light-emitting element and a display device is not limited to this. Note that it is desirable that unevenness of the first electrode of the light-emitting element is 30 nm or less in a P-V value of one pixel, preferably 15 nm or less, more preferably 10 nm or less. When the unevenness of the first electrode is 30 nm or less in a P-V value of one pixel, preferably 15 nm or less, more preferably 10 nm or less, an increasing type defect can be greatly decreased.

Subsequently, an insulating film is formed of an organic or inorganic material to cover the planarizing film 241 and the first electrode (anode) 245. Subsequently, the insulating film is processed to expose part of the first electrode (anode) 245, thereby forming a partition wall 141 (FIG. 20B). As a material of the partition wall 141, a photosensitive organic material (acrylic, polyimide, or the like) is preferably used; however, a non-photosensitive organic material or an inorganic material may also be used. Further, the partition wall 141 may be used as a black matrix by making the partition wall 141 black in such a way that a black pigment or dye such as titanium black or carbon nitride is diffused into the material of the partition wall 141 with the use of a diffuse material or the like. It is desirable that the partition wall 141 has a tapered shape in its end surface toward the first electrode 245 with its curvature changing continuously.

Note that it is desirable that an angle formed by the end surface of the partition wall 141 toward the first electrode 245 side and the first electrode 245 is approximately 45±5°. Photosensitive polyimide is used as the material of the partition wall 141 in order to obtain such a shape; specifically, the film thickness is approximately 1.0 μm, the temperature of baking performed after exposing to light and developing for patterning is approximately 300° C., thereby obtaining a preferable angle of approximately 43°. In addition, if a processing step in which exposure is performed on the entire surface again before baking is performed and after exposing to light and developing for patterning is added, it is possible to make the angle smaller.

Subsequently, a light-emitting laminated body 142 is formed to cover the first electrode (anode) 245 exposed from the partition wall 141. The light-emitting laminated body 142 may be formed by a vapor deposition method, a spin coating method, an ink-jet method, or the like. Subsequently, a second electrode (cathode) 143 is formed to cover the light-emitting laminated body 142 (FIG. 20C). Accordingly, a light-emitting element including the first electrode (anode) 245, the light-emitting laminated body 142, and the second electrode (cathode) 143 can be manufactured. As a cathode material for forming the second electrode (cathode) 143, it is preferable to use metal, an alloy, an electrically conductive compound, each of which has low work function (work function of 3.8 eV or less), a mixture of these, or the like. Note that as specific examples of the cathode material, the following can be given: an element belonging to group 1 or 2 of the periodic table such as Li or Cs, which are alkali metal, Mg, Ca, or Sr, which are alkali-earth metal; an alloy (Mg:Ag or Al:Li) or a compound (LiF, CsF, or $CaF_2$) containing the above element. In addition, the cathode can also be formed from transition metal containing rare-earth metal. Further, a multilayer formed of the above material and metal (including an alloy) such as Al, Ag, or ITO can be used. In this Embodiment Mode, the cathode is formed from aluminum.

Note that a buffer layer may be formed in the light-emitting element. Refer to Embodiment Mode 1 for the explanation of the buffer layer.

Note that in this Embodiment Mode, the anode is electrically in contact with the conductive film 136. Alternatively, the cathode may be electrically in contact with the conductive film 136.

Thereafter, a silicon nitride film containing oxygen may be formed as a passivation film by a plasma CVD method. In the case of using the silicon nitride film containing oxygen, a silicon nitride film containing oxygen formed from $SiH_4$, $N_2O$, and $NH_3$, a silicon nitride film containing oxygen formed from $SiH_4$ and $N_2O$, or a silicon nitride film containing oxygen formed from a gas in which $SiH_4$ and $N_2O$ are diluted with Ar may be deposited by a plasma CVD method.

Alternatively, a silicon nitride film containing hydrogen and oxygen formed from $SiH_4$, $N_2O$, and $H_2$ may be used as the passivation film. Naturally, a structure of the passivation film is not limited to a single layer structure. The passivation film may have a single layer structure or a laminated structure of another insulating film containing silicon. In addition, a multilayer film of a carbon nitride film and a silicon nitride film, a multilayer film of styrene polymer, a silicon nitride film, or a diamond like carbon film may be formed as a substitute for a silicon nitride film containing oxygen.

The passivation film can suppress the entrance of elements which promote deterioration of a light-emitting element from the top surface of the light-emitting element; thus the reliability is improved.

Subsequently, in order to protect the light-emitting element from a deterioration-promoting material such as water, the display portion is sealed (FIG. 20D). In the case of using an opposite substrate 145 for sealing, the opposite substrate is attached by an insulating sealing material 144. The space between the opposite substrate 145 and the element substrate may be filled with inert gas such as dry nitrogen; alternatively, the sealing material may be applied to the entire surface of the pixel portion for attaching the opposite substrate 145. It is preferable to use an ultraviolet curable resin or the like as the sealing material 144. A drying agent or particles for keeping the gap between the substrates uniform may be mixed into the sealing material 144.

A light-emitting device thus manufactured has few defects caused by unevenness under a light-emitting element. Further, a planarizing film is not in contact with external atmosphere, and water does not penetrate through the planarizing film; therefore, the light-emitting device has high reliability.

Embodiment Mode 10

In this Embodiment Mode, an appearance of a panel of a light-emitting device manufactured in accordance with any one of Embodiment Modes 1 to 4 will be described with reference to FIG. 24. FIG. 24A is a top view of a panel in which a transistor and a light-emitting element formed over a substrate are sealed with a sealing material formed between the substrate and an opposite substrate 4006. FIG. 24B corresponds to a cross-sectional view of FIG. 24A.

A sealing material 4005 is provided to surround a pixel portion 4002, a signal line driver circuit 4003, and a scanning line driver circuit 4004 which are provided over a substrate 4001. The opposite substrate 4006 is provided over the pixel portion 4002, the signal line driver circuit 4003, and the scanning line driver circuit 4004. Thus, the pixel portion 4002, the signal line driver circuit 4003, and the scanning line driver circuit 4004 are sealed with the substrate 4001, the sealing material 4005, and the opposite substrate 4006.

The pixel portion 4002, the signal line driver circuit 4003, and the scanning line driver circuit 4004 which are provided over the substrate 4001 have a plurality of thin film transistors. A thin film transistor 4008 included in the signal line driver circuit 4003 and a thin film transistor 4010 included in the pixel portion 4002 are shown in FIG. 24B. Note that a planarizing film 4021 is shown under source and drain electrodes of the thin film transistors 4008 and 4010 and a pixel electrode. In this Embodiment Mode, a structure in which a planarizing film is provided under source and drain electrodes and a pixel electrode is shown; however, a planarizing film may be provided following the other structures shown in Embodiment Modes 1 to 9.

Further, a light-emitting element 4011 is electrically connected to the thin film transistor 4010.

A lead wiring 4014 corresponds to a wiring for supplying signals or power voltage by layers to the pixel portion 4002, the signal line driver circuit 4003, and the scanning line driver circuit 4004. In a connection terminal portion 4016, the lead wiring 4014 is electrically connected to a flexible printed circuit (FPC) 4018 through an anisotropic conductive film 4019.

Note that either an analog video signal or a digital video signal may be used for such a light-emitting device having a display function. In the case of using a digital video signal, the video signal can be divided into a video signal using voltage and a video signal using current. A video signal, inputted to a pixel when a light-emitting element emits light, includes a constant voltage video signal and a constant current video signal. The constant voltage video signal includes a signal in which voltage applied to a light-emitting element is constant and a signal in which current applied to a light-emitting element is constant. The constant current video signal includes a signal in which voltage applied to a light-emitting element is constant and a signal in which current applied to a light-emitting element is constant. Drive with signal in which voltage applied to a light-emitting element is constant is constant voltage drive, and that with the signal in which current applied to a light-emitting element is constant is constant current drive. By constant current drive, constant current is applied to a light-emitting element, regardless of a change in resistance of the light-emitting element. For a light-emitting display device of the invention and a driving method thereof, either of the above described driving methods may be used.

Note that a display device of the invention includes, in its category, a panel provided with a pixel portion having a light-emitting element and a module in which an IC is mounted on the panel.

Such a panel and a module of this Embodiment Mode have few defects caused by unevenness under a light-emitting element. Further, since water hardly penetrates from external atmosphere through a planarizing film, the panel and the module also have high reliability.

Embodiment Mode 11

Figure 23:
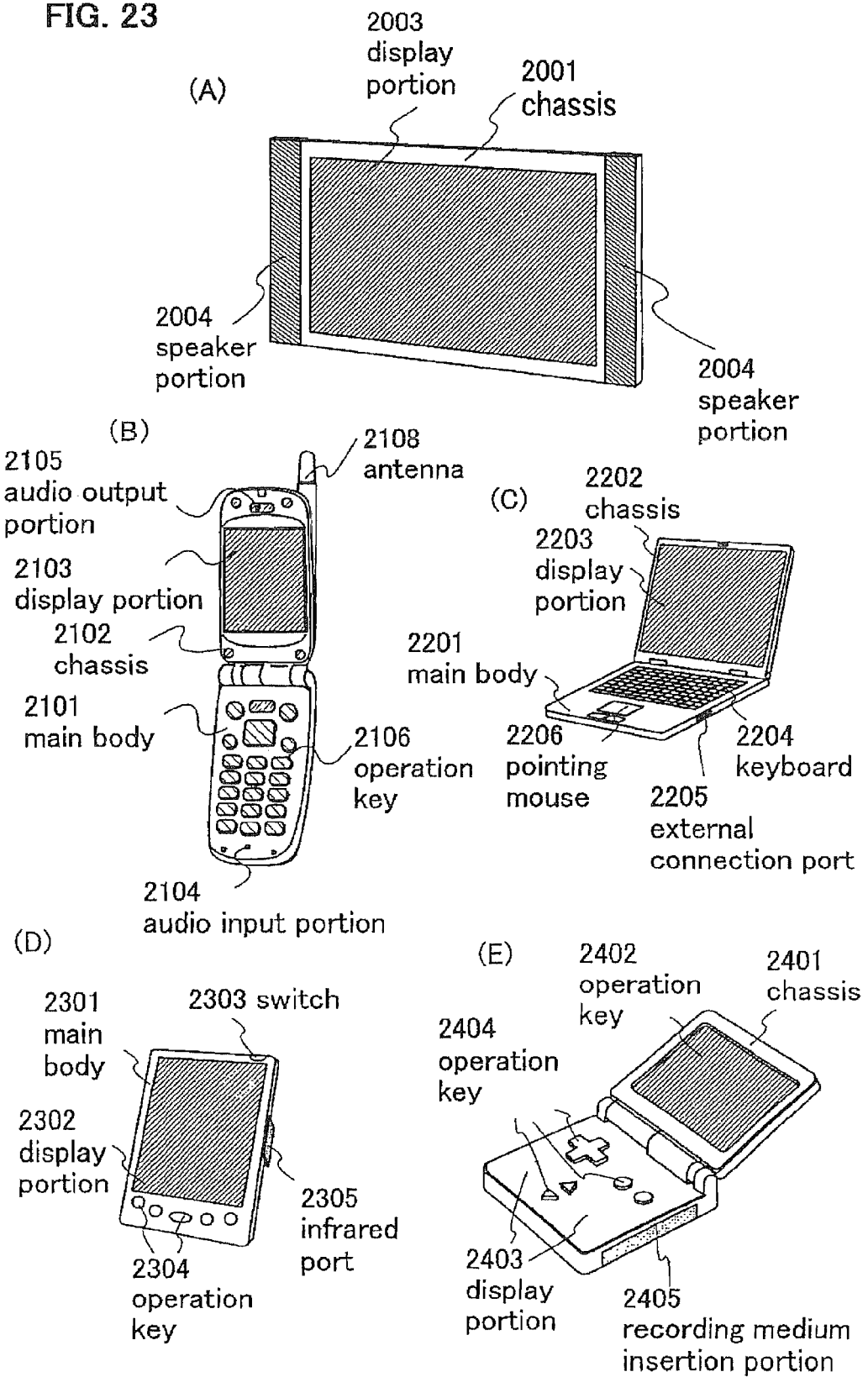
FIGS. 23A-23E Diagrams showing an example of an electronic device mounting a display device manufactured by a method for manufacturing a display device of the invention.

Examples of an electronic device mounted with a module manufactured in accordance with the present invention, one example of which is described in Embodiment Mode 10, can be cited as follows: a video camera, a digital camera, a goggle type display (head mounted display), a navigation system, an sound reproducing device (a car audio component or the like), a computer, a game machine, a portable information terminal (a mobile computer, a cellular phone, a portable game machine, an electronic book, or the like), an image reproducing device including a recording medium (specifically, a device capable of reproducing a recording medium such as a Digital Versatile Disc (DVD) and having a display that can display the image), and the like. Specific examples of these electronic devices are shown in FIG. 23.

FIG. 23A shows a light-emitting display device. A television receiver, a monitor of a personal computer, or the like is regarded as the light-emitting display device. The light-emitting display device includes a chassis 2001, a display portion 2003, a speaker portion 2004, and the like. This invention is applied in manufacturing the display portion 2003, and a display device having few defects caused by unevenness under a light-emitting element can be obtained. Further, since water hardly penetrates from external atmosphere through a planarizing film, the display device has high reliability. A pixel portion is preferably provided with a polarizing plate or a circularly polarizing plate to enhance contrast. For example, a sealing substrate may be provided with a film in this order of a quarter-wave plate, a half-wave plate, and a polarizing plate. Further, an anti-reflective film may be provided over the polarizing plate.

FIG. 23B shows a cellular phone, which includes a main body 2101, a chassis 2102, a display portion 2103, an audio input portion 2104, an audio output portion 2105, an operation key 2106, an antenna 2108, and the like. This invention is applied in manufacturing the display portion 2103, and a cellular phone having few defects caused by unevenness under a light-emitting element can be obtained. Further, since water hardly penetrates from external atmosphere through a planarizing film, the cellular phone has high reliability.

FIG. 23C shows a computer, which includes a main body 2201, a chassis 2202, a display portion 2203, a keyboard 2204, an external connection port 2205, a pointing mouse 2206, and the like. This invention is applied in manufacturing the display portion 2203, and a notebook computer having few defects caused by unevenness under a light-emitting element can be obtained. Further, since water hardly penetrates from external atmosphere through a planarizing film, the notebook computer has high reliability. Although a notebook computer is shown in FIG. 23C as an example, the invention can be applied to a desktop computer in which a hard disk and a display portion are integrated, or the like.

FIG. 23D shows a mobile computer, which includes a main body 2301, a display portion 2302, a switch 2303, operation keys 2304, an infrared port 2305, and the like. This invention is applied in manufacturing the display portion 2302, and a mobile computer having few defects caused by unevenness under a light-emitting element can be obtained. Further, since water hardly penetrates from external atmosphere through a planarizing film, the mobile computer has high reliability.

FIG. 23E shows a portable gaming machine, which includes a chassis 2401, a display portion 2402, a speaker portion 2403, operation keys 2404, a recording medium insertion portion 2405, and the like. This invention is applied in manufacturing the display portion 2402, and a portable gaming machine having few defects caused by unevenness under a light-emitting element can be obtained. Further, since water hardly penetrates from external atmosphere through a planarizing film, the portable gaming machine has high reliability.

As described above, the applicable range of the invention is so wide that the invention can be applied in manufacturing electronic devices of various fields.

Embodiment Mode 12

A structure of the light-emitting laminated body 142 will be described in detail in this Embodiment Mode.

A light-emitting layer may be formed of a charge injection transport material and a light-emitting material which include an organic compound or an inorganic compound. The light-emitting layer includes one or more kinds of layers of a low molecular weight organic compound, an intermediate molecular weight organic compound (referring to an organic compound which does not have a sublimation property and has the number of molecules of 20 or less, or a molecular chain length of 10 μm or less), and a high molecular weight organic compound, which are classified depending on the number of molecules. The light-emitting layer may be combined with an electron injection transport or hole injection transport inorganic compound.

As a particularly highly electron-transporting material among charge injection transport materials, a metal complex that has a quinoline skeleton or a benzoquinoline skeleton such as tris(8-quinolinolato)aluminum (abbreviation: Alq$_3$), tris(5-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)-4-phenylphenolato-aluminum (abbreviation: BAlq), or the like can be given. As a highly hole-transporting material, an aromatic amine-based compound (that is, a compound having a benzene ring-nitrogen bond) such as 4,4'-bis[N-(1-naphthyl)-N-phenyl-amino]-biphenyl (abbreviation: α-NPD), 4,4'-bis[N-

(3-methylphenyl)-N-phenyl-amino]-biphenyl (abbreviation: TPD), 4,4',4"-tris(N,N-diphenyl-amino)-triphenylamine (abbreviation: TDATA), or 4,4',4"-tris[N-(3-methylphenyl)-N-phenyl-amino]-triphenylamine (abbreviation: MTDATA) can be given.

As a particularly highly electron-injecting material among charge injection transport materials, a compound of alkali metal or alkali-earth metal such as lithium fluoride (LiF), cesium fluoride (CsF) or calcium fluoride ($CaF_2$) can be given. In addition, a mixture of a highly electron-transporting material such as $Alq_3$ and alkali-earth metal such as magnesium (Mg) may be employed.

As a highly hole-injecting material among charge injection transport materials, metal oxide such as molybdenum oxide (MoOx), vanadium oxide (VOx), ruthenium oxide (RuOx), tungsten oxide (WOx), or manganese oxide (MnOx) can be given. In addition, phthalocyanine (abbreviation: $H_2Pc$) or a phthalocyanine-based compound such as copper phthalocyanine (CuPc) can be given.

The light-emitting layer may have a structure for performing color display by providing each pixel with a light-emitting layer having a different emission wavelength band. Typically, a light-emitting layer corresponding to each color of R (red), G (green), or B (blue) is formed. Also in this case, color purity can be increased and a pixel portion can be prevented from having a mirror surface (glare) by providing a light-emitting side of a pixel with a filter (colored layer) which transmits light of its emission wavelength band. Providing a filter (colored layer) can omit a circularly polarizing plate or the like which is conventionally required and can eliminate loss of light emitted from a light-emitting layer. Further, a change in hue, which occurs when a pixel portion (display screen) is obliquely seen, can be decreased.

An emission center includes various materials. As a low molecular weight organic light-emitting material, 4-dicyanomethylene-2-methyl-6-(1,1,7,7-tetramethyljulolidyl-9-enyl)-4H-pyran (abbreviation: DCJT), 4-dicyanomethylene-2-t-butyl-6-(1,1,7,7-tetramethyljulolidyl-9-enyl)-4H-pyran (abbreviation: DPA), periflanthene, 2,5-dicyano-1,4-bis(10-methoxy-1,1,7,7-tetramethyljulolidyl-9-enyl)benzene, N,N'-dimethylquinacridone (abbreviation: DMQd), coumarin 6, coumarin 545T, tris(8-quinolinolato)aluminum (abbreviation: $Alq_3$), 9,9'-bianthryl, 9,10-diphenylanthracene (abbreviation: DPA), 9,10-bis(2-naphthyl)anthracene (abbreviation: DNA), or the like can be used. Another material may also be used.

On the other hand, a high molecular weight organic light-emitting material is physically stronger than a low molecular weight material and is superior in durability of an element. In addition, a high molecular weight material can be used for application; therefore, an element is relatively easily manufactured. A structure of a light-emitting element using a high molecular weight organic light-emitting material is basically the same as that of a light-emitting element using a low molecular weight organic light-emitting material: a cathode, an organic light-emitting layer, and an anode are laminated. However, it is difficult to form such a laminated structure as in the case of using a low molecular weight organic light-emitting material, when a light-emitting layer using a high molecular weight organic light-emitting material is formed. Thus, a two-layer structure is employed in many cases. Specifically, a laminated structure of a cathode, a light-emitting layer, a hole-transporting layer, and an anode is employed.

An emission color is determined by a material of a light-emitting layer. Therefore, a light-emitting element that emits desired light can be formed by selecting a material of a light-emitting layer. As a high molecular weight electroluminescent material which can be used to form a light-emitting layer, a polyparaphenylene-vinylene-based material, a polyparaphenylene-based material, a polythiophen-based material, or a polyfluorene-based material can be used.

As a polyparaphenylene-vinylene-based material, a derivative of poly(paraphenylene vinylene) [PPV], poly(2,5-dialkoxy-1,4-phenylene vinylene) [RO-PPV], poly(2-(2'-ethyl-hexoxy)-5-methoxy-1,4-phenylene vinylene) [MEH-PPV], poly(2-(dialkoxyphenyl)-1,4-phenylene vinylene) [ROPh-PPV], or the like can be used. As a polyparaphenylene-based material, a derivative of polyparaphenylene [PPP], poly(2,5-dialkoxy-1,4-phenylene) [RO-PPP], poly(2,5-dihexoxy-1,4-phenylene), or the like can be used. As a polythiophene-based material, a derivative of polythiophene [PT], poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene] [POPT], poly[3-(4-octylphenyl)-2,2 bithiophene] [PTOPT], or the like can be used. As the polyfluorene-based material, a derivative of polyfluorene [PF], poly(9,9-dialkylfluorene) [PDAF], poly(9,9-dioctylfluorene) [PDOF], or the like can be used.

Note that a hole-injecting property from an anode can be enhanced by interposing a high molecular weight organic light-emitting material having a hole-transporting property between an anode and a high molecular weight organic light-emitting material having a light-emitting property. A high molecular weight organic light-emitting material having a hole-transporting property dissolved into water together with an acceptor material is generally applied by a spin coating method, or the like. In addition, since the high molecular weight organic light-emitting material having a hole-transporting property is insoluble in an organic solvent, a laminate with the above described organic light-emitting material having a light-emitting property can be formed. A mixture of PEDOT and camphor sulfonic acid (CSA) that serves as an acceptor material, a mixture of polyaniline [PANI] and polystyrene sulfonic acid [PSS] that serves as an acceptor material, or the like can be used as the high molecular weight organic light-emitting material having a hole-transporting property.

In addition, the light-emitting layer can be formed to emit monochrome or white light. In the case of using a white light-emitting material, a filter (colored layer) which transmits light having a specific wavelength is provided on a light-emitting side of a pixel, thereby performing color display.

In order to form a light-emitting layer which emits white light, for example, $Alq_3$, $Alq_3$ partially doped with Nile red that is a red light-emitting pigment, $Alq_3$, p-EtTAZ, and TPD (aromatic diamine) are sequentially stacked by a vapor deposition method to obtain white light. When a light emitting layer is formed by an application method with spin coating, baking by vacuum heating is preferably performed after application. For example, an aqueous solution of poly(ethylene dioxythiophene)/poly(styrene sulfonic acid) (PEDOT/PSS) that functions as a hole-injecting layer may be entirely applied and baked. Thereafter, a polyvinyl carbazole (PVK) solution, which functions as a light-emitting layer, doped with a light-emitting center pigment (such as 1,1,4,4-tetraphenyl-1,3-butadiene (TPB), 4-dicyanomethylene-2-methyl-6-(p-dimethylamino-styryl)-4H-pyran (DCM1), Nile red, or coumarin 6) may be entirely applied and baked.

The light-emitting layer may be formed to be a single layer. A 1,3,4-oxadiazole derivative (PBD) having an electron-transporting property may be dispersed in polyvinyl carbazole (PVK) having a hole-transporting property. Another method to obtain white light emission is to disperse PBD of 30 wt % as an electron-transporting agent and to disperse four kinds of pigments (TPB, coumarin 6, DCM1, and Nile red) in appropriate amounts. In addition to the light-emitting element described here that provides white light emission, a light-emitting element that provides red light emission, green light emission, or blue light emission can be manufactured by appropriately selecting a material of the light-emitting layer.

Note that a hole-injecting property from an anode can be enhanced by interposing a high molecular weight organic light-emitting material having a hole-transporting property between an anode and a high molecular weight organic light-emitting material having a light-emitting property. A high molecular weight organic light-emitting material having a hole-transporting property dissolved into water together with an acceptor material is generally applied by a spin coating method, or the like. In addition, since the high molecular weight organic light-emitting material having a hole-transporting property is insoluble in an organic solvent, a laminate with the above described organic light-emitting material having a light-emitting property can be formed. A mixture of PEDOT and camphor sulfonic acid (CSA) that serves as an acceptor material, a mixture of polyaniline [PANI] and polystyrene sulfonic acid [PSS] that serves as an acceptor material, or the like can be used as the high molecular weight organic light-emitting material having a hole-transporting property.

Further, a triplet excitation material including a metal complex or the like as well as a singlet excitation light-emitting material may be used for the light-emitting layer. For example, among pixels emitting red, green, and blue light, a pixel emitting red light whose luminance is reduced by half in a relatively short time is made of a triplet excitation light-emitting material and the rest are made of a singlet excitation light-emitting material. A triplet excitation light-emitting material has a characteristic that the material has a good luminous efficiency and consumes less power to obtain the same luminance. When a triplet excitation light-emitting material is used for a red pixel, only a small amount of current needs to be applied to a light-emitting element. Thus, the reliability can be improved. A pixel emitting red light and a pixel emitting green light may be formed of a triplet excitation light-emitting material and a pixel emitting blue light may be formed of a singlet excitation light-emitting material to achieve low power consumption. Low power consumption can be further achieved also by forming a light-emitting element which emits green light that has high human visibility with a triplet excitation light-emitting material.

A material in which a metal complex is used as a dopant is an example of the triplet excitation light-emitting material; a metal complex having platinum that is a third transition series element as a central metal, a metal complex having iridium as a central metal, and the like are known. The triplet excitation light-emitting material is not limited to the above compounds. A compound having the above described structure and having an element belonging to any of groups 8 to 10 of the periodic table as a central metal can also be used.

The above described materials for forming the light-emitting layer are just examples. A light-emitting element can be formed by appropriately stacking each functional layer of a hole injection transport layer, a hole-transporting layer, an electron injection transport layer, an electron-transporting layer, a light-emitting layer, an electron-blocking layer, a hole-blocking layer, or the like. Further, a mixed layer or a mixed junction may be formed by combining these layers. A layer structure of the light-emitting layer can be varied. Instead of providing a specific electron-injecting region or light-emitting region, modification such as simply providing an electrode for this purpose or providing a dispersed light-emitting material is acceptable as long as it does not deviate from the scope of the invention.

A light-emitting element formed with the above described material emits light by being biased in a forward direction. A pixel of a display device formed with a light-emitting element can be driven by a simple matrix mode or an active matrix mode. In either mode, each pixel emits light by applying a forward bias thereto in specific timing; however, the pixel is in a non light-emitting state for a certain period. The reliability of a light-emitting element can be improved by applying a reverse bias at this non light-emitting time. In a light-emitting element, there is a deterioration in which emission intensity is decreased under a specific driving condition or a deterioration mode in which a non light-emitting region is enlarged in a pixel and luminance is apparently decreased. However, progression of deterioration can be slowed down by alternating drive in which a bias is applied both in forward and reverse directions. Thus, the reliability of a light-emitting device can be improved.

Embodiment Mode 13

A pixel circuit and a protective circuit included in the panel and module shown in Embodiment Mode 10, and operations thereof will be described in this Embodiment Mode.

Figure 25:
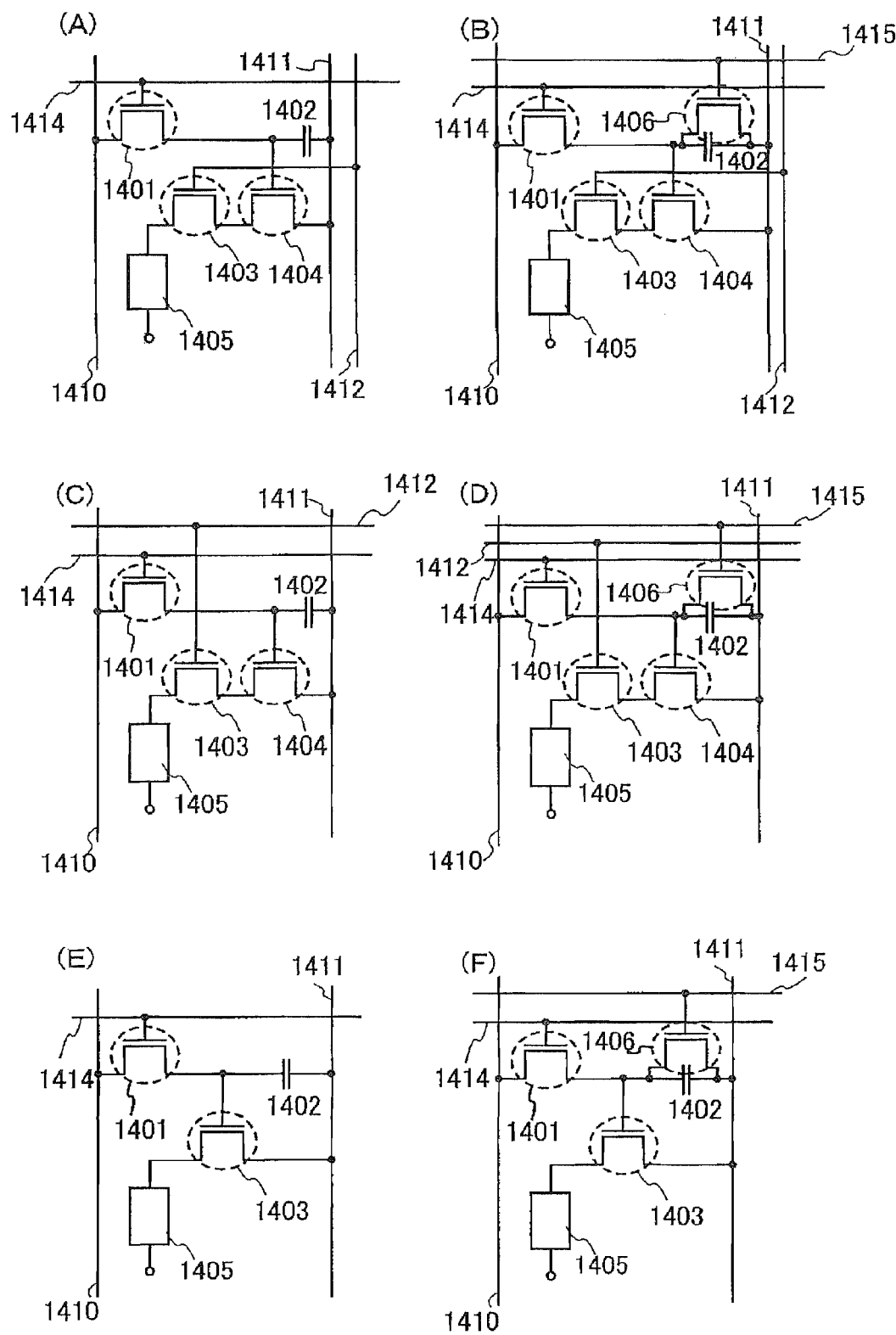
FIGS. 25A-25F Diagrams showing an example of a pixel circuit mounted on a display device.

In a pixel shown in FIG. 25A, a signal line 1410 and power supply lines 1411 and 1412 are arranged in a column direction and a scanning line 1414 is arranged in a row direction. In addition, the pixel includes a switching TFT 1401, a driving TFT 1403, a current control TFT 1404, a capacitor element 1402, and a light-emitting element 1405.

A pixel shown in FIG. 25C is different in a point where a gate electrode of a driving TFT 1403 is connected to a power supply line 1412 arranged in a row direction, but in the other points, the pixel has a similar structure to that of the pixel shown in FIG. 25A. In other words, equivalent circuit diagrams of both of the pixels shown in FIGS. 25A and 25C are the same. However, each power supply line is formed using a conductive film in a different layer when the power supply line 1412 is arranged in a column direction (FIG. 25A) and when the power supply line 1412 is arranged in a row direction (FIG. 25C). Here, a wiring connected to the gate electrode of the driving TFT 1403 is focused and the figures are separately shown in FIGS. 25A and 25C to show that the wirings are formed in different layers.

In the pixels shown in FIGS. 25A and 25C, the driving TFT 1403 and the current control TFT 1404 are connected in series in the pixel. A channel length L(1403) and a channel width W(1403) of the driving TFT 1403 and a channel length L(1404) and a channel width W(1404) of the current control TFT 1404 are preferably set to satisfy L(1403)/W(1403): L(1404)/W(1404)=5 to 6000:1.

Note that the driving TFT 1403 operates in a saturation region and has a role of controlling a value of current flowing through the light-emitting element 1405, and the current control TFT 1404 operates in a linear region and has a role of controlling supply of current to the light-emitting element 1405. It is preferable, from the viewpoint of the manufacturing steps, that these TFTs have the same conductivity type. In this Embodiment Mode, these TFTs are formed to be n-channel TFTs. Further, the driving TFT 1403 may be a depletion mode TFT as well as an enhancement mode TFT. In the invention having the above structure, the current control TFT 1404 operates in a linear region, so that slight variation in Vgs of the current control TFT 1404 does not affect a value of current of the light-emitting element 1405. In other words, the value of current of the light-emitting element 1405 can be determined by the driving TFT 1403 which operates in a saturation region. In accordance with the above described structure, luminance variation of a light-emitting element, which is caused by variation in characteristics of TFTs, can be improved, and a display device with improved image quality can be provided.

In pixels shown in FIGS. 25A to 25D, the switching TFT 1401 controls the input of a video signal to the pixel. When the switching TFT 1401 is turned on, the video signal is inputted to the pixel. Then, voltage of the video signal is stored in the capacitor element 1402. FIGS. 25A and 25C each show a structure in which the capacitor element 1402 is provided; however, the invention is not limited thereto. When a gate capacitor or the like can be substituted for a capacitor that can hold a video signal, the capacitor element 1402 is not required to be provided.

The pixel shown in FIG. 25B has the same structure as that of the pixel shown in FIG. 25A except that a TFT 1406 and a scanning line 1415 are added. In the same manner, the pixel shown in FIG. 25D has the same structure as that of the pixel shown in FIG. 25C except that a TFT 1406 and a scanning line 1415 are added.

In the TFT 1406, "on" or "off" is controlled by the scanning line 1415 that is newly arranged. When the TFT 1406 is turned on, a charge held in the capacitor element 1402 is discharged, and the current control TFT 1404 is then turned off. In other words, it is possible to make a state in which current is forced not to flow through the light-emitting element 1405 by arranging the TFT 1406. Therefore, the TFT 1406 can be referred to as an erasing TFT. Accordingly, in the structures in FIGS. 25B and 25D, a lighting period can be started simultaneously with or immediately after the start of a writing period without waiting for the writing of signals in all pixels. Consequently, a duty ratio can be improved.

In a pixel shown in FIG. 25E, a signal line 1410 and a power supply line 1411 are arranged in a column direction, and a scanning line 1414 is arranged in a row direction. In addition, the pixel includes a switching TFT 1401, a driving TFT 1403, a capacitor element 1402, and a light-emitting element 1405. A pixel shown in FIG. 25F has the same structure as that of the pixel shown in FIG. 25E except that a TFT 1406 and a scanning line 1415 are added. A duty ratio can be increased by arranging the TFT 1406 also in the structure of FIG. 25F.

As described above, various pixel circuits can be adopted. It is preferable to make a semiconductor film of the driving TFT 1403 large, specifically, in the case of forming the thin film transistor with an amorphous semiconductor film. Therefore, the above pixel circuit is preferably a top emission type, in which luminescence from an electroluminescent layer is emitted from a sealing substrate side.

Such an active-matrix light-emitting device is considered to be advantageous to low voltage driving when a pixel density is increased, since each pixel is provided with a TFT.

In this Embodiment Mode, an active-matrix light-emitting device in which each pixel is provided with a TFT is described. However, a passive-matrix light-emitting device in which every column is provided with a TFT can be formed. In the passive-matrix light-emitting device, a TFT is not provided for each pixel; therefore, a high aperture ratio can be obtained. In the case of a light-emitting device which emits light to both sides of an electroluminescent layer, transmittance can be increased by using the passive-matrix display device.

A display device further having such a pixel circuit of this invention has small drive voltage, which is not increased even as the time passes, and further can have each characteristic.

A case of providing a scanning line and a signal line with a diode as a protective circuit is described with reference to an equivalent circuit shown in FIG. 26.

Figure 26:
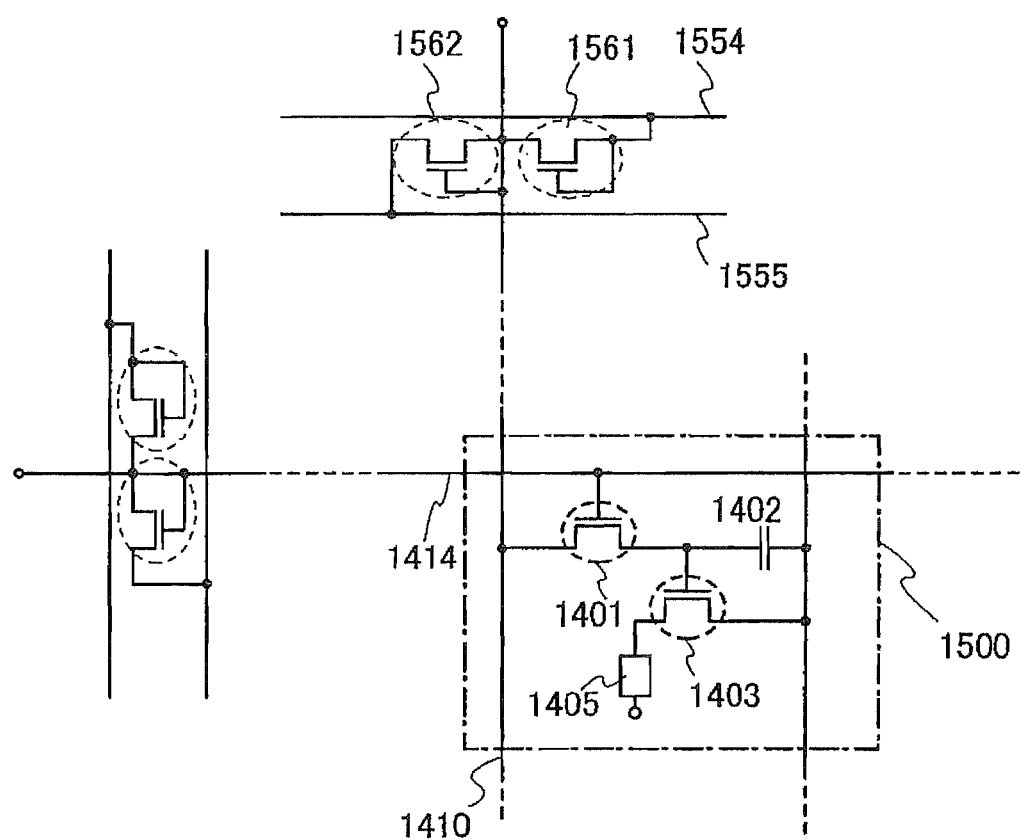
FIG. 26 A diagram showing an example of a protective circuit mounted on a display device.

In FIG. 26, a pixel portion 1500 is provided with switching TFTs 1401 and 1403, a capacitor element 1402, and a light-emitting element 1405. A signal line 1410 is provided with diodes 1561 and 1562. The diodes 1561 and 1562 are manufactured following the above Embodiment Mode as in the case of the switching TFT 1401 or 1403, and include a gate electrode, a semiconductor layer, a source electrode, a drain electrode, and the like. The diodes 1561 and 1562 operate as a diode by connecting the gate electrode to the drain electrode or the source electrode.

Common potential lines 1554 and 1555 connected to the diodes are formed in the same layer as the gate electrode. Therefore, a contact hole needs to be formed in a gate insulating layer to connect the gate electrode to the source electrode or the drain electrode of the diode.

A diode provided for a scanning line 1414 also has a similar structure.

Thus, a protective diode provided for an input stage can be simultaneously formed in accordance with this invention. Note that a position where the protective diode is formed is not limited thereto, and the protective diode can be provided between a driver circuit and a pixel.

The display device of this invention having such a protective circuit has small drive voltage, which is not increased even as the time passes, and can improve the reliability as a display device.

What is claimed is:

1. A display device comprising in a pixel:
   a transistor comprising a semiconductor layer, a gate electrode layer and a gate insulating film therebetween;
   a first insulating film over the transistor;
   a conductive film over the first insulating film,
   a second insulating film over the first insulating film and the conductive film;
   a third insulating film over the second insulating film;
   a first electrode over the third insulating film, in electrical contact with the conductive film through an opening in the third insulating film and an opening in the second insulating film;
   a partition wall over the third insulating film and the first electrode;
   a light-emitting laminated body over the partition wall, and in electrical contact with the first electrode; and
   a second electrode over and in electrical contact with the light-emitting laminated body,
   wherein the second insulating film is made of an inorganic material, and
   wherein the third insulating film is made of an organic material and is generally thinner than the second insulating film, and generally thinner than a portion of the conductive film situated on a top surface of the first insulating film.

2. A display device comprising in a pixel:
   a transistor comprising a semiconductor layer, a gate electrode layer and a gate insulating film therebetween;
   a first insulating film consisting of inorganic material over the transistor;
   a conductive film over the first insulating film,
   a second insulating film consisting of inorganic material over the first insulating film and the conductive film;

a third insulating film consisting of organic material over the second insulating film;

a first electrode comprising a conductive material having a work function of 4.0 eV or more over the third insulating film, in electrical contact with the conductive film through an opening in the third insulating film and an opening in the second insulating film;

a partition wall over the third insulating film and the first electrode;

a light-emitting laminated body over the partition wall, and in electrical contact with the first electrode; and a second electrode over and in electrical contact with the light-emitting laminated body, wherein the third insulating film is generally thinner than the second insulating film, and generally thinner than a portion of the conductive film situated on a top surface of the first insulating film.

3. A display device comprising in a pixel:

a transistor comprising a semiconductor layer, a gate electrode layer and a gate insulating film therebetween;

a first insulating film comprising silicon nitride over the transistor;

a conductive film over the first insulating film, a second insulating film comprising silicon nitride over the first insulating film and the conductive film;

a third insulating film consisting of one of acrylic, polyimide and siloxane over the second insulating film;

a first electrode comprising ITO over the third insulating film, in electrical contact with the conductive film through an opening in the third insulating film and an opening in the second insulating film;

a partition wall over the third insulating film and the first electrode;

a light-emitting laminated body over the partition wall, and in electrical contact with the first electrode; and a second electrode over and in electrical contact with the light-emitting laminated body, wherein the third insulating film is generally thinner than the second insulating film, and generally thinner than a portion of the conductive film situated on a top surface of the first insulating film.

4. The display device according to claim 1, further comprising a wiring electrically connecting the first electrode to the conductive film.

5. The display device according to claim 2, further comprising a wiring electrically connecting the first electrode to the conductive film.

6. The display device according to claim 3, further comprising a wiring electrically connecting the first electrode to the conductive film.

7. The display device according to claim 1, further comprising a buffer layer between the first electrode and the light-emitting laminated body.

8. The display device according to claim 2, further comprising a buffer layer between the first electrode and the light-emitting laminated body.

9. The display device according to claim 3, further comprising a buffer layer between the first electrode and the light-emitting laminated body.

10. The display device according to claim 1,
wherein the third insulating film is thinner than the second insulating film.

11. The display device according to claim 2,
wherein the third insulating film is thinner than the second insulating film.

12. The display device according to claim 3,
wherein the third insulating film is thinner than the second insulating film.

13. The display device according to claim 1, further comprising:
a substrate on which is formed the thin film transistor;
an opposite substrate;
an insulating sealing material configured to seal a space formed between the substrate and the opposite substrate; and
a wiring formed from a same layer as the conductive film and overlapped by the insulating sealing material.

14. The display device according to claim 2, further comprising:
a substrate on which is formed the thin film transistor;
an opposite substrate;
an insulating sealing material configured to seal a space formed between the substrate and the opposite substrate; and
a wiring formed from a same layer as the conductive film and overlapped by the insulating sealing material.

15. The display device according to claim 3, further comprising:
a substrate on which is formed the thin film transistor;
an opposite substrate;
an insulating sealing material configured to seal a space formed between the substrate and the opposite substrate; and
a wiring formed from a same layer as the conductive film and overlapped by the insulating sealing material.

16. An electronic device in which is mounted the display device according to claim 1.

17. An electronic device in which is mounted the display device according to claim 2.

18. An electronic device in which is mounted the display device according to claim 3.

19. The display device according to claim 1,
wherein a portion of the third insulating film formed on a topmost portion of the second insulating film is thinner than the topmost section of the second insulating film and thinner than the portion of the conductive film located on the top surface of the first insulating film.

20. The display device according to claim 2,
wherein a portion of the third insulating film formed on a topmost portion of the second insulating film is thinner than the topmost section of the second insulating film and thinner than the portion of the conductive film located on the top surface of the first insulating film.

21. The display device according to claim 3,
wherein a portion of the third insulating film formed on a topmost portion of the second insulating film is thinner than the topmost section of the second insulating film and thinner than the portion of the conductive film located on the top surface of the first insulating film.

* * * * *